(12) United States Patent
Frenzel et al.

(10) Patent No.: US 12,316,448 B2
(45) Date of Patent: May 27, 2025

(54) APPARATUS AND METHOD FOR DETERMINING THE CONTENT OF A RETRANSMISSION

(71) Applicant: Apple Inc., Cupertino, CA (US)

(72) Inventors: Janik Frenzel, Munich (DE); Stefan H. Mueller-Weinfurtner, Munich (DE)

(73) Assignee: Apple Inc., Cupertino, CA (US)

( * ) Notice: Subject to any disclaimer, the term of this patent is extended or adjusted under 35 U.S.C. 154(b) by 602 days.

(21) Appl. No.: 17/442,013

(22) PCT Filed: Apr. 6, 2020

(86) PCT No.: PCT/US2020/026929
§ 371 (c)(1),
(2) Date: Sep. 22, 2021

(87) PCT Pub. No.: WO2020/206451
PCT Pub. Date: Oct. 8, 2020

(65) Prior Publication Data
US 2022/0200729 A1   Jun. 23, 2022

Related U.S. Application Data

(60) Provisional application No. 62/829,590, filed on Apr. 4, 2019.

(51) Int. Cl.
*H04L 1/00* (2006.01)
*H03M 13/00* (2006.01)
(Continued)

(52) U.S. Cl.
CPC ...... *H04L 1/0061* (2013.01); *H03M 13/6306* (2013.01); *H04L 1/0052* (2013.01);
(Continued)

(58) Field of Classification Search
CPC ... H04L 1/0061; H04L 1/0052; H04L 1/0057; H04L 1/1812; H03M 13/6306
See application file for complete search history.

(56) References Cited

U.S. PATENT DOCUMENTS 8,984,376 B1 * 3/2015 Norrie ............... H03M 13/114
714/801
2003/0126551 A1   7/2003 Mantha et al.
(Continued)

FOREIGN PATENT DOCUMENTS

CN   101217337 A   7/2008
CN   101286825 A   10/2008
(Continued)

OTHER PUBLICATIONS

Communication Pursuant to Article 94(3) EPC for Application No. 20722823.0 mailed May 10, 2023, 6 pages.
(Continued)

*Primary Examiner* — Jackie Zuniga Abad
(74) *Attorney, Agent, or Firm* — Sterne, Kessler, Goldstein & Fox P.L.L.C.

(57) ABSTRACT

Techniques are disclosed for reducing overhead during hybrid automatic repeat request (HARQ) operations performed by a user equipment (UE) during wireless communication. The UE receives a message over the wireless network and obtains a parity check matrix (PCM) associated with a received message. Rows of the PCM are assigned to respective groups of a plurality of groups, where the respective groups have corresponding one or more parity checks as determined by the PCM. The UE generates a feedback message including a plurality of bits, wherein an individual bit of the plurality of bits indicates whether a corresponding respective group of the plurality of groups include one or
(Continued)

more unsatisfied parity checks. The UE then transmits the feedback message to a base station of the wireless network.

20 Claims, 15 Drawing Sheets

(51) Int. Cl.
*H04L 1/1812* (2023.01)
*H04L 1/18* (2023.01)

(52) U.S. Cl.
CPC .......... *H04L 1/0057* (2013.01); *H04L 1/1812* (2013.01); *H04L 1/18* (2013.01)

(56) References Cited

U.S. PATENT DOCUMENTS

| | | | |
|---|---|---|---|
| 2010/0146355 A1 | 6/2010 | Jiang et al. | |
| 2011/0320902 A1* | 12/2011 | Gunnam | H04L 1/005 714/752 |
| 2016/0179620 A1* | 6/2016 | Bazarsky | H03M 13/118 714/766 |
| 2016/0285589 A1 | 9/2016 | Mukkavilli et al. | |
| 2017/0214489 A1 | 7/2017 | Jiang et al. | |
| 2018/0323801 A1 | 11/2018 | Hsu et al. | |
| 2019/0007170 A1 | 1/2019 | Sun et al. | |
| 2019/0273574 A1* | 9/2019 | Goektepe | H04L 1/08 |

FOREIGN PATENT DOCUMENTS

| | | |
|---|---|---|
| CN | 107431570 A | 12/2017 |
| CN | 108432167 A | 8/2018 |
| CN | 108476098 A | 8/2018 |
| CN | 109314527 A | 2/2019 |
| WO | 2017123273 A1 | 7/2017 |
| WO | WO 2018/095796 A1 | 5/2018 |

OTHER PUBLICATIONS

International Search Report and Written Opinion of the International Searching Authority directed to related International Patent Application No. PCT/US2020/026929, mailed Jul. 27, 2020; 11 pages.

Saber et al., "A New Reliability-Based Incremental Redundancy Hybrid ARQ Scheme Using LDPC Codes," IEEE 14$^{th}$ Canadian Workshop on Information Theory (CWIT), Jul. 6, 2015; pp. 135-138.

Cammerer et al., "Spatially Coupled LDPC Codes and the Multiple Access Channel," IEEE 53rd Annual Conference on Information Sciences and Systems (CISS), Mar. 20, 2019; 6 pages.

LG Electronics, "LDPC Coded bits interleaver and symbol mapping for HARQ," 3GPP TSG RAN WG1 Meeting AH 1801, Vancouver, Canada, Jan. 22-26, 2018, R1-1800387; 8 pages.

* cited by examiner

APPARATUS AND METHOD FOR DETERMINING THE CONTENT OF A RETRANSMISSION

CROSS REFERENCE TO RELATED APPLICATION

The present application is a U.S. National Phase of International Application No. PCT/US2020/026929, filed Apr. 6, 2020, which claims the benefit of U.S. Provisional Patent Application No. 62/829,590, filed Apr. 4, 2019, which are hereby incorporated by reference in their entirety.

FIELD

Various embodiments generally may relate to the field of wireless communications.

SUMMARY

Some embodiments of this disclosure include systems, apparatuses, methods, and computer-readable media for reducing overhead of a feedback message during hybrid automatic repeat request (HARM) operations performed by a user equipment (UE) during wireless communication.

Some embodiments are directed to a method of operating a user equipment (UE) in a wireless network, including obtaining a parity check matrix (PCM) associated with a received message, assigning rows of the PCM to respective groups of a plurality of groups, the respective groups having corresponding one or more parity checks as determined by the PCM. The method further includes generating a feedback message including a plurality of bits, wherein an individual bit of the plurality of bits indicates whether a corresponding respective group of the plurality of groups includes one or more unsatisfied parity checks, and transmitting or causing to transmit the feedback message to a base station of the wireless network.

In embodiments of the method, the generating the feedback message includes setting the individual bit to a logic "1" or a logic "0" to indicate the corresponding respective group includes one or more unsatisfied parity checks.

In embodiments of the method, the assigning includes determining the number of the plurality of groups based on a predetermined number of bits allowed for the feedback message.

In embodiments of the method, the method further includes receiving a retransmission of bits associated with respective groups of the plurality of groups that include one or more unsatisfied parity checks. In embodiments, the retransmission includes information sub-blocks intermixed with parity sub-blocks that are responsive to the one or more unsatisfied parity checks.

In embodiments, the method further includes determining whether the corresponding respective group of the plurality of groups include one or more unsatisfied parity checks based on variable node matching within the PCM.

Some embodiments are directed to a non-transitory computer readable medium having instructions stored thereon that, when executed by one or more processors of a user equipment (UE), causes the UE to perform operations. The operations include obtaining a parity check matrix (PCM) associated with a received message, assigning rows of the PCM to respective groups of a plurality of groups, the respective groups having corresponding one or more parity checks as determined by the PCM. The operations further include determining whether the respective groups of the plurality of groups include one or more unsatisfied parity checks based on variable node matching within the PCM, generating a feedback message including a plurality of bits, wherein individual bits of the plurality of bits indicate whether the respective groups of the plurality of groups include one or more unsatisfied parity checks, transmitting or causing to transmit the feedback message to a base station of the wireless network.

In embodiments of the non-transitory computer readable medium, the generating the feedback message includes setting an individual bit to a logic "1" or a logic "0" to indicate a corresponding respective group includes one or more unsatisfied parity checks.

In embodiments of the non-transitory computer readable medium, the assigning includes determining the number of the plurality of groups based on a predetermined number of bits allowed for the feedback message.

In embodiments of the non-transitory computer readable medium, the operations further include receiving a retransmission of bits associated with respective groups of the plurality of groups that include one or more unsatisfied parity checks. In embodiments, the retransmission includes information sub-blocks intermixed with parity sub-blocks that are responsive to the one or more unsatisfied parity checks.

Some embodiments are directed to a user equipment (UE). The UE includes radio front end circuitry and processor circuitry coupled to the radio front end circuitry. The radio front end circuitry performs wireless communication over a wireless network and receives a message over the wireless network. The processor circuitry, coupled to the radio front end circuitry, obtains a parity check matrix (PCM) associated with the received message, assigns rows of the PCM to respective groups of a plurality of groups, the respective groups having corresponding one or more parity checks as determined by the PCM. The processor circuitry further generates a feedback message including a plurality of bits, wherein an individual bit of the plurality of bits indicates whether a corresponding respective group of the plurality of groups includes one or more unsatisfied parity checks, and transmits, using the radio front end circuitry, the feedback message to a base station of the wireless network.

In embodiments of the UE, the processor circuitry generates the feedback message by setting the individual bit to a logic "1" or a logic "0" to indicate the corresponding respective group includes one or more unsatisfied parity checks.

In embodiments of the UE, the processor circuitry determines the number of the plurality of groups based on a predetermined number of bits allowed for the feedback message.

In embodiments of the UE, the processor circuitry receives, using the radio front end circuitry, a retransmission of bits associated with respective groups of the plurality of groups that include one or more unsatisfied parity checks. In embodiments, the retransmission includes information sub-blocks intermixed with parity sub-blocks that are responsive to the one or more unsatisfied parity checks.

In embodiments of the UE, the processor circuitry determines whether the corresponding respective group of the plurality of groups include one or more unsatisfied parity checks based on variable node (VM) matching within the PCM.

Some embodiments are directed to a method of operating a base station in a wireless network, including transmitting or causing to transmit a message to a user equipment (UE) served by the base station, receiving a feedback message with a plurality of bits from the UE, wherein individual bits of the feedback message indicate whether respective individual groups of rows from a parity check matrix (PCM) associated with the transmitted message include one or more unsatisfied parity checks. The method further includes transmitting or causing to transmit to the UE, a retransmission of bits from the message that are associated with the individual groups of rows that were indicated to include one or more unsatisfied parity checks.

In embodiments of the method, the feedback message includes an individual bit set to a logic "1" or a logic "0" to indicate a corresponding respective individual group includes one or more unsatisfied parity checks.

In embodiments of the method, the retransmission includes information sub-blocks intermixed with parity sub-blocks that are responsive to the one or more unsatisfied parity checks.

Some embodiments include a method of operating a user equipment (UE) in a wireless network. The method includes obtaining a parity check matrix (PCM) associated with a received message, assigning two or more rows of the PCM to a respective group of a plurality of groups, the respective group having corresponding one or more parity checks as determined by the two or more rows of the PCM. The method further incudes generating a feedback message including a plurality of bits, wherein an individual bit of the plurality of bits indicates whether the respective group of the plurality of groups includes one or more unsatisfied parity checks, and transmitting or causing to transmit the feedback message to a base station of the wireless network.

BRIEF DESCRIPTION OF THE DRAWINGS/FIGURES

DETAILED DESCRIPTION

Figure 1:
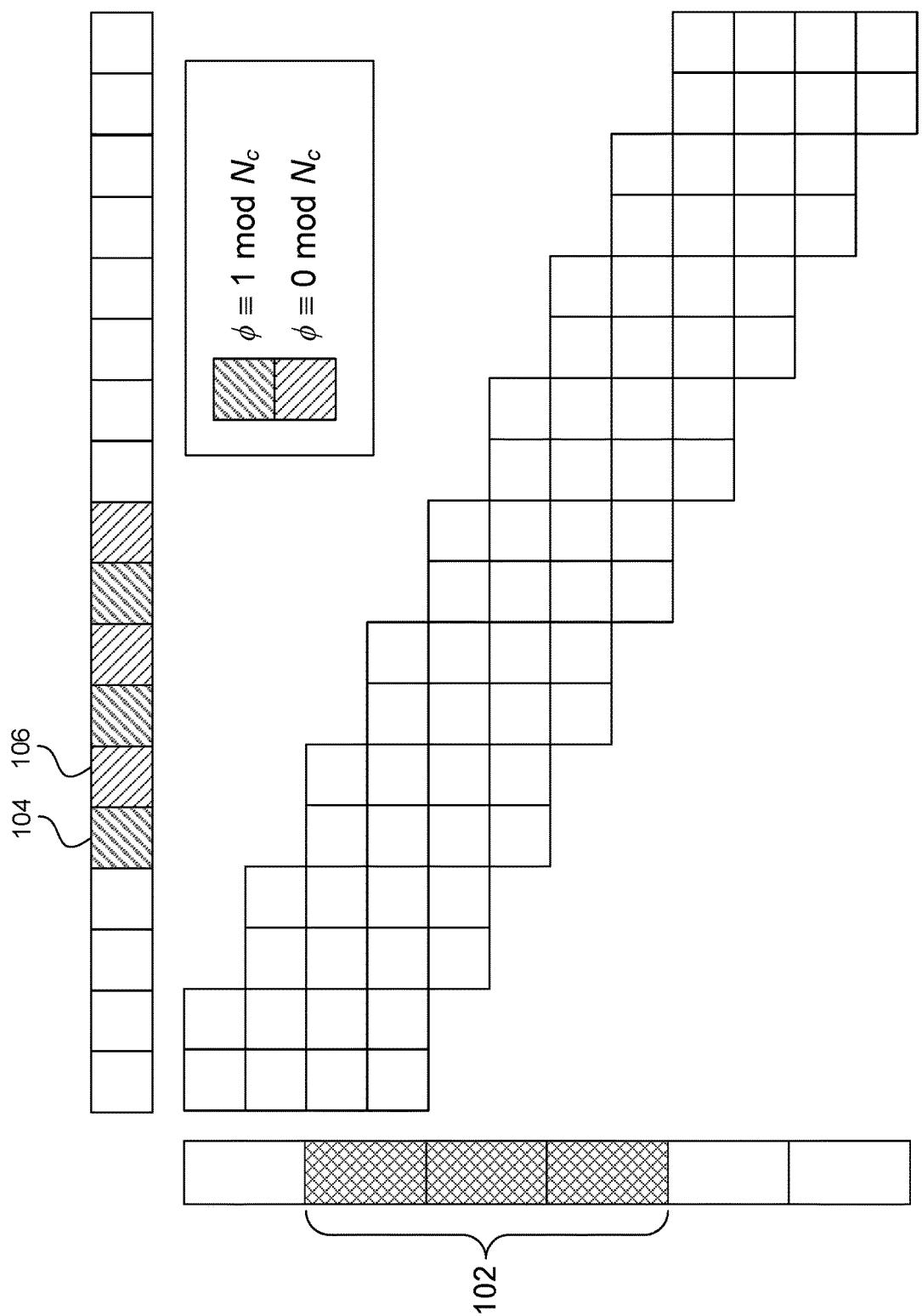
FIG. 1 illustrates retransmission of sub-blocks in accordance with some embodiments.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. For the purposes of the present document, the phrase "A or B" means (A), (B), or (A and B).

Hybrid ARQ (HARQ) is essential for reliable communications. In today's cellular communications systems, retransmissions are only based on the final output of the channel decoder, i.e., whether all info bits have been correctly decoded or not. The retransmission either contains all bits of the codeword or some Redundancy Version specified in advance. If knowledge of decoder internal states were used, the retransmissions could contain intelligently selected parts of the codeword to improve the throughput. The HARQ scheme described herein depicts a low-overhead approach to this problem and works well with even only a few feedback bits. It can be combined with Spatially-Coupled (SC) LDPC codes which exhibit extraordinary performance with favorable intra-codeword correlations.

The classical approach to the problem described above is called Reliability-Based Hybrid ARQ (RB-HARQ). When the channel decoder is done, the post-decoding Log-Likelihood Ratios (LLRs) for all codeword bits are ranked by their reliabilities, e.g., using their magnitudes, and a fixed number of the least reliable bits is retransmitted.

However, firstly, evaluation of the post-decoding LLRs can be costly, depending on the reliability metric. Secondly, the fixed retransmission size limits the throughput. Comparison against a threshold to achieve dynamically-sized retransmission is conceivable but difficult to execute optimally. Finally, a large amount of feedback bits are required to indicate all bits that are re-quested for the next retransmission.

In accordance with embodiments of the present disclosure, in a preliminary step, the rows of the Parity-Check Matrix (PCM) are divided (e.g., assigned) into a number of clusters corresponding to the number of feedback bits. (Herein, "clusters" can also be referred to as "groups".) The feedback message contains one bit per cluster where the bit is set if—after decoding—there are unsatisfied parity checks in the respective cluster. The transmitter then selects the appropriate bits connected to all selected (row-wise) clusters in the PCM and alternatingly transmit subsets of the selected bits.

Using the parity-check result instead of reliability metrics based on LLR magnitudes has a very low computational overhead since the parity check is available during message-passing decoding. From a system point of view, the present scheme described herein works well with limited feedback sizes, thus reducing the overall usage of radio resources. With the same feedback sizes, our scheme outperforms state-of-the-art RB-HARQ.

If it is left to the manufacturer to determine the retransmission content in terms of individual bits or sub blocks (SBs), one could transmit at high signal-to-noise ratio (SNR) and only disturb a single bit or SB. It could be an indicator that the scheme proposed herein is used if the receiver flags a lot of neighboring bits (or partial selections from them) for retransmission.

The (infinite) PCM of an SC-LDPC code looks as follows:

$$H_{[-\infty,+\infty]} = \begin{bmatrix} \ddots & \ddots & & \ddots & \\ & H_{m_s(t)} & \dots & H_0(t) & \\ & & H_{m_s}(t+1) & \dots & H_0(t+1) \\ & & & \ddots & & \ddots \end{bmatrix}.$$

Valid codewords $x^T = [\ \dots\ x^T(t)x^T(t+1)\ \dots\ ]$ fullfil $$\sum_{\mu=0}^{m_x} H_\mu(t)x(t-\mu) \equiv 0 \mod 2.$$

The sub-matrices $H_\mu(t)$ have size $m_c' n_c$. Correspondingly, $n_c$ bits are transmitted in $x(t)$ at each time instant $t$.

A compact representation of such codes can be done with protographs. In Quasi-Cyclic (QC) codes, the Base Graph (BG) describes cyclic shifts for each Sub-Block (SB). To obtain the full PCM from the BG, each SB is replaced by an identity matrix of size $Z_c$ (the lifting size) which has its rows circularly shifted as indicated by the SB's cyclic shift. Such codes are used in new radio (NR).

Our proposed HARQ scheme comprises three steps: Cluster selection, Variable-Node (VN) matching and partial intersections. Assume that the SB-wise parity check is given in a vector s and the $\Xi$ row-wise clusters are described by $Q_\xi$. The $\Xi$ bits of the feedback vector $$\bar{s} = \lceil \bar{s}_0, \dots, \bar{s}_{\Xi-1} \rceil$$

are given by (using the logical OR operation)

$$\bar{S}_\xi = \bigvee_{j \in Q_\xi} S_j.$$

Consequently, all clusters with $\bar{S}_\xi = 1$ are requested for retransmission. Additionally, we set $\tilde{s} = \bar{S}_\xi \forall j \in Q_\xi$ for all $\xi = 0 \dots (\Xi-1)$, i.e., we distribute the decision to retransmit a cluster down to all Check Nodes (CNs) in that cluster.

In the next step, we exploit a property of LDPC codes to select the retransmission bits based on the indicated clusters: If a VN is involved in a satisfied parity check, the estimate of that bit is most likely correct. Accordingly, we compute with the logical AND operation (use the set $\epsilon_v(i)$ to denote all CNs connected to a VN i)

$$\tilde{L}_i = \bigwedge_{j \in \epsilon_v(i)} \tilde{S}_j$$

and—preliminarily—select all VNs with $L_i = 1$ for retransmission.

In the final step, we reduce the retransmission content further by performing alternating transmissions of information and parity bits. If, e.g., a QC code with $R = \frac{1}{2}$ is used, the codewords $x(t)$ correspond to just $N_c = 2$ SBs in the BG: one info SB and one parity SB. More formally, let $\phi$ denote the index of the requested transmission. If If $\phi \equiv 1 \mod N_c$, the information SBs are transmitted. Else, the parity SBs are transmitted. In the initial transmission, i.e $\phi = 0$, all codeword bits are transmitted.

FIG. 1 illustrates the concept. The clusters 102 (on the left) contain unsatisfied parity checks. Consequently, either hatched SBs 104 or 106 are retransmitted in response to the clusters 102. SBs 104 are information SBs, and SBs 106 are parity SBs that are retransmitted to address the unsatisfied parity checks.

For the following simulation results, we pick a code with the structure shown above using a coupling length of L=61 and $Z_c=128$, resulting in n=15616 and R≈0.475 All transmissions use the same static additive white Gaussian noise (AWGN) channel with 16-QAM. We set $\Xi=4$ and perform $\phi=5$, i.e., the initial transmission followed by 4 retransmissions. Since both our proposed scheme (dubbed PB-HARQ in the following) and the state-of-the-art RB-HARQ are capable of transmitting up to n/2 bits in each retransmission, the maximal number of transmitted bits is 3n. Accordingly, we select a simple Diversity Combining (DC) scheme with $\phi=3$ that retransmit all n bits (when decoding fails) as a reference.

Figure 2:
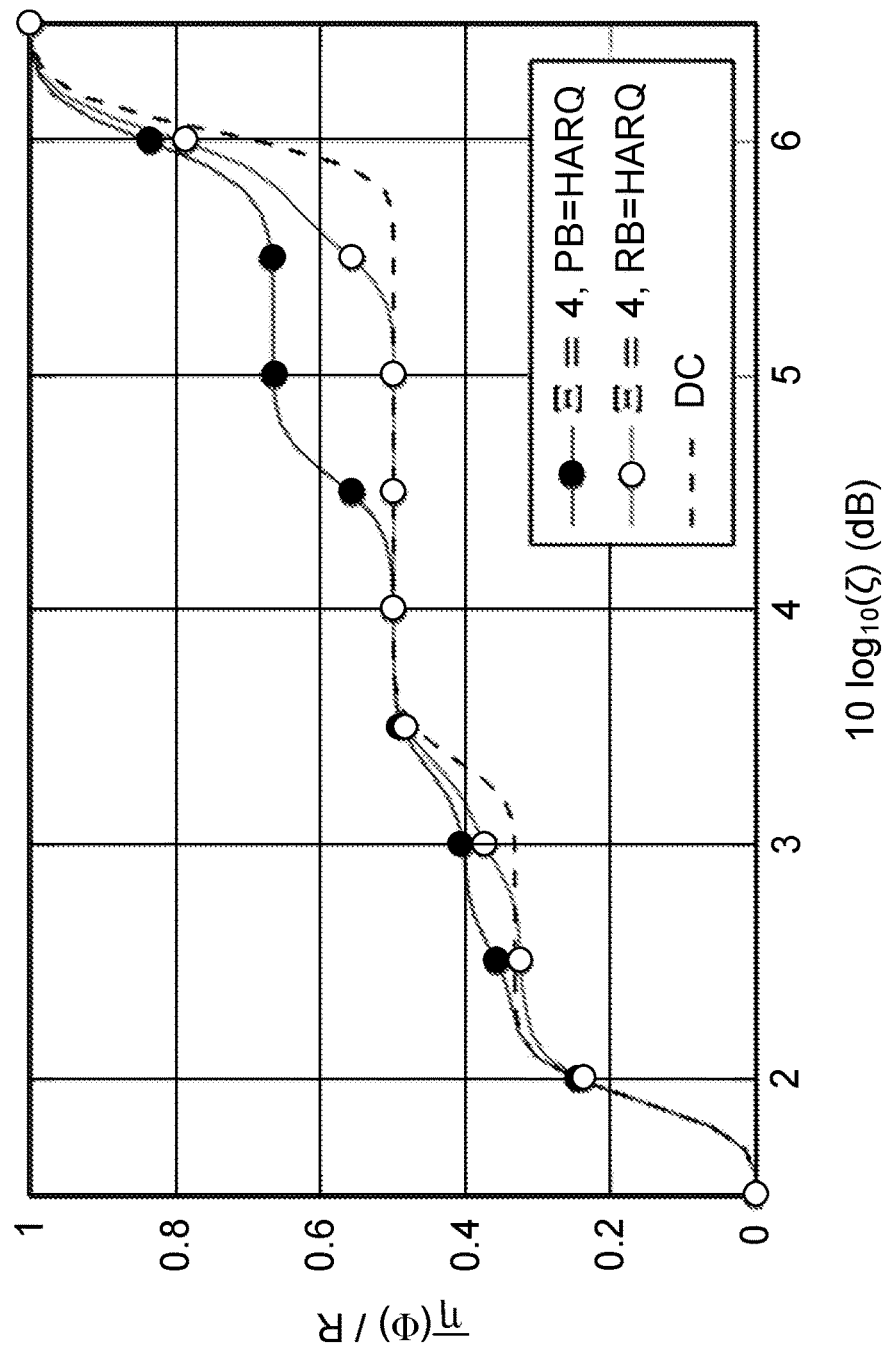
FIG. 2 illustrate data throughput in accordance with some embodiments.

Let us examine the throughput first. It is colloquially defined as "number of info bits divided by number of bits transmitted until decoding is successful". The average throughput after the $\Phi$-th transmissions $\bar{\eta}^{(\Phi)}$ relative to the code rate R, is depicted in FIG. 2, where $\zeta = E_s/N_0$ indicates the SNR. The proposed scheme (PB-HARD) always performs better than the two comparison schemes (RB-HARQ, DC). The gap is especially large after the first retransmission, e.g., at 10 $\log_{10}(\zeta)=5$ dB.

Whereas, the throughput represents the point of view of the system (which is concerned with limited radio resources), the point of view of the user is represented in terms of latency. Here, latency describes the time between requesting data and the availability of the data to higher layers.

A simplified network scheduling is assumed to analyze the latency. We furthermore assume that two transmissions may occur without gap in between them, i.e., decoding and processing the retransmission request take zero time. Additionally, each network grant may contain up to n bit, but the duration between grants is the same regardless of whether n bits or fewer are transmitted.

Figure 3:
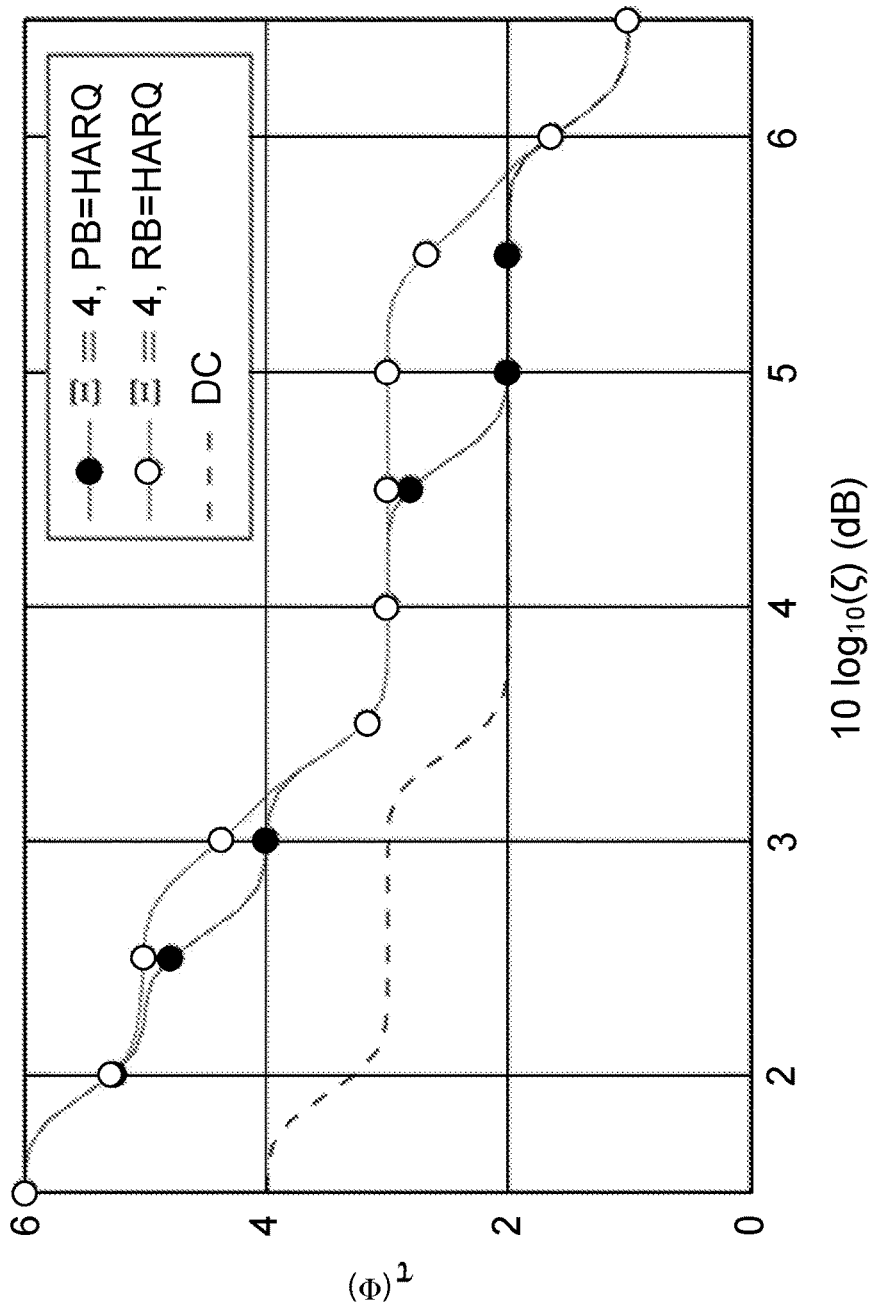
FIG. 3 illustrate latency in accordance with some embodiments.

FIG. 3 illustrates the average latency after $\Phi$ transmissions $\bar{\tau}^{(\Phi)}$ where it is assumed that the $(\Phi+1)$-th transmission would be sufficient to decode without errors. As shown in FIG. 3, PB-HARQ generally has better (e.g. lower) latency than RB-HARQ.

In some embodiments, the electronic device(s), network(s), system(s), chip(s) or component(s), or portions or implementations thereof, of FIGS. 3-13, or some other figure herein, may be configured to perform one or more processes, techniques, or methods as described herein, or portions thereof. One such process is depicted in FIG. 14. FIG. 14 illustrates a flowchart 1400 that describes an electronic device, for example UEs 401, 501, 601, described herein for use in a wireless network and conducting HARQ feedback for wireless communications according to embodiments described herein. It is noted that not all the steps of FIG. 14 need to be performed, and/or the steps may be performed in a different order.

In step 1402, the UE obtains a parity check matrix (PCM) associated with a received message. For example, the received message can be received over a wireless network from a base station (e.g. RANs 411) that serves the UE.

In step 1404, the UE assigns rows of the PCM to respective groups of a plurality of groups, the respective groups having corresponding one or more parity checks as determined by the PCM. For example, two or more rows of the PCM can be assigned to a respective group, each row having a number of associated parity checks. This is repeated for the other rows and corresponding other groups. As described herein, the "groups" of the PCM can be described as "clusters".

In step 1406, the UE determines whether the respective groups of the plurality of groups include one or more unsatisfied parity checks. For example, as described herein variable node (VN) matching within the PCM can be used to make the determination.

In step 1408, the UE generates a feedback message including a plurality of bits, wherein individual bits of the plurality of bits indicate whether the respective groups of the plurality of groups include one or more unsatisfied parity checks. For example, an individual bit of the plurality of bits can indicate whether a corresponding respective group of the plurality of groups includes one or more unsatisfied parity checks. In embodiments, the generating the feedback message includes setting the individual bit to a logic "1" or a logic "0" to indicate the corresponding respective group includes one or more unsatisfied parity checks. This is repeated for the other individual bits and corresponding respective groups.

In step 1410, the UE transmits the feedback message to a base station of the wireless network.

In embodiments, the assigning in step 1404 includes determining the number of the plurality of groups based on a predetermined number of bits allowed for the feedback message. The predetermined number can be determined in advance and communicated by the base station to the UE.

In embodiments, the method 1400 further includes receiving a retransmission of bits associated with respective groups of the plurality of groups that include one or more unsatisfied parity checks. In embodiments, the retransmission includes information sub-blocks (SBs) intermixed with parity SBs that are meant to address the one or more unsatisfied parity checks that triggered the feedback message, as described herein and shown in FIG. 1.

In embodiments, the functions and/or processes of flowchart 1400, and the related discussion, can be at least partially performed or controlled by the application circuitry 705 or 805, baseband circuitry 710 or 810, and/or processor(s) 1310.

Figure 15:
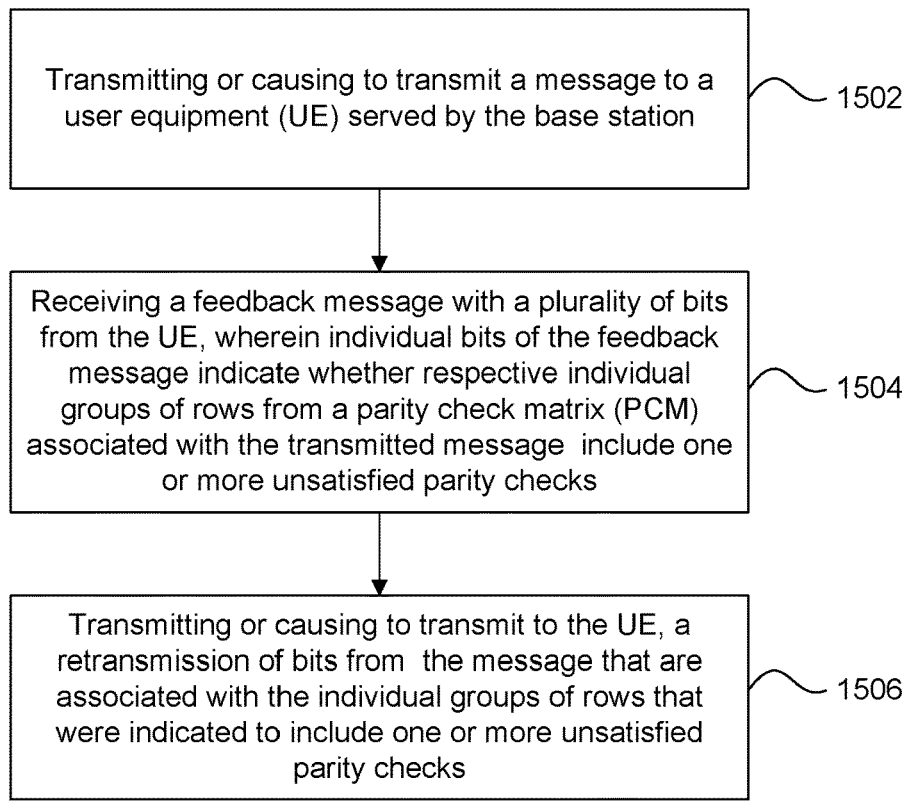
FIG. 15 depicts an example flowchart for a base station (e.g., eNB) performing HARQ feedback, in accordance with various embodiments.

In some embodiments, the electronic device(s), network(s), system(s), chip(s) or component(s), or portions or implementations thereof, of FIGS. 3-13, or some other figure herein, may be configured to perform one or more processes, techniques, or methods as described herein, or portions thereof. One such process is depicted in FIG. 15. FIG. 15 illustrates a flowchart 1500 that describes an electronic device, for example an evolved node B (e.g., eNB), base station, or radio network equipment (e.g. RAN 411), described herein for use in a wireless network and conducting wireless communications according to embodiments described herein. It is noted that not all the steps of FIG. 15 need to be performed, and/or the steps may be performed in a different order.

In step 1502, the base station (e.g., eNB) transmits a message to a user equipment (UE) served by the base station.

In step 1504, the base station (e.g., eNB) receives a feedback message with a plurality of bits from the UE, wherein individual bits of the feedback message indicate whether respective individual groups of rows from a parity check matrix (PCM) associated with the transmitted message include one or more unsatisfied parity checks. In embodiments, the feedback message includes an individual bit set to a logic "1" or a logic "0" to indicate a corresponding respective individual group of rows includes one or more unsatisfied parity checks.

In step 1506, the base station (e.g. eNB) transmits to the UE, a retransmission of bits from the message that are associated with the individual groups of rows that were indicated to include one or more unsatisfied parity checks. In embodiments, the retransmission includes information sub-blocks intermixed with parity sub-blocks that are responsive to the one or more unsatisfied parity checks.

In embodiments, the functions and/or processes of flowchart 1500, and the related discussion, can be at least partially performed or controlled by the application circuitry 705 or 805, baseband circuitry 710 or 810, and/or processor(s) 1310.

Systems and Implementations

Figure 4:
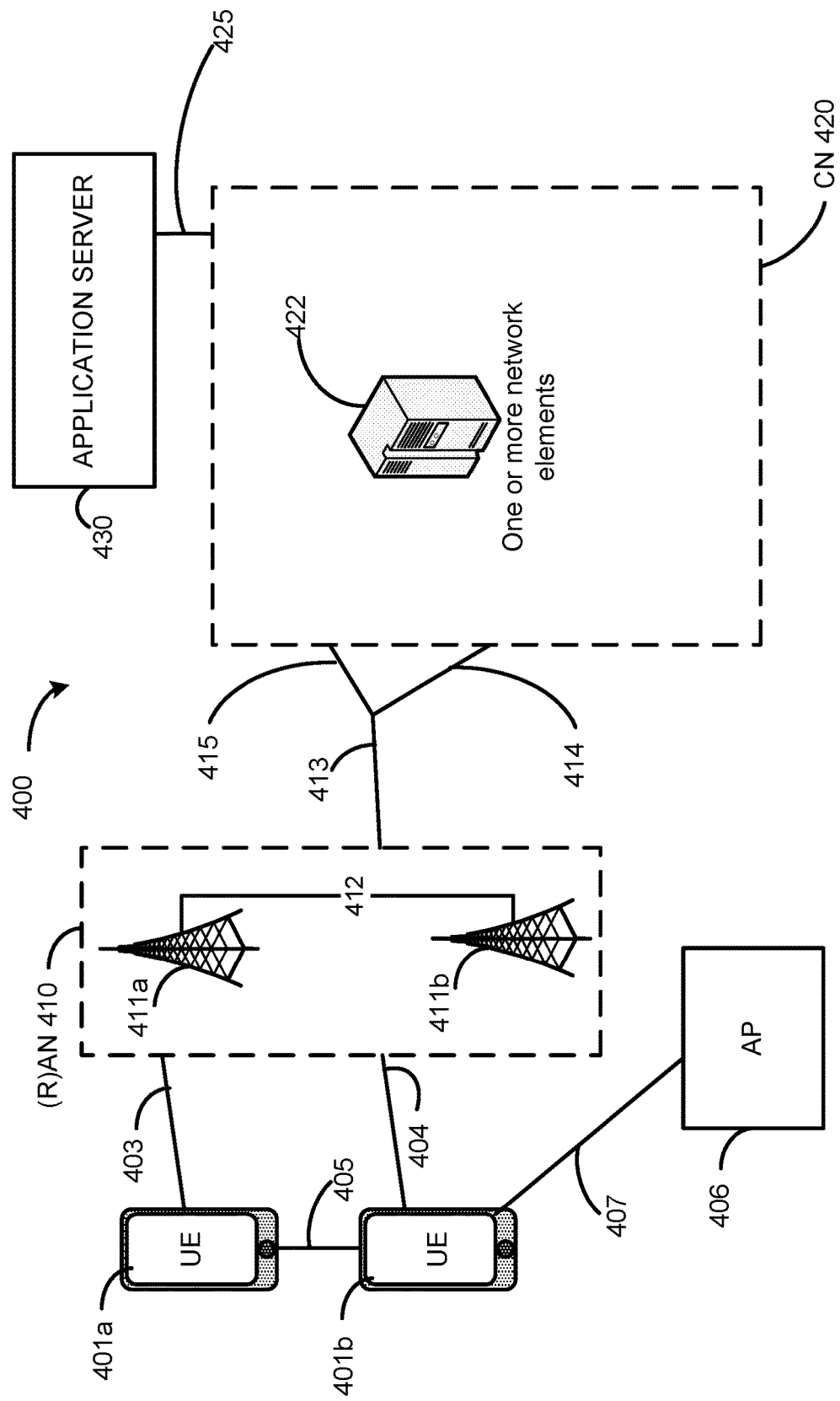
FIG. 4 depicts an architecture of a system of a network, in accordance with some embodiments.

FIG. 4 illustrates an example architecture of a system 400 of a network, in accordance with various embodiments. The following description is provided for an example system 400 that operates in conjunction with the LTE system standards and 5G or NR system standards as provided by 3GPP technical specifications. However, the example embodiments are not limited in this regard and the described embodiments may apply to other networks that benefit from the principles described herein, such as future 3GPP systems (e.g., Sixth Generation (6G)) systems, IEEE 802.16 protocols (e.g., WLAN, WiMAX, etc.), or the like.

As shown by FIG. 4, the system 400 includes UE 401a and UE 401b (collectively referred to as "UEs 401" or "UE 401"). In this example, UEs 401 are illustrated as smartphones (e.g., handheld touchscreen mobile computing devices connectable to one or more cellular networks), but may also comprise any mobile or non-mobile computing device, such as consumer electronics devices, cellular phones, smartphones, feature phones, tablet computers, wearable computer devices, personal digital assistants (PDAs), pagers, wireless handsets, desktop computers, laptop computers, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management System (EEMS), electronic/engine control units (ECUs), electronic/engine control modules (ECMs), embedded systems, microcontrollers, control modules, engine management systems (EMS), networked or "smart" appliances, MTC devices, M2M, IoT devices, and/or the like.

In some embodiments, any of the UEs 401 may be IoT UEs, which may comprise a network access layer designed for low-power IoT applications utilizing short-lived UE connections. An IoT UE can utilize technologies such as M2M or MTC for exchanging data with an MTC server or device via a PLMN, ProSe or D2D communication, sensor networks, or IoT networks. The M2M or MTC exchange of data may be a machine-initiated exchange of data. An IoT network describes interconnecting IoT UEs, which may include uniquely identifiable embedded computing devices (within the Internet infrastructure), with short-lived connections. The IoT UEs may execute background applications (e.g., keep-alive messages, status updates, etc.) to facilitate the connections of the IoT network.

The UEs 401 may be configured to connect, for example, communicatively couple, with an or RAN 410. In embodiments, the RAN 410 may be an NG RAN or a 5G RAN, an E-UTRAN, or a legacy RAN, such as a UTRAN or GERAN. As used herein, the term "NG RAN" or the like may refer to a RAN 410 that operates in an NR or 5G system 400, and the term "E-UTRAN" or the like may refer to a RAN 410 that operates in an LTE or 4G system 400. The UEs 401 utilize connections (or channels) 403 and 404, respectively, each of which comprises a physical communications interface or layer (discussed in further detail below).

In this example, the connections 403 and 404 are illustrated as an air interface to enable communicative coupling, and can be consistent with cellular communications protocols, such as a GSM protocol, a CDMA network protocol, a PTT protocol, a POC protocol, a UMTS protocol, a 3GPP LTE protocol, a 5G protocol, a NR protocol, and/or any of the other communications protocols discussed herein. In embodiments, the UEs 401 may directly exchange communication data via a ProSe interface 405. The ProSe interface 405 may alternatively be referred to as a SL interface 405 and may comprise one or more logical channels, including but not limited to a PSCCH, a PSSCH, a PSDCH, and a PSBCH.

The UE 401b is shown to be configured to access an AP 406 (also referred to as "WLAN node 406," "WLAN 406," "WLAN Termination 406," "WT 406" or the like) via connection 407. The connection 407 can comprise a local wireless connection, such as a connection consistent with any IEEE 802.11 protocol, wherein the AP 406 would comprise a wireless fidelity (Wi-Fi®) router. In this example, the AP 406 is shown to be connected to the Internet without connecting to the core network of the wireless system (described in further detail below). In various embodiments, the UE 401b, RAN 410, and AP 406 may be configured to utilize LWA operation and/or LWIP operation. The LWA operation may involve the UE 401b in RRC_CONNECTED being configured by a RAN node 411a-b to utilize radio resources of LTE and WLAN. LWIP operation may involve the UE 401b using WLAN radio resources (e.g., connection 407) via IPsec protocol tunneling to authenticate and encrypt packets (e.g., IP packets) sent over the connection 407. IPsec tunneling may include encapsulating the entirety of original IP packets and adding a new packet header, thereby protecting the original header of the IP packets.

The RAN 410 can include one or more AN nodes or RAN nodes 411a and 411b (collectively referred to as "RAN nodes 411" or "RAN node 411") that enable the connections 403 and 404. As used herein, the terms "access node," "access point," or the like may describe equipment that provides the radio baseband functions for data and/or voice connectivity between a network and one or more users. These access nodes can be referred to as BS, gNB s, RAN nodes, eNB s, NodeBs, RSUs, TRxPs or TRPs, and so forth, and can comprise ground stations (e.g., terrestrial access points) or satellite stations providing coverage within a geographic area (e.g., a cell). As used herein, the term "NG RAN node" or the like may refer to a RAN node 411 that operates in an NR or 5G system 400 (for example, a gNB), and the term "E-UTRAN node" or the like may refer to a RAN node 411 that operates in an LTE or 4G system 400 (e.g., an eNB). According to various embodiments, the RAN nodes 411 may be implemented as one or more of a dedicated physical device such as a macrocell base station, and/or a low power (LP) base station for providing femtocells, picocells or other like cells having smaller coverage areas, smaller user capacity, or higher bandwidth compared to macrocells.

In some embodiments, all or parts of the RAN nodes 411 may be implemented as one or more software entities running on server computers as part of a virtual network, which may be referred to as a CRAN and/or a virtual baseband unit pool (vBBUP). In these embodiments, the CRAN or vBBUP may implement a RAN function split, such as a PDCP split wherein RRC and PDCP layers are operated by the CRAN/vBBUP and other L2 protocol entities are operated by individual RAN nodes 411; a MAC/PHY split wherein RRC, PDCP, RLC, and MAC layers are operated by the CRAN/vBBUP and the PHY layer is operated by individual RAN nodes 411; or a "lower PHY" split wherein RRC, PDCP, RLC, MAC layers and upper portions of the PHY layer are operated by the CRAN/vBBUP and lower portions of the PHY layer are operated by individual RAN nodes 411. This virtualized framework allows the freed-up processor cores of the RAN nodes 411 to perform other virtualized applications. In some implementations, an individual RAN node 411 may represent individual gNB-DUs that are connected to a gNB-CU via individual F1 interfaces (not shown by FIG. 4). In these implementations, the gNB-DUs may include one or more remote radio heads or RFEMs (see, e.g., FIG. 7), and the gNB-CU may be operated by a server that is located in the RAN 410 (not shown) or by a server pool in a similar manner as the CRAN/vBBUP. Additionally or alternatively, one or more of the RAN nodes 411 may be next generation eNBs (ng-eNBs), which are RAN nodes that provide E-UTRA user plane and control plane protocol terminations toward the UEs 401, and are connected to a 5GC (e.g., CN 620 of FIG. 6) via an NG interface (discussed infra).

In V2X scenarios one or more of the RAN nodes 411 may be or act as RSUs. The term "Road Side Unit" or "RSU" may refer to any transportation infrastructure entity used for V2X communications. An RSU may be implemented in or by a suitable RAN node or a stationary (or relatively stationary) UE, where an RSU implemented in or by a UE may be referred to as a "UE-type RSU," an RSU implemented in or by an eNB may be referred to as an "eNB-type RSU," an RSU implemented in or by a gNB may be referred to as a "gNB-type RSU," and the like. In one example, an RSU is a computing device coupled with radio frequency circuitry located on a roadside that provides connectivity support to passing vehicle UEs 401 (vUEs 401). The RSU may also include internal data storage circuitry to store intersection map geometry, traffic statistics, media, as well as applications/software to sense and control ongoing vehicular and pedestrian traffic. The RSU may operate on the 5.9 GHz Direct Short Range Communications (DSRC) band to provide very low latency communications required for high speed events, such as crash avoidance, traffic warnings, and the like. Additionally or alternatively, the RSU may operate on the cellular V2X band to provide the aforementioned low latency communications, as well as other cellular communications services. Additionally or alternatively, the RSU may operate as a Wi-Fi hotspot (2.4 GHz band) and/or provide connectivity to one or more cellular networks to provide uplink and downlink communications. The computing device(s) and some or all of the radiofrequency circuitry of the RSU may be packaged in a weatherproof enclosure suitable for outdoor installation, and may include a network interface controller to provide a wired connection (e.g., Ethernet) to a traffic signal controller and/or a backhaul network.

Any of the RAN nodes 411 can terminate the air interface protocol and can be the first point of contact for the UEs 401. In some embodiments, any of the RAN nodes 411 can fulfill various logical functions for the RAN 410 including, but not limited to, radio network controller (RNC) functions such as radio bearer management, uplink and downlink dynamic radio resource management and data packet scheduling, and mobility management.

In embodiments, the UEs 401 can be configured to communicate using OFDM communication signals with each other or with any of the RAN nodes 411 over a multicarrier communication channel in accordance with various communication techniques, such as, but not limited to, an OFDMA communication technique (e.g., for downlink communications) or a SC-FDMA communication technique (e.g., for uplink and ProSe or sidelink communications), although the scope of the embodiments is not limited in this respect. The OFDM signals can comprise a plurality of orthogonal subcarriers.

In some embodiments, a downlink resource grid can be used for downlink transmissions from any of the RAN nodes 411 to the UEs 401, while uplink transmissions can utilize similar techniques. The grid can be a time-frequency grid, called a resource grid or time-frequency resource grid, which is the physical resource in the downlink in each slot. Such a time-frequency plane representation is a common practice for OFDM systems, which makes it intuitive for radio resource allocation. Each column and each row of the resource grid corresponds to one OFDM symbol and one OFDM subcarrier, respectively. The duration of the resource grid in the time domain corresponds to one slot in a radio frame. The smallest time-frequency unit in a resource grid is denoted as a resource element. Each resource grid comprises a number of resource blocks, which describe the mapping of certain physical channels to resource elements. Each resource block comprises a collection of resource elements; in the frequency domain, this may represent the smallest quantity of resources that currently can be allocated. There are several different physical downlink channels that are conveyed using such resource blocks.

According to various embodiments, the UEs 401 and the RAN nodes 411 communicate data (for example, transmit and receive) data over a licensed medium (also referred to as the "licensed spectrum" and/or the "licensed band") and an unlicensed shared medium (also referred to as the "unlicensed spectrum" and/or the "unlicensed band"). The licensed spectrum may include channels that operate in the frequency range of approximately 400 MHz to approximately 3.8 GHz, whereas the unlicensed spectrum may include the 5 GHz band.

To operate in the unlicensed spectrum, the UEs 401 and the RAN nodes 411 may operate using LAA, eLAA, and/or feLAA mechanisms. In these implementations, the UEs 401 and the RAN nodes 411 may perform one or more known medium-sensing operations and/or carrier-sensing operations in order to determine whether one or more channels in the unlicensed spectrum is unavailable or otherwise occupied prior to transmitting in the unlicensed spectrum. The medium/carrier sensing operations may be performed according to a listen-before-talk (LBT) protocol.

LBT is a mechanism whereby equipment (for example, UEs 401 RAN nodes 411, etc.) senses a medium (for example, a channel or carrier frequency) and transmits when the medium is sensed to be idle (or when a specific channel in the medium is sensed to be unoccupied). The medium sensing operation may include CCA, which utilizes at least ED to determine the presence or absence of other signals on a channel in order to determine if a channel is occupied or clear. This LBT mechanism allows cellular/LAA networks to coexist with incumbent systems in the unlicensed spectrum and with other LAA networks. ED may include sensing RF energy across an intended transmission band for a period of time and comparing the sensed RF energy to a predefined or configured threshold.

Typically, the incumbent systems in the 5 GHz band are WLANs based on IEEE 802.11 technologies. WLAN employs a contention-based channel access mechanism, called CSMA/CA. Here, when a WLAN node (e.g., a mobile station (MS) such as UE 401, AP 406, or the like) intends to transmit, the WLAN node may first perform CCA before transmission. Additionally, a backoff mechanism is used to avoid collisions in situations where more than one WLAN node senses the channel as idle and transmits at the same time. The backoff mechanism may be a counter that is drawn randomly within the CWS, which is increased exponentially upon the occurrence of collision and reset to a minimum value when the transmission succeeds. The LBT mechanism designed for LAA is somewhat similar to the CSMA/CA of WLAN. In some implementations, the LBT procedure for DL or UL transmission bursts including PDSCH or PUSCH transmissions, respectively, may have an LAA contention window that is variable in length between X and Y ECCA slots, where X and Y are minimum and maximum values for the CWSs for LAA. In one example, the minimum CWS for an LAA transmission may be 9 microseconds (p); however, the size of the CWS and a MCOT (for example, a transmission burst) may be based on governmental regulatory requirements.

The LAA mechanisms are built upon CA technologies of LTE-Advanced systems. In CA, each aggregated carrier is referred to as a CC. A CC may have a bandwidth of 1.4, 3, 5, 10, 15 or 20 MHz and a maximum of five CCs can be aggregated, and therefore, a maximum aggregated bandwidth is 100 MHz. In FDD systems, the number of aggregated carriers can be different for DL and UL, where the number of UL CCs is equal to or lower than the number of DL component carriers. In some cases, individual CCs can have a different bandwidth than other CCs. In TDD systems, the number of CCs as well as the bandwidths of each CC is usually the same for DL and UL.

CA also comprises individual serving cells to provide individual CCs. The coverage of the serving cells may differ, for example, because CCs on different frequency bands will experience different pathloss. A primary service cell or PCell may provide a PCC for both UL and DL, and may handle RRC and NAS related activities. The other serving cells are referred to as SCells, and each SCell may provide an individual SCC for both UL and DL. The SCCs may be added and removed as required, while changing the PCC may require the UE 401 to undergo a handover. In LAA, eLAA, and feLAA, some or all of the SCells may operate in the unlicensed spectrum (referred to as "LAA SCells"), and the LAA SCells are assisted by a PCell operating in the licensed spectrum. When a UE is configured with more than one LAA SCell, the UE may receive UL grants on the configured LAA SCells indicating different PUSCH starting positions within a same subframe.

The PDSCH carries user data and higher-layer signaling to the UEs 401. The PDCCH carries information about the transport format and resource allocations related to the PDSCH channel, among other things. It may also inform the UEs 401 about the transport format, resource allocation, and HARQ information related to the uplink shared channel. Typically, downlink scheduling (assigning control and shared channel resource blocks to the UE 401b within a cell) may be performed at any of the RAN nodes 411 based on channel quality information fed back from any of the UEs 401. The downlink resource assignment information may be sent on the PDCCH used for (e.g., assigned to) each of the UEs 401.

The PDCCH uses CCEs to convey the control information. Before being mapped to resource elements, the PDCCH complex-valued symbols may first be organized into quadruplets, which may then be permuted using a sub-block interleaver for rate matching. Each PDCCH may be transmitted using one or more of these CCEs, where each CCE may correspond to nine sets of four physical resource elements known as REGs. Four Quadrature Phase Shift Keying (QPSK) symbols may be mapped to each REG. The PDCCH can be transmitted using one or more CCEs, depending on the size of the DCI and the channel condition. There can be four or more different PDCCH formats defined in LTE with different numbers of CCEs (e.g., aggregation level, L=1, 2, 4, or 8).

Some embodiments may use concepts for resource allocation for control channel information that are an extension of the above-described concepts. For example, some embodiments may utilize an EPDCCH that uses PDSCH resources for control information transmission. The EPDCCH may be transmitted using one or more ECCEs. Similar to above, each ECCE may correspond to nine sets of four physical resource elements known as an EREGs. An ECCE may have other numbers of EREGs in some situations.

The RAN nodes 411 may be configured to communicate with one another via interface 412. In embodiments where the system 400 is an LTE system (e.g., when CN 420 is an EPC 520 as in FIG. 5), the interface 412 may be an X2 interface 412. The X2 interface may be defined between two or more RAN nodes 411 (e.g., two or more eNBs and the like) that connect to EPC 420, and/or between two eNBs connecting to EPC 420. In some implementations, the X2 interface may include an X2 user plane interface (X2-U) and an X2 control plane interface (X2-C). The X2-U may provide flow control mechanisms for user data packets transferred over the X2 interface, and may be used to communicate information about the delivery of user data between eNBs. For example, the X2-U may provide specific sequence number information for user data transferred from a MeNB to an SeNB; information about successful in sequence delivery of PDCP PDUs to a UE 401 from an SeNB for user data; information of PDCP PDUs that were not delivered to a UE 401; information about a current minimum desired buffer size at the SeNB for transmitting to the UE user data; and the like. The X2-C may provide intra-LTE access mobility functionality, including context transfers from source to target eNBs, user plane transport control, etc.; load management functionality; as well as inter-cell interference coordination functionality.

In embodiments where the system 400 is a 5G or NR system (e.g., when CN 420 is an 5GC 620 as in FIG. 6), the interface 412 may be an Xn interface 412. The Xn interface is defined between two or more RAN nodes 411 (e.g., two or more gNBs and the like) that connect to 5GC 420, between a RAN node 411 (e.g., a gNB) connecting to 5GC 420 and an eNB, and/or between two eNBs connecting to 5GC 420. In some implementations, the Xn interface may include an Xn user plane (Xn-U) interface and an Xn control plane (Xn-C) interface. The Xn-U may provide non-guaranteed delivery of user plane PDUs and support/provide data forwarding and flow control functionality. The Xn-C may provide management and error handling functionality, functionality to manage the Xn-C interface; mobility support for UE 401 in a connected mode (e.g., CM-CONNECTED) including functionality to manage the UE mobility for connected mode between one or more RAN nodes 411. The mobility support may include context transfer from an old (source) serving RAN node 411 to new (target) serving RAN node 411; and control of user plane tunnels between old (source) serving RAN node 411 to new (target) serving RAN node 411. A protocol stack of the Xn-U may include a transport network layer built on Internet Protocol (IP) transport layer, and a GTP-U layer on top of a UDP and/or IP layer(s) to carry user plane PDUs. The Xn-C protocol stack may include an application layer signaling protocol (referred to as Xn Application Protocol (Xn-AP)) and a transport network layer that is built on SCTP. The SCTP may be on top of an IP layer, and may provide the guaranteed delivery of application layer messages. In the transport IP layer, point-to-point transmission is used to deliver the signaling PDUs. In other implementations, the Xn-U protocol stack and/or the Xn-C protocol stack may be same or similar to the user plane and/or control plane protocol stack(s) shown and described herein.

The RAN 410 is shown to be communicatively coupled to a core network—in this embodiment, core network (CN) 420. The CN 420 may comprise a plurality of network elements 422, which are configured to offer various data and telecommunications services to customers/subscribers (e.g., users of UEs 401) who are connected to the CN 420 via the RAN 410. The components of the CN 420 may be implemented in one physical node or separate physical nodes including components to read and execute instructions from a machine-readable or computer-readable medium (e.g., a non-transitory machine-readable storage medium). In some embodiments, NFV may be utilized to virtualize any or all of the above-described network node functions via executable instructions stored in one or more computer-readable storage mediums (described in further detail below). A logical instantiation of the CN 420 may be referred to as a network slice, and a logical instantiation of a portion of the CN 420 may be referred to as a network sub-slice. NFV architectures and infrastructures may be used to virtualize one or more network functions, alternatively performed by proprietary hardware, onto physical resources comprising a combination of industry-standard server hardware, storage hardware, or switches. In other words, NFV systems can be used to execute virtual or reconfigurable implementations of one or more EPC components/functions.

Generally, the application server 430 may be an element offering applications that use IP bearer resources with the core network (e.g., UMTS PS domain, LTE PS data services, etc.). The application server 430 can also be configured to support one or more communication services (e.g., VoIP sessions, PTT sessions, group communication sessions, social networking services, etc.) for the UEs 401 via the EPC 420.

In embodiments, the CN 420 may be a 5GC (referred to as "5GC 420" or the like), and the RAN 410 may be connected with the CN 420 via an NG interface 413. In embodiments, the NG interface 413 may be split into two parts, an NG user plane (NG-U) interface 414, which carries traffic data between the RAN nodes 411 and a UPF, and the S1 control plane (NG-C) interface 415, which is a signaling interface between the RAN nodes 411 and AMFs. Embodiments where the CN 420 is a 5GC 420 are discussed in more detail with regard to FIG. 6.

In embodiments, the CN 420 may be a 5G CN (referred to as "5GC 420" or the like), while in other embodiments, the CN 420 may be an EPC). Where CN 420 is an EPC (referred to as "EPC 420" or the like), the RAN 410 may be connected with the CN 420 via an S1 interface 413. In embodiments, the S1 interface 413 may be split into two parts, an S1 user plane (S1-U) interface 414, which carries traffic data between the RAN nodes 411 and the S-GW, and the S1-MME interface 415, which is a signaling interface between the RAN nodes 411 and MMEs.

Figure 5:
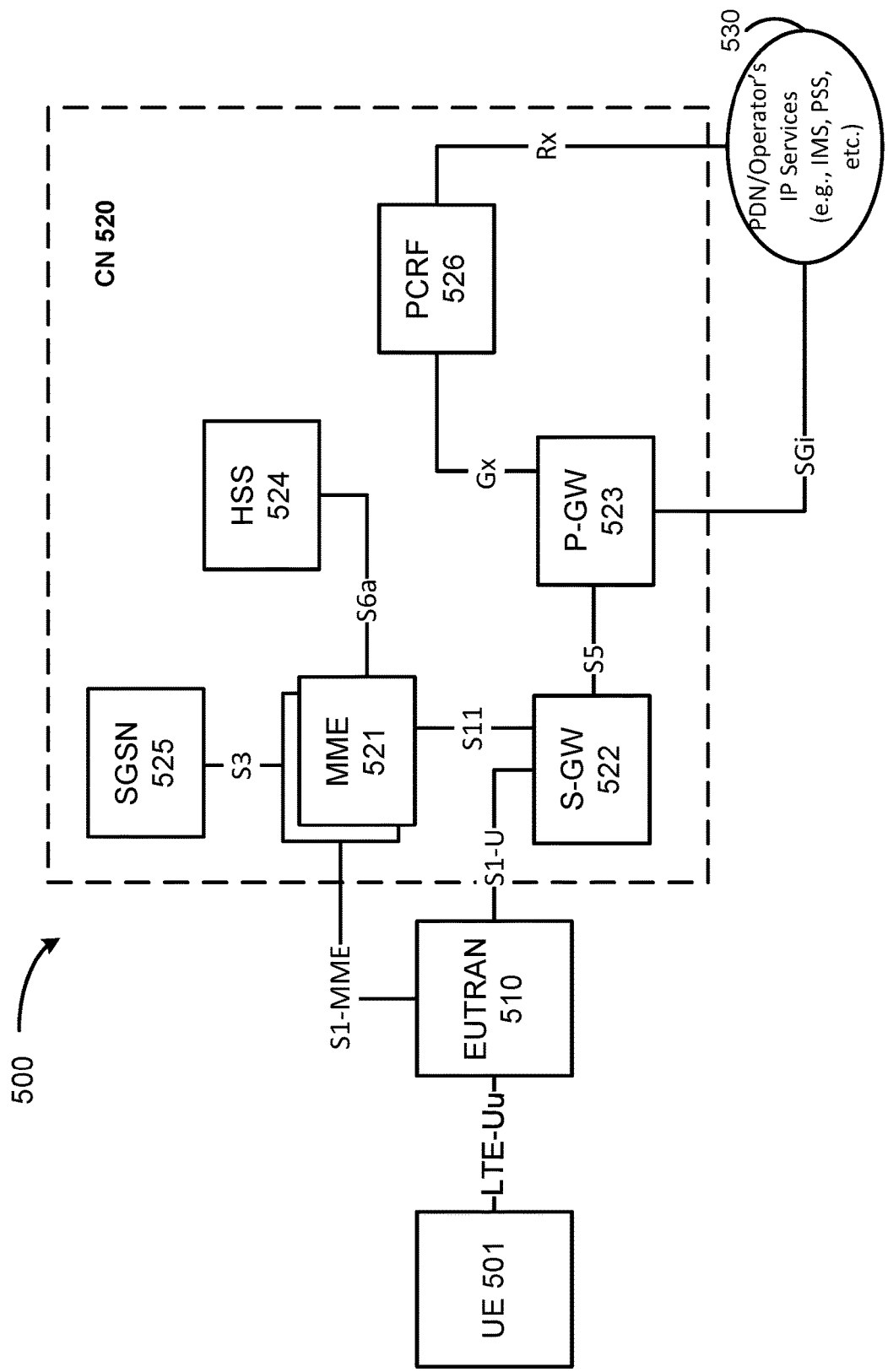
FIG. 5 depicts an architecture of a system including a first core network, in accordance with some embodiments.

FIG. 5 illustrates an example architecture of a system 500 including a first CN 520, in accordance with various embodiments. In this example, system 500 may implement the LTE standard wherein the CN 520 is an EPC 520 that corresponds with CN 420 of FIG. 4. Additionally, the UE 501 may be the same or similar as the UEs 401 of FIG. 4, and the E-UTRAN 510 may be a RAN that is the same or similar to the RAN 410 of FIG. 4, and which may include RAN nodes 411 discussed previously. The CN 520 may comprise MMEs 521, an S-GW 522, a P-GW 523, a HSS 524, and a SGSN 525.

The MMEs 521 may be similar in function to the control plane of legacy SGSN, and may implement MM functions to keep track of the current location of a UE 501. The MMEs 521 may perform various MM procedures to manage mobility aspects in access such as gateway selection and tracking area list management. MM (also referred to as "EPS MM" or "EMM" in E-UTRAN systems) may refer to all applicable procedures, methods, data storage, etc. that are used to maintain knowledge about a present location of the UE 501, provide user identity confidentiality, and/or perform other like services to users/subscribers. Each UE 501 and the MME 521 may include an MM or EMM sublayer, and an MM context may be established in the UE 501 and the MME 521 when an attach procedure is successfully completed. The MM context may be a data structure or database object that stores MM-related information of the UE 501. The MMEs 521 may be coupled with the HSS 524 via an S6a reference point, coupled with the SGSN 525 via an S3 reference point, and coupled with the S-GW 522 via an S11 reference point.

The SGSN 525 may be a node that serves the UE 501 by tracking the location of an individual UE 501 and performing security functions. In addition, the SGSN 525 may perform Inter-EPC node signaling for mobility between 2G/3G and E-UTRAN 3GPP access networks; PDN and S-GW selection as specified by the MMEs 521; handling of UE 501 time zone functions as specified by the MMEs 521; and MME selection for handovers to E-UTRAN 3GPP access network. The S3 reference point between the MMEs 521 and the SGSN 525 may enable user and bearer information exchange for inter-3GPP access network mobility in idle and/or active states.

The HSS 524 may comprise a database for network users, including subscription-related information to support the network entities' handling of communication sessions. The EPC 520 may comprise one or several HSSs 524, depending on the number of mobile subscribers, on the capacity of the equipment, on the organization of the network, etc. For example, the HSS 524 can provide support for routing/roaming, authentication, authorization, naming/addressing resolution, location dependencies, etc. An S6a reference point between the HSS 524 and the MMES 521 may enable transfer of subscription and authentication data for authenticating/authorizing user access to the EPC 520 between HSS 524 and the MMEs 521.

The S-GW 522 may terminate the S1 interface 413 ("S1-U" in FIG. 5) toward the RAN 510, and routes data packets between the RAN 510 and the EPC 520. In addition, the S-GW 522 may be a local mobility anchor point for inter-RAN node handovers and also may provide an anchor for inter-3GPP mobility. Other responsibilities may include lawful intercept, charging, and some policy enforcement. The S11 reference point between the S-GW 522 and the MMES 521 may provide a control plane between the MMES 521 and the S-GW 522. The S-GW 522 may be coupled with the P-GW 523 via an S5 reference point.

The P-GW 523 may terminate an SGi interface toward a PDN 530. The P-GW 523 may route data packets between the EPC 520 and external networks such as a network including the application server 430 (alternatively referred to as an "AF") via an IP interface 425 (see e.g., FIG. 4). In embodiments, the P-GW 523 may be communicatively coupled to an application server (application server 430 of FIG. 4 or PDN 530 in FIG. 5) via an IP communications interface 425 (see, e.g., FIG. 4). The S5 reference point between the P-GW 523 and the S-GW 522 may provide user plane tunneling and tunnel management between the P-GW 523 and the S-GW 522. The S5 reference point may also be used for S-GW 522 relocation due to UE 501 mobility and if the S-GW 522 needs to connect to a non-collocated P-GW 523 for the required PDN connectivity. The P-GW 523 may further include a node for policy enforcement and charging data collection (e.g., PCEF (not shown)). Additionally, the SGi reference point between the P-GW 523 and the packet data network (PDN) 530 may be an operator external public, a private PDN, or an intra operator packet data network, for example, for provision of IMS services. The P-GW 523 may be coupled with a PCRF 526 via a Gx reference point.

PCRF 526 is the policy and charging control element of the EPC 520. In a non-roaming scenario, there may be a single PCRF 526 in the Home Public Land Mobile Network (HPLMN) associated with a UE 501's Internet Protocol Connectivity Access Network (IP-CAN) session. In a roaming scenario with local breakout of traffic, there may be two PCRFs associated with a UE 501's IP-CAN session, a Home PCRF (H-PCRF) within an HPLMN and a Visited PCRF (V-PCRF) within a Visited Public Land Mobile Network (VPLMN). The PCRF 526 may be communicatively coupled to the application server 530 via the P-GW 523. The application server 530 may signal the PCRF 526 to indicate a new service flow and select the appropriate QoS and charging parameters. The PCRF 526 may provision this rule into a PCEF (not shown) with the appropriate TFT and QCI, which commences the QoS and charging as specified by the application server 530. The Gx reference point between the PCRF 526 and the P-GW 523 may allow for the transfer of QoS policy and charging rules from the PCRF 526 to PCEF in the P-GW 523. An Rx reference point may reside between the PDN 530 (or "AF 530") and the PCRF 526.

Figure 6:
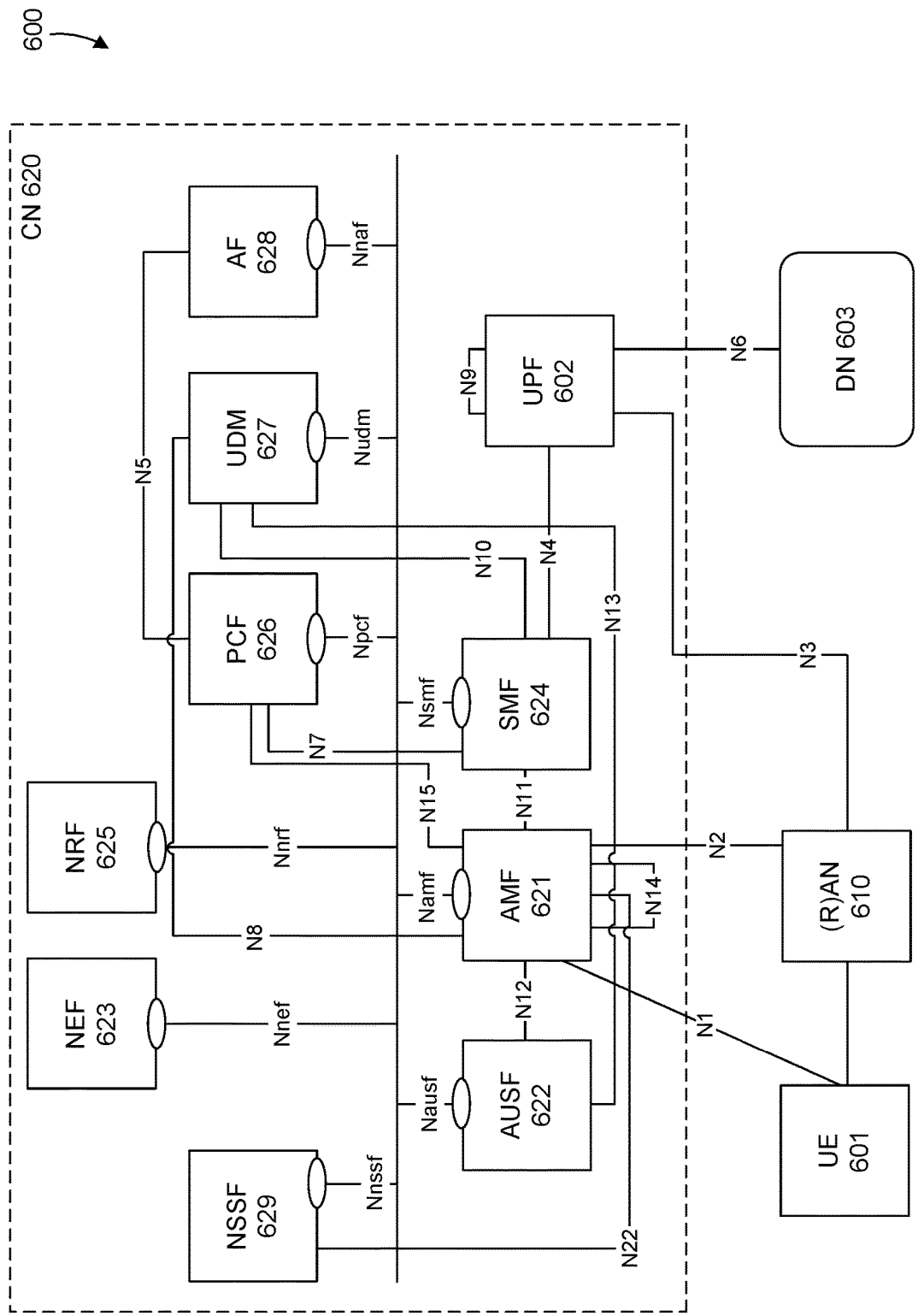
FIG. 6 depicts an architecture of a system including a second core network in accordance with some embodiments.

FIG. 6 illustrates an architecture of a system 600 including a second CN 620 in accordance with various embodiments. The system 600 is shown to include a UE 601, which may be the same or similar to the UEs 401 and UE 501 discussed previously; a (R)AN 610, which may be the same or similar to the RAN 410 and RAN 510 discussed previously, and which may include RAN nodes 411 discussed previously; and a DN 603, which may be, for example, operator services, Internet access or 3rd party services; and a 5GC 620. The 5GC 620 may include an AUSF 622; an AMF 621; a SMF 624; a NEF 623; a PCF 626; a NRF 625; a UDM 627; an AF 628; a UPF 602; and a NSSF 629.

The UPF 602 may act as an anchor point for intra-RAT and inter-RAT mobility, an external PDU session point of interconnect to DN 603, and a branching point to support multi-homed PDU session. The UPF 602 may also perform packet routing and forwarding, perform packet inspection, enforce the user plane part of policy rules, lawfully intercept packets (UP collection), perform traffic usage reporting, perform QoS handling for a user plane (e.g., packet filtering, gating, UL/DL rate enforcement), perform Uplink Traffic verification (e.g., SDF to QoS flow mapping), transport level packet marking in the uplink and downlink, and perform downlink packet buffering and downlink data notification triggering. UPF 602 may include an uplink classifier to support routing traffic flows to a data network. The DN 603 may represent various network operator services, Internet access, or third party services. DN 603 may include, or be similar to, application server 430 discussed previously. The UPF 602 may interact with the SMF 624 via an N4 reference point between the SMF 624 and the UPF 602.

The AUSF 622 may store data for authentication of UE 601 and handle authentication-related functionality. The AUSF 622 may facilitate a common authentication framework for various access types. The AUSF 622 may communicate with the AMF 621 via an N12 reference point between the AMF 621 and the AUSF 622; and may communicate with the UDM 627 via an N13 reference point between the UDM 627 and the AUSF 622. Additionally, the AUSF 622 may exhibit an Nausf service-based interface.

The AMF 621 may be responsible for registration management (e.g., for registering UE 601, etc.), connection management, reachability management, mobility management, and lawful interception of AMF-related events, and access authentication and authorization. The AMF 621 may be a termination point for the an N11 reference point between the AMF 621 and the SMF 624. The AMF 621 may provide transport for SM messages between the UE 601 and the SMF 624, and act as a transparent pro12 for routing SM messages. AMF 621 may also provide transport for SMS messages between UE 601 and an SMSF (not shown by FIG. 6). AMF 621 may act as SEAF, which may include interaction with the AUSF 622 and the UE 601, receipt of an intermediate key that was established as a result of the UE 601 authentication process. Where USIM based authentication is used, the AMF 621 may retrieve the security material from the AUSF 622. AMF 621 may also include a SCM function, which receives a key from the SEA that it uses to derive access-network specific keys. Furthermore, AMF 621 may be a termination point of a RAN CP interface, which may include or be an N2 reference point between the (R)AN 610 and the AMF 621; and the AMF 621 may be a termination point of NAS (N1) signalling, and perform NAS ciphering and integrity protection.

AMF 621 may also support NAS signalling with a UE 601 over an N3 IWF interface. The N3IWF may be used to provide access to untrusted entities. N3IWF may be a termination point for the N2 interface between the (R)AN 610 and the AMF 621 for the control plane, and may be a termination point for the N3 reference point between the (R)AN 610 and the UPF 602 for the user plane. As such, the AMF 621 may handle N2 signalling from the SMF 624 and the AMF 621 for PDU sessions and QoS, encapsulate/de-encapsulate packets for IPSec and N3 tunnelling, mark N3 user-plane packets in the uplink, and enforce QoS corresponding to N3 packet marking taking into account QoS requirements associated with such marking received over N2. N3IWF may also relay uplink and downlink control-plane NAS signalling between the UE 601 and AMF 621 via an N1 reference point between the UE 601 and the AMF 621, and relay uplink and downlink user-plane packets between the UE 601 and UPF 602. The N3IWF also provides mechanisms for IPsec tunnel establishment with the UE 601. The AMF 621 may exhibit an Namf service-based interface, and may be a termination point for an N14 reference point between two AMFs 621 and an N17 reference point between the AMF 621 and a 5G-EIR (not shown by FIG. 6).

The UE 601 may need to register with the AMF 621 in order to receive network services. RM is used to register or deregister the UE 601 with the network (e.g., AMF 621), and establish a UE context in the network (e.g., AMF 621). The UE 601 may operate in an RM-REGISTERED state or an RM-DEREGISTERED state. In the RM-DEREGISTERED state, the UE 601 is not registered with the network, and the UE context in AMF 621 holds no valid location or routing information for the UE 601 so the UE 601 is not reachable by the AMF 621. In the RM-REGISTERED state, the UE 601 is registered with the network, and the UE context in AMF 621 may hold a valid location or routing information for the UE 601 so the UE 601 is reachable by the AMF 621. In the RM-REGISTERED state, the UE 601 may perform mobility Registration Update procedures, perform periodic Registration Update procedures triggered by expiration of the periodic update timer (e.g., to notify the network that the UE 601 is still active), and perform a Registration Update procedure to update UE capability information or to re-negotiate protocol parameters with the network, among others.

The AMF 621 may store one or more RM contexts for the UE 601, where each RM context is associated with a specific access to the network. The RM context may be a data structure, database object, etc. that indicates or stores, inter alia, a registration state per access type and the periodic update timer. The AMF 621 may also store a 5GC MM context that may be the same or similar to the (E)MM context discussed previously. In various embodiments, the AMF 621 may store a CE mode B Restriction parameter of the UE 601 in an associated MM context or RM context. The AMF 621 may also derive the value, when needed, from the UE's usage setting parameter already stored in the UE context (and/or MM/RM context).

CM may be used to establish and release a signaling connection between the UE 601 and the AMF 621 over the N1 interface. The signaling connection is used to enable NAS signaling exchange between the UE 601 and the CN 620, and comprises both the signaling connection between the UE and the AN (e.g., RRC connection or UE-N3IWF connection for non-3GPP access) and the N2 connection for the UE 601 between the AN (e.g., RAN 610) and the AMF 621. The UE 601 may operate in one of two CM states, CM-IDLE mode or CM-CONNECTED mode. When the UE 601 is operating in the CM-IDLE state/mode, the UE 601 may have no NAS signaling connection established with the AMF 621 over the N1 interface, and there may be (R)AN 610 signaling connection (e.g., N2 and/or N3 connections) for the UE 601. When the UE 601 is operating in the CM-CONNECTED state/mode, the UE 601 may have an established NAS signaling connection with the AMF 621 over the N1 interface, and there may be a (R)AN 610 signaling connection (e.g., N2 and/or N3 connections) for the UE 601. Establishment of an N2 connection between the (R)AN 610 and the AMF 621 may cause the UE 601 to transition from CM-IDLE mode to CM-CONNECTED mode, and the UE 601 may transition from the CM-CONNECTED mode to the CM-IDLE mode when N2 signaling between the (R)AN 610 and the AMF 621 is released.

The SMF 624 may be responsible for SM (e.g., session establishment, modify and release, including tunnel maintain between UPF and AN node); UE IP address allocation and management (including optional authorization); selection and control of UP function; configuring traffic steering at UPF to route traffic to proper destination; termination of interfaces toward policy control functions; controlling part of policy enforcement and QoS; lawful intercept (for SM events and interface to LI system); termination of SM parts of NAS messages; downlink data notification; initiating AN specific SM information, sent via AMF over N2 to AN; and determining SSC mode of a session. SM may refer to management of a PDU session, and a PDU session or "session" may refer to a PDU connectivity service that provides or enables the exchange of PDUs between a UE 601 and a data network (DN) 603 identified by a Data Network Name (DNN). PDU sessions may be established upon UE 601 request, modified upon UE 601 and 5GC 620 request, and released upon UE 601 and 5GC 620 request using NAS SM signaling exchanged over the N1 reference point between the UE 601 and the SMF 624. Upon request from an application server, the 5GC 620 may trigger a specific application in the UE 601. In response to receipt of the trigger message, the UE 601 may pass the trigger message (or relevant parts/information of the trigger message) to one or more identified applications in the UE 601. The identified application(s) in the UE 601 may establish a PDU session to a specific DNN. The SMF 624 may check whether the UE 601 requests are compliant with user subscription information associated with the UE 601. In this regard, the SMF 624 may retrieve and/or request to receive update notifications on SMF 624 level subscription data from the UDM 627.

The SMF 624 may include the following roaming functionality: handling local enforcement to apply QoS SLAB (VPLMN); charging data collection and charging interface (VPLMN); lawful intercept (in VPLMN for SM events and interface to LI system); and support for interaction with external DN for transport of signalling for PDU session authorization/authentication by external DN. An N16 reference point between two SMFs 624 may be included in the system 600, which may be between another SMF 624 in a visited network and the SMF 624 in the home network in roaming scenarios. Additionally, the SMF 624 may exhibit the Nsmf service-based interface.

The NEF 623 may provide means for securely exposing the services and capabilities provided by 3GPP network functions for third party, internal exposure/re-exposure, Application Functions (e.g., AF 628), edge computing or fog computing systems, etc. In such embodiments, the NEF 623 may authenticate, authorize, and/or throttle the AFs. NEF 623 may also translate information exchanged with the AF 628 and information exchanged with internal network functions. For example, the NEF 623 may translate between an AF-Service-Identifier and an internal 5GC information. NEF 623 may also receive information from other network functions (NFs) based on exposed capabilities of other network functions. This information may be stored at the NEF 623 as structured data, or at a data storage NF using standardized interfaces. The stored information can then be re-exposed by the NEF 623 to other NFs and AFs, and/or used for other purposes such as analytics. Additionally, the NEF 623 may exhibit an Nnef service-based interface.

The NRF 625 may support service discovery functions, receive NF discovery requests from NF instances, and provide the information of the discovered NF instances to the NF instances. NRF 625 also maintains information of available NF instances and their supported services. As used herein, the terms "instantiate," "instantiation," and the like may refer to the creation of an instance, and an "instance" may refer to a concrete occurrence of an object, which may occur, for example, during execution of program code. Additionally, the NRF 625 may exhibit the Nnrf service-based interface.

The PCF 626 may provide policy rules to control plane function(s) to enforce them, and may also support unified policy framework to govern network behaviour. The PCF 626 may also implement an FE to access subscription information relevant for policy decisions in a UDR of the UDM 627. The PCF 626 may communicate with the AMF 621 via an N15 reference point between the PCF 626 and the AMF 621, which may include a PCF 626 in a visited network and the AMF 621 in case of roaming scenarios. The PCF 626 may communicate with the AF 628 via an N5 reference point between the PCF 626 and the AF 628; and with the SMF 624 via an N7 reference point between the PCF 626 and the SMF 624. The system 600 and/or CN 620 may also include an N24 reference point between the PCF 626 (in the home network) and a PCF 626 in a visited network. Additionally, the PCF 626 may exhibit an Npcf service-based interface.

The UDM 627 may handle subscription-related information to support the network entities' handling of communication sessions, and may store subscription data of UE 601. For example, subscription data may be communicated between the UDM 627 and the AMF 621 via an N8 reference point between the UDM 627 and the AMF. The UDM 627 may include two parts, an application FE and a UDR (the FE and UDR are not shown by FIG. 6). The UDR may store subscription data and policy data for the UDM 627 and the PCF 626, and/or structured data for exposure and application data (including PFDs for application detection, application request information for multiple UEs 601) for the NEF 623. The Nudr service-based interface may be exhibited by the UDR 221 to allow the UDM 627, PCF 626, and NEF 623 to access a particular set of the stored data, as well as to read, update (e.g., add, modify), delete, and subscribe to notification of relevant data changes in the UDR. The UDM may include a UDM-FE, which is in charge of processing credentials, location management, subscription management and so on. Several different front ends may serve the same user in different transactions. The UDM-FE accesses subscription information stored in the UDR and performs authentication credential processing, user identification handling, access authorization, registration/mobility management, and subscription management. The UDR may interact with the SMF 624 via an N10 reference point between the UDM 627 and the SMF 624. UDM 627 may also support SMS management, wherein an SMS-FE implements the similar application logic as discussed previously. Additionally, the UDM 627 may exhibit the Nudm service-based interface.

The AF 628 may provide application influence on traffic routing, provide access to the NCE, and interact with the policy framework for policy control. The NCE may be a mechanism that allows the 5GC 620 and AF 628 to provide information to each other via NEF 623, which may be used for edge computing implementations. In such implementations, the network operator and third party services may be hosted close to the UE 601 access point of attachment to achieve an efficient service delivery through the reduced end-to-end latency and load on the transport network. For edge computing implementations, the 5GC may select a UPF 602 close to the UE 601 and execute traffic steering from the UPF 602 to DN 603 via the N6 interface. This may be based on the UE subscription data, UE location, and information provided by the AF 628. In this way, the AF 628 may influence UPF (re)selection and traffic routing. Based on operator deployment, when AF 628 is considered to be a trusted entity, the network operator may permit AF 628 to interact directly with relevant NFs. Additionally, the AF 628 may exhibit an Naf service-based interface.

The NSSF 629 may select a set of network slice instances serving the UE 601. The NSSF 629 may also determine allowed NSSAI and the mapping to the subscribed S-NS-SAIs, if needed. The NSSF 629 may also determine the AMF set to be used to serve the UE 601, or a list of candidate AMF(s) 621 based on a suitable configuration and possibly by querying the NRF 625. The selection of a set of network slice instances for the UE 601 may be triggered by the AMF 621 with which the UE 601 is registered by interacting with the NSSF 629, which may lead to a change of AMF 621. The NSSF 629 may interact with the AMF 621 via an N22 reference point between AMF 621 and NSSF 629; and may communicate with another NSSF 629 in a visited network via an N31 reference point (not shown by FIG. 6). Additionally, the NSSF 629 may exhibit an Nnssf service-based interface.

As discussed previously, the CN 620 may include an SMSF, which may be responsible for SMS subscription checking and verification, and relaying SM messages to/from the UE 601 to/from other entities, such as an SMS-GMSC/IWMSC/SMS-router. The SMS may also interact with AMF 621 and UDM 627 for a notification procedure that the UE 601 is available for SMS transfer (e.g., set a UE not reachable flag, and notifying UDM 627 when UE 601 is available for SMS).

The CN 120 may also include other elements that are not shown by FIG. 6, such as a Data Storage system/architecture, a 5G-EIR, a SEPP, and the like. The Data Storage system may include a SDSF, an UDSF, and/or the like. Any NF may store and retrieve unstructured data into/from the UDSF (e.g., UE contexts), via N18 reference point between any NF and the UDSF (not shown by FIG. 6). Individual NFs may share a UDSF for storing their respective unstructured data or individual NFs may each have their own UDSF located at or near the individual NFs. Additionally, the UDSF may exhibit an Nudsf service-based interface (not shown by FIG. 6). The 5G-EIR may be an NF that checks the status of PEI for determining whether particular equipment/entities are blacklisted from the network; and the SEPP may be a non-transparent pro12 that performs topology hiding, message filtering, and policing on inter-PLMN control plane interfaces.

Additionally, there may be many more reference points and/or service-based interfaces between the NF services in the NFs; however, these interfaces and reference points have been omitted from FIG. 6 for clarity. In one example, the CN 620 may include an Nx interface, which is an inter-CN interface between the MME (e.g., MME 521) and the AMF 621 in order to enable interworking between CN 620 and CN 520. Other example interfaces/reference points may include an N5g-EIR service-based interface exhibited by a 5G-EIR, an N27 reference point between the NRF in the visited network and the NRF in the home network; and an N31 reference point between the NSSF in the visited network and the NSSF in the home network.

Figure 7:
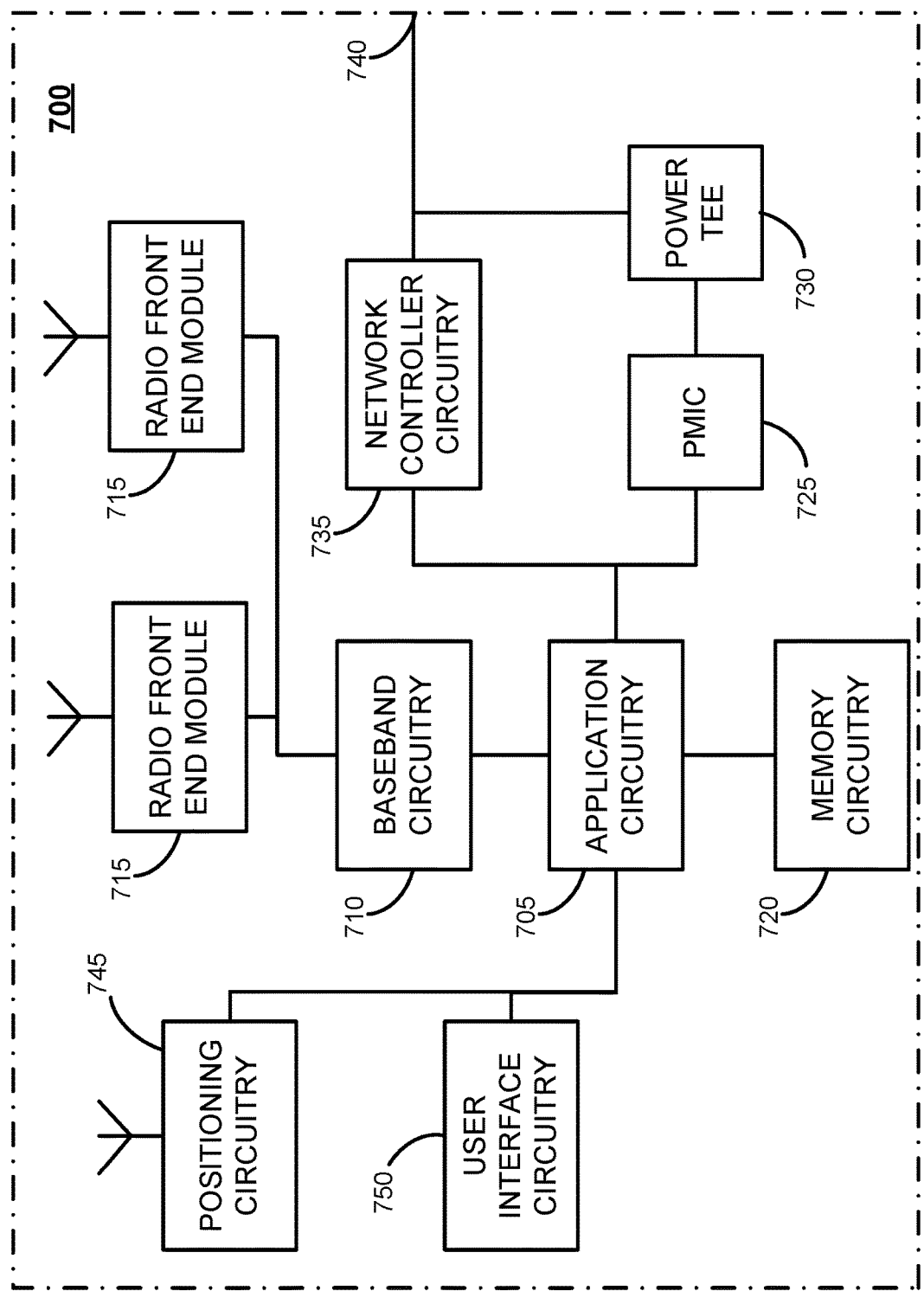
FIG. 7 depicts an example of infrastructure equipment, in accordance with various embodiments.

FIG. 7 illustrates an example of infrastructure equipment 700 in accordance with various embodiments. The infrastructure equipment 700 (or "system 700") may be implemented as a base station, radio head, RAN node such as the RAN nodes 411 and/or AP 406 shown and described previously, application server(s) 430, and/or any other element/device discussed herein. In other examples, the system 700 could be implemented in or by a UE.

The system 700 includes application circuitry 705, baseband circuitry 710, one or more radio front end modules (RFEMs) 715, memory circuitry 720, power management integrated circuitry (PMIC) 725, power tee circuitry 730, network controller circuitry 735, network interface connector 740, satellite positioning circuitry 745, and user interface 750. In some embodiments, the device 700 may include additional elements such as, for example, memory/storage, display, camera, sensor, or input/output (I/O) interface. In other embodiments, the components described below may be included in more than one device. For example, said circuitries may be separately included in more than one device for CRAN, vBBU, or other like implementations.

Application circuitry 705 includes circuitry such as, but not limited to one or more processors (or processor cores), cache memory, and one or more of low drop-out voltage regulators (LDOs), interrupt controllers, serial interfaces such as SPI, I²C or universal programmable serial interface module, real time clock (RTC), timer-counters including interval and watchdog timers, general purpose input/output (I/O or IO), memory card controllers such as Secure Digital (SD) MultiMediaCard (MMC) or similar, Universal Serial Bus (USB) interfaces, Mobile Industry Processor Interface (MIPI) interfaces and Joint Test Access Group (JTAG) test access ports. The processors (or cores) of the application circuitry 705 may be coupled with or may include memory/storage elements and may be configured to execute instructions stored in the memory/storage to enable various applications or operating systems to run on the system 700. In some implementations, the memory/storage elements may be on-chip memory circuitry, which may include any suitable volatile and/or non-volatile memory, such as DRAM, SRAM, EPROM, EEPROM, Flash memory, solid-state memory, and/or any other type of memory device technology, such as those discussed herein.

The processor(s) of application circuitry 705 may include, for example, one or more processor cores (CPUs), one or more application processors, one or more graphics processing units (GPUs), one or more reduced instruction set computing (RISC) processors, one or more Acorn RISC Machine (ARM) processors, one or more complex instruction set computing (CISC) processors, one or more digital signal processors (DSP), one or more FPGAs, one or more PLDs, one or more ASICs, one or more microprocessors or controllers, or any suitable combination thereof. In some embodiments, the application circuitry 705 may comprise, or may be, a special-purpose processor/controller to operate according to the various embodiments herein. As examples, the processor(s) of application circuitry 705 may include one or more Intel Pentium®, Core®, or Xeon® processor(s); Advanced Micro Devices (AMD) Ryzen® processor(s), Accelerated Processing Units (APUs), or Epyc® processors; ARM-based processor(s) licensed from ARM Holdings, Ltd. such as the ARM Cortex-A family of processors and the ThunderX2® provided by Cavium™, Inc.; a MIPS-based design from MIPS Technologies, Inc. such as MIPS Warrior P-class processors; and/or the like. In some embodiments, the system 700 may not utilize application circuitry 705, and instead may include a special-purpose processor/controller to process IP data received from an EPC or 5GC, for example.

In some implementations, the application circuitry 705 may include one or more hardware accelerators, which may be microprocessors, programmable processing devices, or the like. The one or more hardware accelerators may include, for example, computer vision (CV) and/or deep learning (DL) accelerators. As examples, the programmable processing devices may be one or more a field-programmable devices (FPDs) such as field-programmable gate arrays (FPGAs) and the like; programmable logic devices (PLDs) such as complex PLDs (CPLDs), high-capacity PLDs (HCPLDs), and the like; ASICs such as structured ASICs and the like; programmable SoCs (PSoCs); and the like. In such implementations, the circuitry of application circuitry 705 may comprise logic blocks or logic fabric, and other interconnected resources that may be programmed to perform various functions, such as the procedures, methods, functions, etc. of the various embodiments discussed herein. In such embodiments, the circuitry of application circuitry 705 may include memory cells (e.g., erasable programmable read-only memory (EPROM), electrically erasable programmable read-only memory (EEPROM), flash memory, static memory (e.g., static random access memory (SRAM), anti-fuses, etc.)) used to store logic blocks, logic fabric, data, etc. in look-up-tables (LUTs) and the like.

The baseband circuitry 710 may be implemented, for example, as a solder-down substrate including one or more integrated circuits, a single packaged integrated circuit soldered to a main circuit board or a multi-chip module containing two or more integrated circuits. The various hardware electronic elements of baseband circuitry 710 are discussed infra with regard to FIG. 9.

User interface circuitry 750 may include one or more user interfaces designed to enable user interaction with the system 700 or peripheral component interfaces designed to enable peripheral component interaction with the system 700. User interfaces may include, but are not limited to, one or more physical or virtual buttons (e.g., a reset button), one or more indicators (e.g., light emitting diodes (LEDs)), a physical keyboard or keypad, a mouse, a touchpad, a touchscreen, speakers or other audio emitting devices, microphones, a printer, a scanner, a headset, a display screen or display device, etc. Peripheral component interfaces may include, but are not limited to, a nonvolatile memory port, a universal serial bus (USB) port, an audio jack, a power supply interface, etc.

The radio front end modules (RFEMs) 715 may comprise a millimeter wave (mmWave) RFEM and one or more sub-mmWave radio frequency integrated circuits (RFICs). In some implementations, the one or more sub-mmWave RFICs may be physically separated from the mmWave RFEM. The RFICs may include connections to one or more antennas or antenna arrays (see e.g., antenna array 911 of FIG. 9 infra), and the RFEM may be connected to multiple antennas. In alternative implementations, both mmWave and sub-mmWave radio functions may be implemented in the same physical RFEM 715, which incorporates both mmWave antennas and sub-mmWave.

The memory circuitry 720 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM), etc., and may incorporate the three-dimensional (3D) cross-point (XPOINT) memories from Intel® and Micron®. Memory circuitry 720 may be implemented as one or more of solder down packaged integrated circuits, socketed memory modules and plug-in memory cards.

The PMIC 725 may include voltage regulators, surge protectors, power alarm detection circuitry, and one or more backup power sources such as a battery or capacitor. The power alarm detection circuitry may detect one or more of brown out (under-voltage) and surge (over-voltage) conditions. The power tee circuitry 730 may provide for electrical power drawn from a network cable to provide both power supply and data connectivity to the infrastructure equipment 700 using a single cable.

The network controller circuitry 735 may provide connectivity to a network using a standard network interface protocol such as Ethernet, Ethernet over GRE Tunnels, Ethernet over Multiprotocol Label Switching (MPLS), or some other suitable protocol. Network connectivity may be provided to/from the infrastructure equipment 700 via network interface connector 740 using a physical connection, which may be electrical (commonly referred to as a "copper interconnect"), optical, or wireless. The network controller circuitry 735 may include one or more dedicated processors and/or FPGAs to communicate using one or more of the aforementioned protocols. In some implementations, the network controller circuitry 735 may include multiple controllers to provide connectivity to other networks using the same or different protocols.

The positioning circuitry 745 includes circuitry to receive and decode signals transmitted/broadcasted by a positioning network of a global navigation satellite system (GNSS). Examples of navigation satellite constellations (or GNSS) include United States' Global Positioning System (GPS), Russia's Global Navigation System (GLONASS), the European Union's Galileo system, China's BeiDou Navigation Satellite System, a regional navigation system or GNSS augmentation system (e.g., Navigation with Indian Constellation (NAVIC), Japan's Quasi-Zenith Satellite System (QZSS), France's Doppler Orbitography and Radio-positioning Integrated by Satellite (DORIS), etc.), or the like. The positioning circuitry 745 comprises various hardware elements (e.g., including hardware devices such as switches, filters, amplifiers, antenna elements, and the like to facilitate OTA communications) to communicate with components of a positioning network, such as navigation satellite constellation nodes. In some embodiments, the positioning circuitry 745 may include a Micro-Technology for Positioning, Navigation, and Timing (Micro-PNT) IC that uses a master timing clock to perform position tracking/estimation without GNSS assistance. The positioning circuitry 745 may also be part of, or interact with, the baseband circuitry 710 and/or RFEMs 715 to communicate with the nodes and components of the positioning network. The positioning circuitry 745 may also provide position data and/or time data to the application circuitry 705, which may use the data to synchronize operations with various infrastructure (e.g., RAN nodes 411, etc.), or the like.

The components shown by FIG. 7 may communicate with one another using interface circuitry, which may include any number of bus and/or interconnect (IX) technologies such as industry standard architecture (ISA), extended ISA (EISA), peripheral component interconnect (PCI), peripheral component interconnect extended (PCIx), PCI express (PCIe), or any number of other technologies. The bus/IX may be a proprietary bus, for example, used in a SoC based system. Other bus/IX systems may be included, such as an I²C interface, an SPI interface, point to point interfaces, and a power bus, among others.

Figure 8:
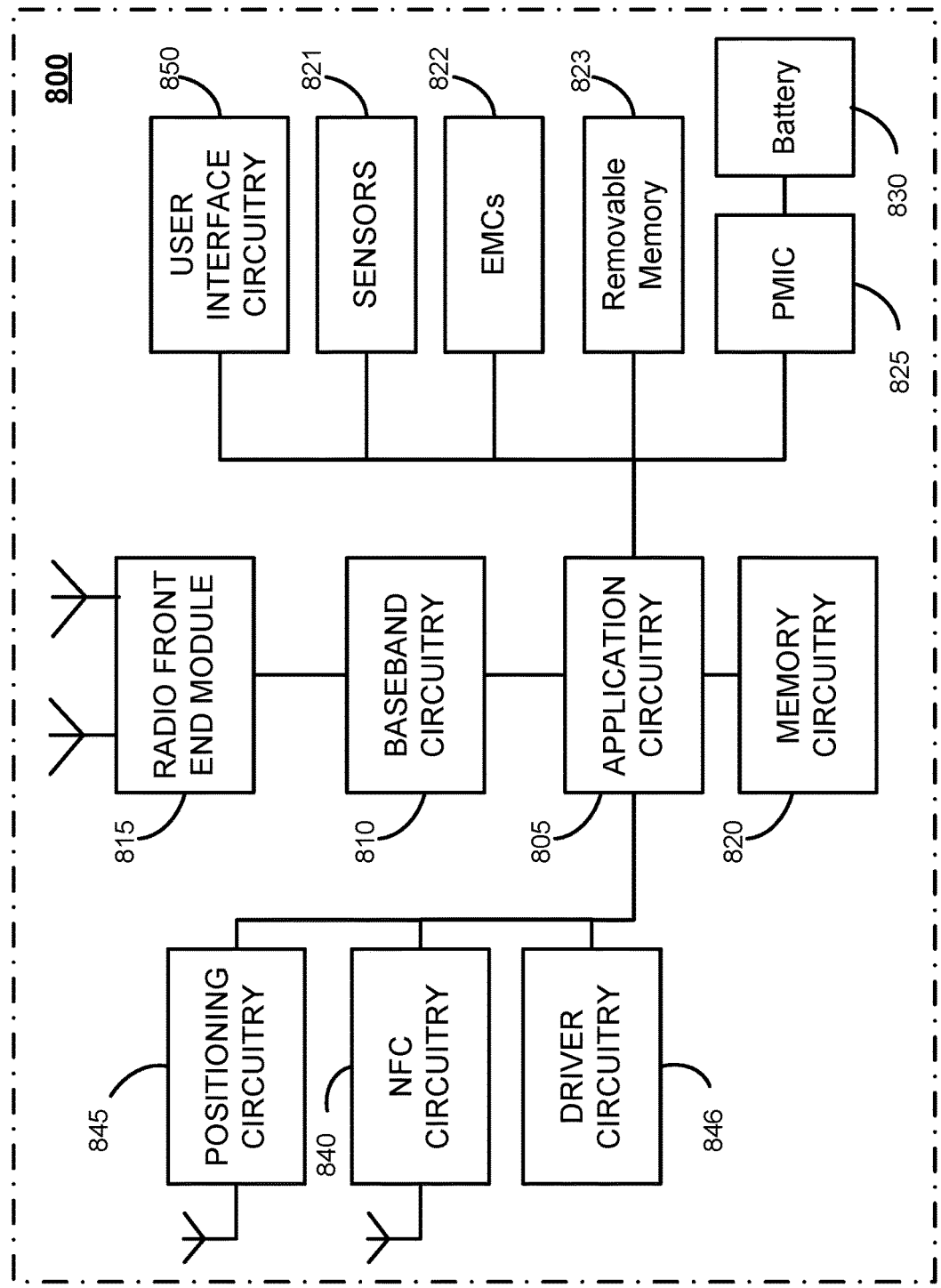
FIG. 8 depicts example components of a computer platform, in accordance with various embodiments.

FIG. 8 illustrates an example of a platform 800 (or "device 800") in accordance with various embodiments. In embodiments, the computer platform 800 may be suitable for use as UEs 401, 501, 601, application servers 430, and/or any other element/device discussed herein. The platform 800 may include any combinations of the components shown in the example. The components of platform 800 may be implemented as integrated circuits (ICs), portions thereof, discrete electronic devices, or other modules, logic, hardware, software, firmware, or a combination thereof adapted in the computer platform 800, or as components otherwise incorporated within a chassis of a larger system. The block diagram of FIG. 8 is intended to show a high level view of components of the computer platform 800. However, some of the components shown may be omitted, additional components may be present, and different arrangement of the components shown may occur in other implementations.

Application circuitry 805 includes circuitry such as, but not limited to one or more processors (or processor cores), cache memory, and one or more of LDOs, interrupt controllers, serial interfaces such as SPI, I²C or universal programmable serial interface module, RTC, timer-counters including interval and watchdog timers, general purpose I/O, memory card controllers such as SD MMC or similar, USB interfaces, MIPI interfaces, and JTAG test access ports. The processors (or cores) of the application circuitry 805 may be coupled with or may include memory/storage elements and may be configured to execute instructions stored in the memory/storage to enable various applications or operating systems to run on the system 800. In some implementations, the memory/storage elements may be on-chip memory circuitry, which may include any suitable volatile and/or non-volatile memory, such as DRAM, SRAM, EPROM, EEPROM, Flash memory, solid-state memory, and/or any other type of memory device technology, such as those discussed herein.

The processor(s) of application circuitry 705 may include, for example, one or more processor cores, one or more application processors, one or more GPUs, one or more RISC processors, one or more ARM processors, one or more CISC processors, one or more DSP, one or more FPGAs, one or more PLDs, one or more ASICs, one or more microprocessors or controllers, a multithreaded processor, an ultra-low voltage processor, an embedded processor, some other known processing element, or any suitable combination thereof. In some embodiments, the application circuitry 705 may comprise, or may be, a special-purpose processor/controller to operate according to the various embodiments herein.

As examples, the processor(s) of application circuitry 805 may include an Intel® Architecture Core™ based processor, such as a Quark™, an Atom™, an i3, an i5, an i7, or an MCU-class processor, or another such processor available from Intel® Corporation, Santa Clara, CA The processors of the application circuitry 805 may also be one or more of Advanced Micro Devices (AMD) Ryzen® processor(s) or Accelerated Processing Units (APUs); A5-A9 processor(s) from Apple® Inc., Snapdragon™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; or the like. In some implementations, the application circuitry 805 may be a part of a system on a chip (SoC) in which the application circuitry 805 and other components are formed into a single integrated circuit, or a single package, such as the Edison™ or Galileo™ SoC boards from Intel® Corporation.

Additionally or alternatively, application circuitry 805 may include circuitry such as, but not limited to, one or more a field-programmable devices (FPDs) such as FPGAs and the like; programmable logic devices (PLDs) such as complex PLDs (CPLDs), high-capacity PLDs (HCPLDs), and the like; ASICs such as structured ASICs and the like; programmable SoCs (PSoCs); and the like. In such embodiments, the circuitry of application circuitry 805 may comprise logic blocks or logic fabric, and other interconnected resources that may be programmed to perform various functions, such as the procedures, methods, functions, etc. of the various embodiments discussed herein. In such embodiments, the circuitry of application circuitry 805 may include memory cells (e.g., erasable programmable read-only memory (EPROM), electrically erasable programmable read-only memory (EEPROM), flash memory, static memory (e.g., static random access memory (SRAM), anti-fuses, etc.)) used to store logic blocks, logic fabric, data, etc. in look-up tables (LUTs) and the like.

The baseband circuitry 810 may be implemented, for example, as a solder-down substrate including one or more integrated circuits, a single packaged integrated circuit soldered to a main circuit board or a multi-chip module containing two or more integrated circuits. The various hardware electronic elements of baseband circuitry 810 are discussed infra with regard to FIG. 9.

The RFEMs 815 may comprise a millimeter wave (mmWave) RFEM and one or more sub-mmWave radio frequency integrated circuits (RFICs). In some implementations, the one or more sub-mmWave RFICs may be physically separated from the mmWave RFEM. The RFICs may include connections to one or more antennas or antenna arrays (see e.g., antenna array 911 of FIG. 9 infra), and the RFEM may be connected to multiple antennas. In alternative implementations, both mmWave and sub-mmWave radio functions may be implemented in the same physical RFEM 815, which incorporates both mmWave antennas and sub-mmWave.

The memory circuitry 820 may include any number and type of memory devices used to provide for a given amount of system memory. As examples, the memory circuitry 820 may include one or more of volatile memory including random access memory (RAM), dynamic RAM (DRAM) and/or synchronous dynamic RAM (SDRAM), and nonvolatile memory (NVM) including high-speed electrically erasable memory (commonly referred to as Flash memory), phase change random access memory (PRAM), magnetoresistive random access memory (MRAM), etc. The memory circuitry 820 may be developed in accordance with a Joint Electron Devices Engineering Council (JEDEC) low power double data rate (LPDDR)-based design, such as LPDDR2, LPDDR3, LPDDR4, or the like. Memory circuitry 820 may be implemented as one or more of solder down packaged integrated circuits, single die package (SDP), dual die package (DDP) or quad die package (Q17P), socketed memory modules, dual inline memory modules (DIMMs) including microDIMMs or MiniDIMMs, and/or soldered onto a motherboard via a ball grid array (BGA). In low power implementations, the memory circuitry 820 may be on-die memory or registers associated with the application circuitry

805. To provide for persistent storage of information such as data, applications, operating systems and so forth, memory circuitry 820 may include one or more mass storage devices, which may include, inter alia, a solid state disk drive (SSDD), hard disk drive (HDD), a micro HDD, resistance change memories, phase change memories, holographic memories, or chemical memories, among others. For example, the computer platform 800 may incorporate the three-dimensional (3D) cross-point (XPOINT) memories from Intel® and Micron®.

Removable memory circuitry 823 may include devices, circuitry, enclosures/housings, ports or receptacles, etc. used to couple portable data storage devices with the platform 800. These portable data storage devices may be used for mass storage purposes, and may include, for example, flash memory cards (e.g., Secure Digital (SD) cards, microSD cards, xD picture cards, and the like), and USB flash drives, optical discs, external HDDs, and the like.

The platform 800 may also include interface circuitry (not shown) that is used to connect external devices with the platform 800. The external devices connected to the platform 800 via the interface circuitry include sensor circuitry 821 and electro-mechanical components (EMCs) 822, as well as removable memory devices coupled to removable memory circuitry 823.

The sensor circuitry 821 include devices, modules, or subsystems whose purpose is to detect events or changes in its environment and send the information (sensor data) about the detected events to some other a device, module, subsystem, etc. Examples of such sensors include, inter alia, inertia measurement units (IMUS) comprising accelerometers, gyroscopes, and/or magnetometers; microelectromechanical systems (MEMS) or nanoelectromechanical systems (NEMS) comprising 3-axis accelerometers, 3-axis gyroscopes, and/or magnetometers; level sensors; flow sensors; temperature sensors (e.g., thermistors); pressure sensors; barometric pressure sensors; gravimeters; altimeters; image capture devices (e.g., cameras or lensless apertures); light detection and ranging (LiDAR) sensors; proximity sensors (e.g., infrared radiation detector and the like), depth sensors, ambient light sensors, ultrasonic transceivers; microphones or other like audio capture devices; etc.

EMCs 822 include devices, modules, or subsystems whose purpose is to enable platform 800 to change its state, position, and/or orientation, or move or control a mechanism or (sub)system. Additionally, EMCs 822 may be configured to generate and send messages/signalling to other components of the platform 800 to indicate a current state of the EMCs 822. Examples of the EMCs 822 include one or more power switches, relays including electromechanical relays (EMRs) and/or solid state relays (SSRs), actuators (e.g., valve actuators, etc.), an audible sound generator, a visual warning device, motors (e.g., DC motors, stepper motors, etc.), wheels, thrusters, propellers, claws, clamps, hooks, and/or other like electro-mechanical components. In embodiments, platform 800 is configured to operate one or more EMCs 822 based on one or more captured events and/or instructions or control signals received from a service provider and/or various clients.

In some implementations, the interface circuitry may connect the platform 800 with positioning circuitry 845. The positioning circuitry 845 includes circuitry to receive and decode signals transmitted/broadcasted by a positioning network of a GNSS. Examples of navigation satellite constellations (or GNSS) include United States' GPS, Russia's GLONASS, the European Union's Galileo system, China's BeiDou Navigation Satellite System, a regional navigation system or GNSS augmentation system (e.g., NAVIC), Japan's QZSS, France's DORIS, etc.), or the like. The positioning circuitry 845 comprises various hardware elements (e.g., including hardware devices such as switches, filters, amplifiers, antenna elements, and the like to facilitate OTA communications) to communicate with components of a positioning network, such as navigation satellite constellation nodes. In some embodiments, the positioning circuitry 845 may include a Micro-PNT IC that uses a master timing clock to perform position tracking/estimation without GNSS assistance. The positioning circuitry 845 may also be part of, or interact with, the baseband circuitry 710 and/or RFEMs 815 to communicate with the nodes and components of the positioning network. The positioning circuitry 845 may also provide position data and/or time data to the application circuitry 805, which may use the data to synchronize operations with various infrastructure (e.g., radio base stations), for turn-by-turn navigation applications, or the like In some implementations, the interface circuitry may connect the platform 800 with Near-Field Communication (NFC) circuitry 840. NFC circuitry 840 is configured to provide contactless, short-range communications based on radio frequency identification (RFID) standards, wherein magnetic field induction is used to enable communication between NFC circuitry 840 and NFC-enabled devices external to the platform 800 (e.g., an "NFC touchpoint"). NFC circuitry 840 comprises an NFC controller coupled with an antenna element and a processor coupled with the NFC controller. The NFC controller may be a chip/IC providing NFC functionalities to the NFC circuitry 840 by executing NFC controller firmware and an NFC stack. The NFC stack may be executed by the processor to control the NFC controller, and the NFC controller firmware may be executed by the NFC controller to control the antenna element to emit short-range RF signals. The RF signals may power a passive NFC tag (e.g., a microchip embedded in a sticker or wristband) to transmit stored data to the NFC circuitry 840, or initiate data transfer between the NFC circuitry 840 and another active NFC device (e.g., a smartphone or an NFC-enabled POS terminal) that is proximate to the platform 800.

The driver circuitry 846 may include software and hardware elements that operate to control particular devices that are embedded in the platform 800, attached to the platform 800, or otherwise communicatively coupled with the platform 800. The driver circuitry 846 may include individual drivers allowing other components of the platform 800 to interact with or control various input/output (I/O) devices that may be present within, or connected to, the platform 800. For example, driver circuitry 846 may include a display driver to control and allow access to a display device, a touchscreen driver to control and allow access to a touchscreen interface of the platform 800, sensor drivers to obtain sensor readings of sensor circuitry 821 and control and allow access to sensor circuitry 821, EMC drivers to obtain actuator positions of the EMCs 822 and/or control and allow access to the EMCs 822, a camera driver to control and allow access to an embedded image capture device, audio drivers to control and allow access to one or more audio devices.

The power management integrated circuitry (PMIC) 825 (also referred to as "power management circuitry 825") may manage power provided to various components of the platform 800. In particular, with respect to the baseband circuitry 810, the PMIC 825 may control power-source selection, voltage scaling, battery charging, or DC-to-DC conversion. The PMIC 825 may often be included when the platform 800 is capable of being powered by a battery 830, for example, when the device is included in a UE 401, 501, 601.

In some embodiments, the PMIC 825 may control, or otherwise be part of, various power saving mechanisms of the platform 800. For example, if the platform 800 is in an RRC_Connected state, where it is still connected to the RAN node as it expects to receive traffic shortly, then it may enter a state known as Discontinuous Reception Mode (DRX) after a period of inactivity. During this state, the platform 800 may power down for brief intervals of time and thus save power. If there is no data traffic activity for an extended period of time, then the platform 800 may transition off to an RRC_Idle state, where it disconnects from the network and does not perform operations such as channel quality feedback, handover, etc. The platform 800 goes into a very low power state and it performs paging where again it periodically wakes up to listen to the network and then powers down again. The platform 800 may not receive data in this state; in order to receive data, it must transition back to RRC_Connected state. An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

A battery 830 may power the platform 800, although in some examples the platform 800 may be mounted deployed in a fixed location, and may have a power supply coupled to an electrical grid. The battery 830 may be a lithium ion battery, a metal-air battery, such as a zinc-air battery, an aluminum-air battery, a lithium-air battery, and the like. In some implementations, such as in V2X applications, the battery 830 may be a typical lead-acid automotive battery.

In some implementations, the battery 830 may be a "smart battery," which includes or is coupled with a Battery Management System (BMS) or battery monitoring integrated circuitry. The BMS may be included in the platform 800 to track the state of charge (SoCh) of the battery 830. The BMS may be used to monitor other parameters of the battery 830 to provide failure predictions, such as the state of health (SoH) and the state of function (SoF) of the battery 830. The BMS may communicate the information of the battery 830 to the application circuitry 805 or other components of the platform 800. The BMS may also include an analog-to-digital (ADC) convertor that allows the application circuitry 805 to directly monitor the voltage of the battery 830 or the current flow from the battery 830. The battery parameters may be used to determine actions that the platform 800 may perform, such as transmission frequency, network operation, sensing frequency, and the like.

A power block, or other power supply coupled to an electrical grid may be coupled with the BMS to charge the battery 830. In some examples, the power block 825 may be replaced with a wireless power receiver to obtain the power wirelessly, for example, through a loop antenna in the computer platform 800. In these examples, a wireless battery charging circuit may be included in the BMS. The specific charging circuits chosen may depend on the size of the battery 830, and thus, the current required. The charging may be performed using the Airfuel standard promulgated by the Airfuel Alliance, the Qi wireless charging standard promulgated by the Wireless Power Consortium, or the Rezence charging standard promulgated by the Alliance for Wireless Power, among others.

User interface circuitry 850 includes various input/output (I/O) devices present within, or connected to, the platform 800, and includes one or more user interfaces designed to enable user interaction with the platform 800 and/or peripheral component interfaces designed to enable peripheral component interaction with the platform 800. The user interface circuitry 850 includes input device circuitry and output device circuitry. Input device circuitry includes any physical or virtual means for accepting an input including, inter alia, one or more physical or virtual buttons (e.g., a reset button), a physical keyboard, keypad, mouse, touchpad, touchscreen, microphones, scanner, headset, and/or the like. The output device circuitry includes any physical or virtual means for showing information or otherwise conveying information, such as sensor readings, actuator position(s), or other like information. Output device circuitry may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Chrystal Displays (LCD), LED displays, quantum dot displays, projectors, etc.), with the output of characters, graphics, multimedia objects, and the like being generated or produced from the operation of the platform 800. The output device circuitry may also include speakers or other audio emitting devices, printer(s), and/or the like. In some embodiments, the sensor circuitry 821 may be used as the input device circuitry (e.g., an image capture device, motion capture device, or the like) and one or more EMCs may be used as the output device circuitry (e.g., an actuator to provide haptic feedback or the like). In another example, NFC circuitry comprising an NFC controller coupled with an antenna element and a processing device may be included to read electronic tags and/or connect with another NFC-enabled device. Peripheral component interfaces may include, but are not limited to, a non-volatile memory port, a USB port, an audio jack, a power supply interface, etc.

Although not shown, the components of platform 800 may communicate with one another using a suitable bus or interconnect (IX) technology, which may include any number of technologies, including ISA, EISA, PCI, PCIx, PCIe, a Time-Trigger Protocol (TTP) system, a FlexRay system, or any number of other technologies. The bus/IX may be a proprietary bus/IX, for example, used in a SoC based system. Other bus/IX systems may be included, such as an I$^2$C interface, an SPI interface, point-to-point interfaces, and a power bus, among others.

Figure 9:
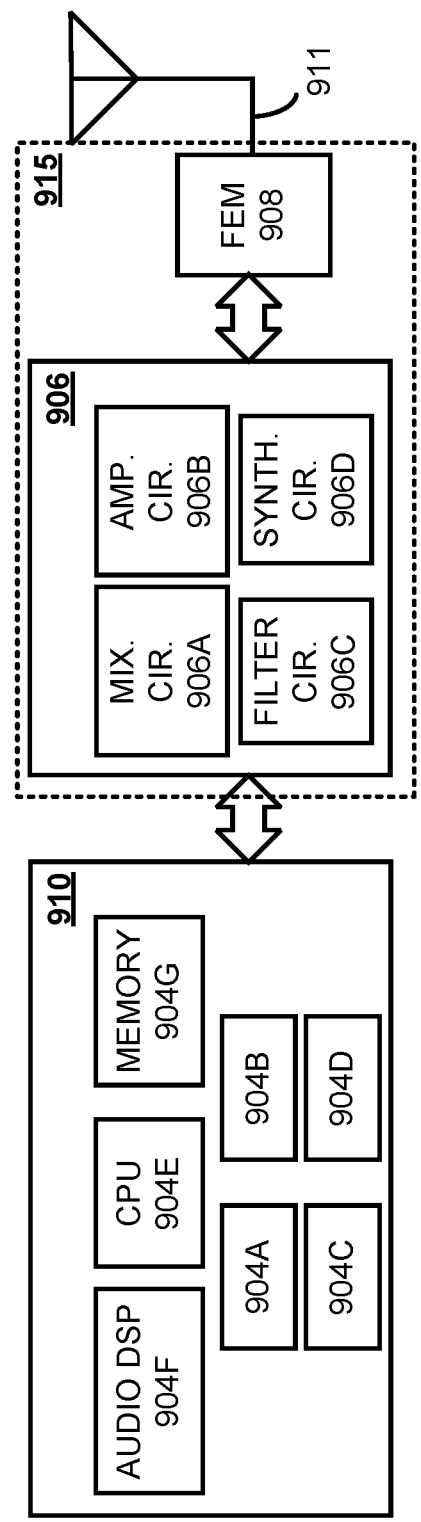
FIG. 9 depicts example components of baseband circuitry and radio frequency circuitry, in accordance with various embodiments.

FIG. 9 illustrates example components of baseband circuitry 910 and radio front end modules (RFEM) 915 in accordance with various embodiments. The baseband circuitry 910 corresponds to the baseband circuitry 710 and 810 of FIGS. 7 and 8, respectively. The RFEM 915 corresponds to the RFEM 715 and 815 of FIGS. 7 and 8, respectively. As shown, the RFEMs 915 may include Radio Frequency (RF) circuitry 906, front-end module (FEM) circuitry 908, antenna array 911 coupled together at least as shown.

The baseband circuitry 910 includes circuitry and/or control logic configured to carry out various radio/network protocol and radio control functions that enable communication with one or more radio networks via the RF circuitry 906. The radio control functions may include, but are not limited to, signal modulation/demodulation, encoding/decoding, radio frequency shifting, etc. In some embodiments, modulation/demodulation circuitry of the baseband circuitry 910 may include Fast-Fourier Transform (FFT), precoding, or constellation mapping/demapping functionality. In some embodiments, encoding/decoding circuitry of the baseband circuitry 910 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments. The baseband circuitry 910 is configured to process baseband signals received from a receive signal path of the RF circuitry 906 and to generate baseband signals for a transmit signal path of the RF circuitry 906. The baseband circuitry 910 is configured to interface with application circuitry 705/805 (see FIGS. 7 and 8) for generation and processing of the baseband signals and for controlling operations of the RF circuitry 906. The baseband circuitry 910 may handle various radio control functions.

The aforementioned circuitry and/or control logic of the baseband circuitry 910 may include one or more single or multi-core processors. For example, the one or more processors may include a 3G baseband processor 904A, a 4G/LTE baseband processor 904B, a 5G/NR baseband processor 904C, or some other baseband processor(s) 904D for other existing generations, generations in development or to be developed in the future (e.g., sixth generation (6G), etc.). In other embodiments, some or all of the functionality of baseband processors 904A-D may be included in modules stored in the memory 904G and executed via a Central Processing Unit (CPU) 904E. In other embodiments, some or all of the functionality of baseband processors 904A-D may be provided as hardware accelerators (e.g., FPGAs, ASICs, etc.) loaded with the appropriate bit streams or logic blocks stored in respective memory cells. In various embodiments, the memory 904G may store program code of a real-time OS (RTOS), which when executed by the CPU 904E (or other baseband processor), is to cause the CPU 904E (or other baseband processor) to manage resources of the baseband circuitry 910, schedule tasks, etc. Examples of the RTOS may include Operating System Embedded (OSE)™ provided by Enea®, Nucleus RTOS™ provided by Mentor Graphics®, Versatile Real-Time Executive (VRTX) provided by Mentor Graphics®, ThreadX™ provided by Express Logic®, FreeRTOS, REX OS provided by Qualcomm®, OKL4 provided by Open Kernel (OK) Labs®, or any other suitable RTOS, such as those discussed herein. In addition, the baseband circuitry 910 includes one or more audio digital signal processor(s) (DSP) 904F. The audio DSP(s) 904F include elements for compression/decompression and echo cancellation and may include other suitable processing elements in other embodiments.

In some embodiments, each of the processors 904A-904E include respective memory interfaces to send/receive data to/from the memory 904G. The baseband circuitry 910 may further include one or more interfaces to communicatively couple to other circuitries/devices, such as an interface to send/receive data to/from memory external to the baseband circuitry 910; an application circuitry interface to send/receive data to/from the application circuitry 705/805 of FIGS. 7-9); an RF circuitry interface to send/receive data to/from RF circuitry 906 of FIG. 9; a wireless hardware connectivity interface to send/receive data to/from one or more wireless hardware elements (e.g., Near Field Communication (NFC) components, Bluetooth®/Bluetooth® Low Energy components, Wi-Fi® components, and/or the like); and a power management interface to send/receive power or control signals to/from the PMIC 825.

In alternate embodiments (which may be combined with the above described embodiments), baseband circuitry 910 comprises one or more digital baseband systems, which are coupled with one another via an interconnect subsystem and to a CPU subsystem, an audio subsystem, and an interface subsystem. The digital baseband subsystems may also be coupled to a digital baseband interface and a mixed-signal baseband subsystem via another interconnect subsystem. Each of the interconnect subsystems may include a bus system, point-to-point connections, network-on-chip (NOC) structures, and/or some other suitable bus or interconnect technology, such as those discussed herein. The audio subsystem may include DSP circuitry, buffer memory, program memory, speech processing accelerator circuitry, data converter circuitry such as analog-to-digital and digital-to-analog converter circuitry, analog circuitry including one or more of amplifiers and filters, and/or other like components. In an aspect of the present disclosure, baseband circuitry 910 may include protocol processing circuitry with one or more instances of control circuitry (not shown) to provide control functions for the digital baseband circuitry and/or radio frequency circuitry (e.g., the radio front end modules 915).

Although not shown by FIG. 9, in some embodiments, the baseband circuitry 910 includes individual processing device(s) to operate one or more wireless communication protocols (e.g., a "multi-protocol baseband processor" or "protocol processing circuitry") and individual processing device(s) to implement PHY layer functions. In these embodiments, the PHY layer functions include the aforementioned radio control functions. In these embodiments, the protocol processing circuitry operates or implements various protocol layers/entities of one or more wireless communication protocols. In a first example, the protocol processing circuitry may operate LTE protocol entities and/or 5G/NR protocol entities when the baseband circuitry 910 and/or RF circuitry 906 are part of mmWave communication circuitry or some other suitable cellular communication circuitry. In the first example, the protocol processing circuitry would operate MAC, RLC, PDCP, SDAP, RRC, and NAS functions. In a second example, the protocol processing circuitry may operate one or more IEEE-based protocols when the baseband circuitry 910 and/or RF circuitry 906 are part of a Wi-Fi communication system. In the second example, the protocol processing circuitry would operate Wi-Fi MAC and logical link control (LLC) functions. The protocol processing circuitry may include one or more memory structures (e.g., 904G) to store program code and data for operating the protocol functions, as well as one or more processing cores to execute the program code and perform various operations using the data. The baseband circuitry 910 may also support radio communications for more than one wireless protocol.

The various hardware elements of the baseband circuitry 910 discussed herein may be implemented, for example, as a solder-down substrate including one or more integrated circuits (ICs), a single packaged IC soldered to a main circuit board or a multi-chip module containing two or more ICs. In one example, the components of the baseband circuitry 910 may be suitably combined in a single chip or chipset, or disposed on a same circuit board. In another example, some or all of the constituent components of the baseband circuitry 910 and RF circuitry 906 may be implemented together such as, for example, a system on a chip (SoC) or System-in-Package (SiP). In another example, some or all of the constituent components of the baseband circuitry 910 may be implemented as a separate SoC that is communicatively coupled with and RF circuitry 906 (or multiple instances of RF circuitry 906). In yet another example, some or all of the constituent components of the baseband circuitry 910 and the application circuitry 705/805 may be implemented together as individual SoCs mounted to a same circuit board (e.g., a "multi-chip package").

In some embodiments, the baseband circuitry 910 may provide for communication compatible with one or more radio technologies. For example, in some embodiments, the baseband circuitry 910 may support communication with an E-UTRAN or other WMAN, a WLAN, a WPAN. Embodiments in which the baseband circuitry 910 is configured to support radio communications of more than one wireless protocol may be referred to as multi-mode baseband circuitry.

RF circuitry 906 may enable communication with wireless networks using modulated electromagnetic radiation through a non-solid medium. In various embodiments, the RF circuitry 906 may include switches, filters, amplifiers, etc. to facilitate the communication with the wireless network. RF circuitry 906 may include a receive signal path, which may include circuitry to down-convert RF signals received from the FEM circuitry 908 and provide baseband signals to the baseband circuitry 910. RF circuitry 906 may also include a transmit signal path, which may include circuitry to up-convert baseband signals provided by the baseband circuitry 910 and provide RF output signals to the FEM circuitry 908 for transmission.

In some embodiments, the receive signal path of the RF circuitry 906 may include mixer circuitry 906a, amplifier circuitry 906b and filter circuitry 906c. In some embodiments, the transmit signal path of the RF circuitry 906 may include filter circuitry 906c and mixer circuitry 906a. RF circuitry 906 may also include synthesizer circuitry 906d for synthesizing a frequency for use by the mixer circuitry 906a of the receive signal path and the transmit signal path. In some embodiments, the mixer circuitry 906a of the receive signal path may be configured to down-convert RF signals received from the FEM circuitry 908 based on the synthesized frequency provided by synthesizer circuitry 906d. The amplifier circuitry 906b may be configured to amplify the down-converted signals and the filter circuitry 906c may be a low-pass filter (LPF) or band-pass filter (BPF) configured to remove unwanted signals from the down-converted signals to generate output baseband signals. Output baseband signals may be provided to the baseband circuitry 910 for further processing. In some embodiments, the output baseband signals may be zero-frequency baseband signals, although this is not a requirement. In some embodiments, mixer circuitry 906a of the receive signal path may comprise passive mixers, although the scope of the embodiments is not limited in this respect.

In some embodiments, the mixer circuitry 906a of the transmit signal path may be configured to up-convert input baseband signals based on the synthesized frequency provided by the synthesizer circuitry 906d to generate RF output signals for the FEM circuitry 908. The baseband signals may be provided by the baseband circuitry 910 and may be filtered by filter circuitry 906c.

In some embodiments, the mixer circuitry 906a of the receive signal path and the mixer circuitry 906a of the transmit signal path may include two or more mixers and may be arranged for quadrature downconversion and upconversion, respectively. In some embodiments, the mixer circuitry 906a of the receive signal path and the mixer circuitry 906a of the transmit signal path may include two or more mixers and may be arranged for image rejection (e.g., Hartley image rejection). In some embodiments, the mixer circuitry 906a of the receive signal path and the mixer circuitry 906a of the transmit signal path may be arranged for direct downconversion and direct upconversion, respectively. In some embodiments, the mixer circuitry 906a of the receive signal path and the mixer circuitry 906a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 906 may include analog-to-digital converter (ADC) and digital-to-analog converter (DAC) circuitry and the baseband circuitry 910 may include a digital baseband interface to communicate with the RF circuitry 906.

In some dual-mode embodiments, a separate radio IC circuitry may be provided for processing signals for each spectrum, although the scope of the embodiments is not limited in this respect.

In some embodiments, the synthesizer circuitry 906d may be a fractional-N synthesizer or a fractional N/N+1 synthesizer, although the scope of the embodiments is not limited in this respect as other types of frequency synthesizers may be suitable. For example, synthesizer circuitry 906d may be a delta-sigma synthesizer, a frequency multiplier, or a synthesizer comprising a phase-locked loop with a frequency divider.

The synthesizer circuitry 906d may be configured to synthesize an output frequency for use by the mixer circuitry 906a of the RF circuitry 906 based on a frequency input and a divider control input. In some embodiments, the synthesizer circuitry 906d may be a fractional N/N+1 synthesizer.

In some embodiments, frequency input may be provided by a voltage controlled oscillator (VCO), although that is not a requirement. Divider control input may be provided by either the baseband circuitry 910 or the application circuitry 705/805 depending on the desired output frequency. In some embodiments, a divider control input (e.g., N) may be determined from a look-up table based on a channel indicated by the application circuitry 705/805.

Synthesizer circuitry 906d of the RF circuitry 906 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 906d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 906 may include an IQ/polar converter.

FEM circuitry 908 may include a receive signal path, which may include circuitry configured to operate on RF signals received from antenna array 911, amplify the received signals and provide the amplified versions of the received signals to the RF circuitry 906 for further processing. FEM circuitry 908 may also include a transmit signal path, which may include circuitry configured to amplify signals for transmission provided by the RF circuitry 906 for transmission by one or more of antenna elements of antenna array 911. In various embodiments, the amplification through the transmit or receive signal paths may be done solely in the RF circuitry 906, solely in the FEM circuitry 908, or in both the RF circuitry 906 and the FEM circuitry 908.

In some embodiments, the FEM circuitry 908 may include a TX/RX switch to switch between transmit mode and receive mode operation. The FEM circuitry 908 may include a receive signal path and a transmit signal path. The receive signal path of the FEM circuitry 908 may include an LNA to amplify received RF signals and provide the amplified received RF signals as an output (e.g., to the RF circuitry 906). The transmit signal path of the FEM circuitry 908 may include a power amplifier (PA) to amplify input RF signals (e.g., provided by RF circuitry 906), and one or more filters to generate RF signals for subsequent transmission by one or more antenna elements of the antenna array 911.

The antenna array 911 comprises one or more antenna elements, each of which is configured convert electrical signals into radio waves to travel through the air and to convert received radio waves into electrical signals. For example, digital baseband signals provided by the baseband circuitry 910 is converted into analog RF signals (e.g., modulated waveform) that will be amplified and transmitted via the antenna elements of the antenna array 911 including one or more antenna elements (not shown). The antenna elements may be omnidirectional, direction, or a combination thereof. The antenna elements may be formed in a multitude of arranges as are known and/or discussed herein. The antenna array 911 may comprise microstrip antennas or printed antennas that are fabricated on the surface of one or more printed circuit boards. The antenna array 911 may be formed in as a patch of metal foil (e.g., a patch antenna) in a variety of shapes, and may be coupled with the RF circuitry 906 and/or FEM circuitry 908 using metal transmission lines or the like.

Processors of the application circuitry 705/805 and processors of the baseband circuitry 910 may be used to execute elements of one or more instances of a protocol stack. For example, processors of the baseband circuitry 910, alone or in combination, may be used execute Layer 3, Layer 2, or Layer 1 functionality, while processors of the application circuitry 705/805 may utilize data (e.g., packet data) received from these layers and further execute Layer 4 functionality (e.g., TCP and UDP layers). As referred to herein, Layer 3 may comprise a RRC layer, described in further detail below. As referred to herein, Layer 2 may comprise a MAC layer, an RLC layer, and a PDCP layer, described in further detail below. As referred to herein, Layer 1 may comprise a PHY layer of a UE/RAN node, described in further detail below.

Figure 10:
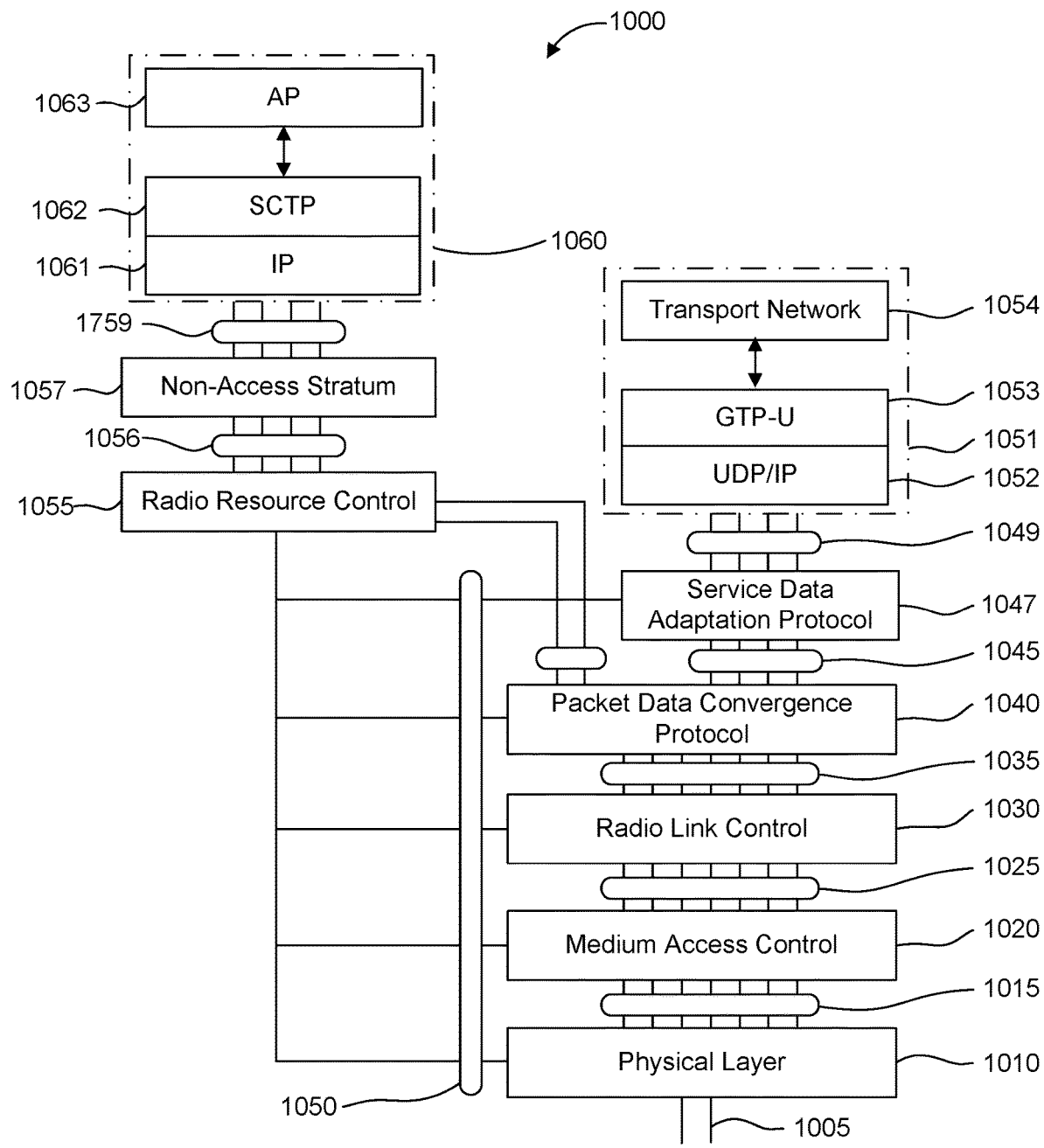
FIG. 10 is an illustration of various protocol functions that may be used for various protocol stacks, in accordance with various embodiments.

FIG. 10 illustrates various protocol functions that may be implemented in a wireless communication device according to various embodiments. In particular, FIG. 10 includes an arrangement 1000 showing interconnections between various protocol layers/entities. The following description of FIG. 10 is provided for various protocol layers/entities that operate in conjunction with the 5G/NR system standards and LTE system standards, but some or all of the aspects of FIG. 10 may be applicable to other wireless communication network systems as well.

The protocol layers of arrangement 1000 may include one or more of PHY 1010, MAC 1020, RLC 1030, PDCP 1040, SDAP 1047, RRC 1055, and NAS layer 1057, in addition to other higher layer functions not illustrated. The protocol layers may include one or more service access points (e.g., items 1059, 1056, 1050, 1049, 1045, 1035, 1025, and 1015 in FIG. 10) that may provide communication between two or more protocol layers.

The PHY 1010 may transmit and receive physical layer signals 1005 that may be received from or transmitted to one or more other communication devices. The physical layer signals 1005 may comprise one or more physical channels, such as those discussed herein. The PHY 1010 may further perform link adaptation or adaptive modulation and coding (AMC), power control, cell search (e.g., for initial synchronization and handover purposes), and other measurements used by higher layers, such as the RRC 1055. The PHY 1010 may still further perform error detection on the transport channels, forward error correction (FEC) coding/decoding of the transport channels, modulation/demodulation of physical channels, interleaving, rate matching, mapping onto physical channels, and MIMO antenna processing. In embodiments, an instance of PHY 1010 may process requests from and provide indications to an instance of MAC 1020 via one or more PHY-SAP 1015. According to some embodiments, requests and indications communicated via PHY-SAP 1015 may comprise one or more transport channels.

Instance(s) of MAC 1020 may process requests from, and provide indications to, an instance of RLC 1030 via one or more MAC-SAPs 1025. These requests and indications communicated via the MAC-SAP 1025 may comprise one or more logical channels. The MAC 1020 may perform mapping between the logical channels and transport channels, multiplexing of MAC SDUs from one or more logical channels onto TBs to be delivered to PHY 1010 via the transport channels, de-multiplexing MAC SDUs to one or more logical channels from TBs delivered from the PHY 1010 via transport channels, multiplexing MAC SDUs onto TBs, scheduling information reporting, error correction through HARQ, and logical channel prioritization.

Instance(s) of RLC 1030 may process requests from and provide indications to an instance of PDCP 1040 via one or more radio link control service access points (RLC-SAP) 1035. These requests and indications communicated via RLC-SAP 1035 may comprise one or more RLC channels. The RLC 1030 may operate in a plurality of modes of operation, including: Transparent Mode (TM), Unacknowledged Mode (UM), and Acknowledged Mode (AM). The RLC 1030 may execute transfer of upper layer protocol data units (PDUs), error correction through automatic repeat request (ARQ) for AM data transfers, and concatenation, segmentation and reassembly of RLC SDUs for UM and AM data transfers. The RLC 1030 may also execute re-segmentation of RLC data PDUs for AM data transfers, reorder RLC data PDUs for UM and AM data transfers, detect duplicate data for UM and AM data transfers, discard RLC SDUs for UM and AM data transfers, detect protocol errors for AM data transfers, and perform RLC re-establishment.

Instance(s) of PDCP 1040 may process requests from and provide indications to instance(s) of RRC 1055 and/or instance(s) of SDAP 1047 via one or more packet data convergence protocol service access points (PDCP-SAP) 1045. These requests and indications communicated via PDCP-SAP 1045 may comprise one or more radio bearers. The PDCP 1040 may execute header compression and decompression of IP data, maintain PDCP Sequence Numbers (SNs), perform in-sequence delivery of upper layer PDUs at re-establishment of lower layers, eliminate duplicates of lower layer SDUs at re-establishment of lower layers for radio bearers mapped on RLC AM, cipher and decipher control plane data, perform integrity protection and integrity verification of control plane data, control timer-based discard of data, and perform security operations (e.g., ciphering, deciphering, integrity protection, integrity verification, etc.).

Instance(s) of SDAP 1047 may process requests from and provide indications to one or more higher layer protocol entities via one or more SDAP-SAP 1049. These requests and indications communicated via SDAP-SAP 1049 may comprise one or more QoS flows. The SDAP 1047 may map QoS flows to DRBs, and vice versa, and may also mark QFIs in DL and UL packets. A single SDAP entity 1047 may be configured for an individual PDU session. In the UL direction, the NG-RAN 410 may control the mapping of QoS Flows to DRB(s) in two different ways, reflective mapping or explicit mapping. For reflective mapping, the SDAP 1047 of a UE 401 may monitor the QFIs of the DL packets for each DRB, and may apply the same mapping for packets flowing in the UL direction. For a DRB, the SDAP 1047 of the UE 401 may map the UL packets belonging to the QoS flows(s) corresponding to the QoS flow ID(s) and PDU session observed in the DL packets for that DRB. To enable reflective mapping, the NG-RAN 610 may mark DL packets over the Uu interface with a QoS flow ID. The explicit mapping may involve the RRC 1055 configuring the SDAP 1047 with an explicit QoS flow to DRB mapping rule, which may be stored and followed by the SDAP 1047. In embodiments, the SDAP 1047 may only be used in NR implementations and may not be used in LTE implementations.

The RRC 1055 may configure, via one or more management service access points (M-SAP), aspects of one or more protocol layers, which may include one or more instances of PHY 1010, MAC 1020, RLC 1030, PDCP 1040 and SDAP 1047. In embodiments, an instance of RRC 1055 may process requests from and provide indications to one or more NAS entities 1057 via one or more RRC-SAPs 1056. The main services and functions of the RRC 1055 may include broadcast of system information (e.g., included in MIBs or SIBs related to the NAS), broadcast of system information related to the access stratum (AS), paging, establishment, maintenance and release of an RRC connection between the UE 401 and RAN 410 (e.g., RRC connection paging, RRC connection establishment, RRC connection modification, and RRC connection release), establishment, configuration, maintenance and release of point to point Radio Bearers, security functions including key management, inter-RAT mobility, and measurement configuration for UE measurement reporting. The MIBs and SIBs may comprise one or more IEs, which may each comprise individual data fields or data structures.

The NAS 1057 may form the highest stratum of the control plane between the UE 401 and the AMF 621. The NAS 1057 may support the mobility of the UEs 401 and the session management procedures to establish and maintain IP connectivity between the UE 401 and a P-GW in LTE systems.

According to various embodiments, one or more protocol entities of arrangement 1000 may be implemented in UEs 401, RAN nodes 411, AMF 621 in NR implementations or MME 521 in LTE implementations, UPF 602 in NR implementations or S-GW 522 and P-GW 523 in LTE implementations, or the like to be used for control plane or user plane communications protocol stack between the aforementioned devices. In such embodiments, one or more protocol entities that may be implemented in one or more of UE 401, gNB 411, AMF 621, etc. may communicate with a respective peer protocol entity that may be implemented in or on another device using the services of respective lower layer protocol entities to perform such communication. In some embodiments, a gNB-CU of the gNB 411 may host the RRC 1055, SDAP 1047, and PDCP 1040 of the gNB that controls the operation of one or more gNB-DUs, and the gNB-DUs of the gNB 411 may each host the RLC 1030, MAC 1020, and PHY 1010 of the gNB 411.

In a first example, a control plane protocol stack may comprise, in order from highest layer to lowest layer, NAS 1057, RRC 1055, PDCP 1040, RLC 1030, MAC 1020, and PHY 1010. In this example, upper layers 1060 may be built on top of the NAS 1057, which includes an IP layer 1061, an SCTP 1062, and an application layer signaling protocol (AP) 1063.

In NR implementations, the AP 1063 may be an NG application protocol layer (NGAP or NG-AP) 1063 for the NG interface 413 defined between the NG-RAN node 411 and the AMF 621, or the AP 1063 may be an Xn application protocol layer (XnAP or Xn-AP) 1063 for the Xn interface 412 that is defined between two or more RAN nodes 411.

The NG-AP 1063 may support the functions of the NG interface 413 and may comprise Elementary Procedures (EPs). An NG-AP EP may be a unit of interaction between the NG-RAN node 411 and the AMF 621. The NG-AP 1063 services may comprise two groups: UE-associated services (e.g., services related to a UE 401) and non-UE-associated services (e.g., services related to the whole NG interface instance between the NG-RAN node 411 and AMF 621). These services may include functions including, but not limited to: a paging function for the sending of paging requests to NG-RAN nodes 411 involved in a particular paging area; a UE context management function for allowing the AMF 621 to establish, modify, and/or release a UE context in the AMF 621 and the NG-RAN node 411; a mobility function for UEs 401 in ECM-CONNECTED mode for intra-system HOs to support mobility within NG-RAN and inter-system HOs to support mobility from/to EPS systems; a NAS Signaling Transport function for transporting or rerouting NAS messages between UE 401 and AMF 621; a NAS node selection function for determining an association between the AMF 621 and the UE 401; NG interface management function(s) for setting up the NG interface and monitoring for errors over the NG interface; a warning message transmission function for providing means to transfer warning messages via NG interface or cancel ongoing broadcast of warning messages; a Configuration Transfer function for requesting and transferring of RAN configuration information (e.g., SON information, performance measurement (PM) data, etc.) between two RAN nodes 411 via CN 420; and/or other like functions.

The XnAP 1063 may support the functions of the Xn interface 412 and may comprise XnAP basic mobility procedures and XnAP global procedures. The XnAP basic mobility procedures may comprise procedures used to handle UE mobility within the NG RAN 411 (or E-UTRAN 510), such as handover preparation and cancellation procedures, SN Status Transfer procedures, UE context retrieval and UE context release procedures, RAN paging procedures, dual connectivity related procedures, and the like. The XnAP global procedures may comprise procedures that are not related to a specific UE 401, such as Xn interface setup and reset procedures, NG-RAN update procedures, cell activation procedures, and the like.

In LTE implementations, the AP 1063 may be an S1 Application Protocol layer (S1-AP) 1063 for the S1 interface 413 defined between an E-UTRAN node 411 and an MME, or the AP 1063 may be an X2 application protocol layer (X2AP or X2-AP) 1063 for the X2 interface 412 that is defined between two or more E-UTRAN nodes 411.

The S1 Application Protocol layer (S1-AP) 1063 may support the functions of the S1 interface, and similar to the NG-AP discussed previously, the S1-AP may comprise S1-AP EPs. An S1-AP EP may be a unit of interaction between the E-UTRAN node 411 and an MME 521 within an LTE CN 420. The S1-AP 1063 services may comprise two groups: UE-associated services and non UE-associated services. These services perform functions including, but not limited to: E-UTRAN Radio Access Bearer (E-RAB) management, UE capability indication, mobility, NAS signaling transport, RAN Information Management (RIM), and configuration transfer.

The X2AP 1063 may support the functions of the X2 interface 412 and may comprise X2AP basic mobility procedures and X2AP global procedures. The X2AP basic mobility procedures may comprise procedures used to handle UE mobility within the E-UTRAN 420, such as handover preparation and cancellation procedures, SN Status Transfer procedures, UE context retrieval and UE context release procedures, RAN paging procedures, dual connectivity related procedures, and the like. The X2AP global procedures may comprise procedures that are not related to a specific UE 401, such as X2 interface setup and reset procedures, load indication procedures, error indication procedures, cell activation procedures, and the like.

The SCTP layer (alternatively referred to as the SCTP/IP layer) 1062 may provide guaranteed delivery of application layer messages (e.g., NGAP or XnAP messages in NR implementations, or S1-AP or X2AP messages in LTE implementations). The SCTP 1062 may ensure reliable delivery of signaling messages between the RAN node 411 and the AMF 621/MME 521 based, in part, on the IP protocol, supported by the IP 1061. The Internet Protocol layer (IP) 1061 may be used to perform packet addressing and routing functionality. In some implementations the IP layer 1061 may use point-to-point transmission to deliver and convey PDUs. In this regard, the RAN node 411 may comprise L2 and L1 layer communication links (e.g., wired or wireless) with the MME/AMF to exchange information.

In a second example, a user plane protocol stack may comprise, in order from highest layer to lowest layer, SDAP 1047, PDCP 1040, RLC 1030, MAC 1020, and PHY 1010. The user plane protocol stack may be used for communication between the UE 401, the RAN node 411, and UPF 602 in NR implementations or an S-GW 522 and P-GW 523 in LTE implementations. In this example, upper layers 1051 may be built on top of the SDAP 1047, and may include a user datagram protocol (UDP) and IP security layer (UDP/IP) 1052, a General Packet Radio Service (GPRS) Tunneling Protocol for the user plane layer (GTP-U) 1053, and a User Plane PDU layer (UP PDU) 1063.

The transport network layer 1054 (also referred to as a "transport layer") may be built on IP transport, and the GTP-U 1053 may be used on top of the UDP/IP layer 1052 (comprising a UDP layer and IP layer) to carry user plane PDUs (UP-PDUs). The IP layer (also referred to as the "Internet layer") may be used to perform packet addressing and routing functionality. The IP layer may assign IP addresses to user data packets in any of IPv4, IPv6, or PPP formats, for example.

The GTP-U 1053 may be used for carrying user data within the GPRS core network and between the radio access network and the core network. The user data transported can be packets in any of IPv4, IPv6, or PPP formats, for example. The UDP/IP 1052 may provide checksums for data integrity, port numbers for addressing different functions at the source and destination, and encryption and authentication on the selected data flows. The RAN node 411 and the S-GW 522 may utilize an S1-U interface to exchange user plane data via a protocol stack comprising an L1 layer (e.g., PHY 1010), an L2 layer (e.g., MAC 1020, RLC 1030, PDCP 1040, and/or SDAP 1047), the UDP/IP layer 1052, and the GTP-U 1053. The S-GW 522 and the P-GW 523 may utilize an S5/S8a interface to exchange user plane data via a protocol stack comprising an L1 layer, an L2 layer, the UDP/IP layer 1052, and the GTP-U 1053. As discussed previously, NAS protocols may support the mobility of the UE 401 and the session management procedures to establish and maintain IP connectivity between the UE 401 and the P-GW 523.

Moreover, although not shown by FIG. 10, an application layer may be present above the AP 1063 and/or the transport network layer 1054. The application layer may be a layer in which a user of the UE 401, RAN node 411, or other network element interacts with software applications being executed, for example, by application circuitry 705 or application circuitry 805, respectively. The application layer may also provide one or more interfaces for software applications to interact with communications systems of the UE 401 or RAN node 411, such as the baseband circuitry 910. In some implementations the IP layer and/or the application layer may provide the same or similar functionality as layers 5-7, or portions thereof, of the Open Systems Interconnection (OSI) model (e.g., OSI Layer 7—the application layer, OSI Layer 6—the presentation layer, and OSI Layer 5—the session layer).

Figure 11:
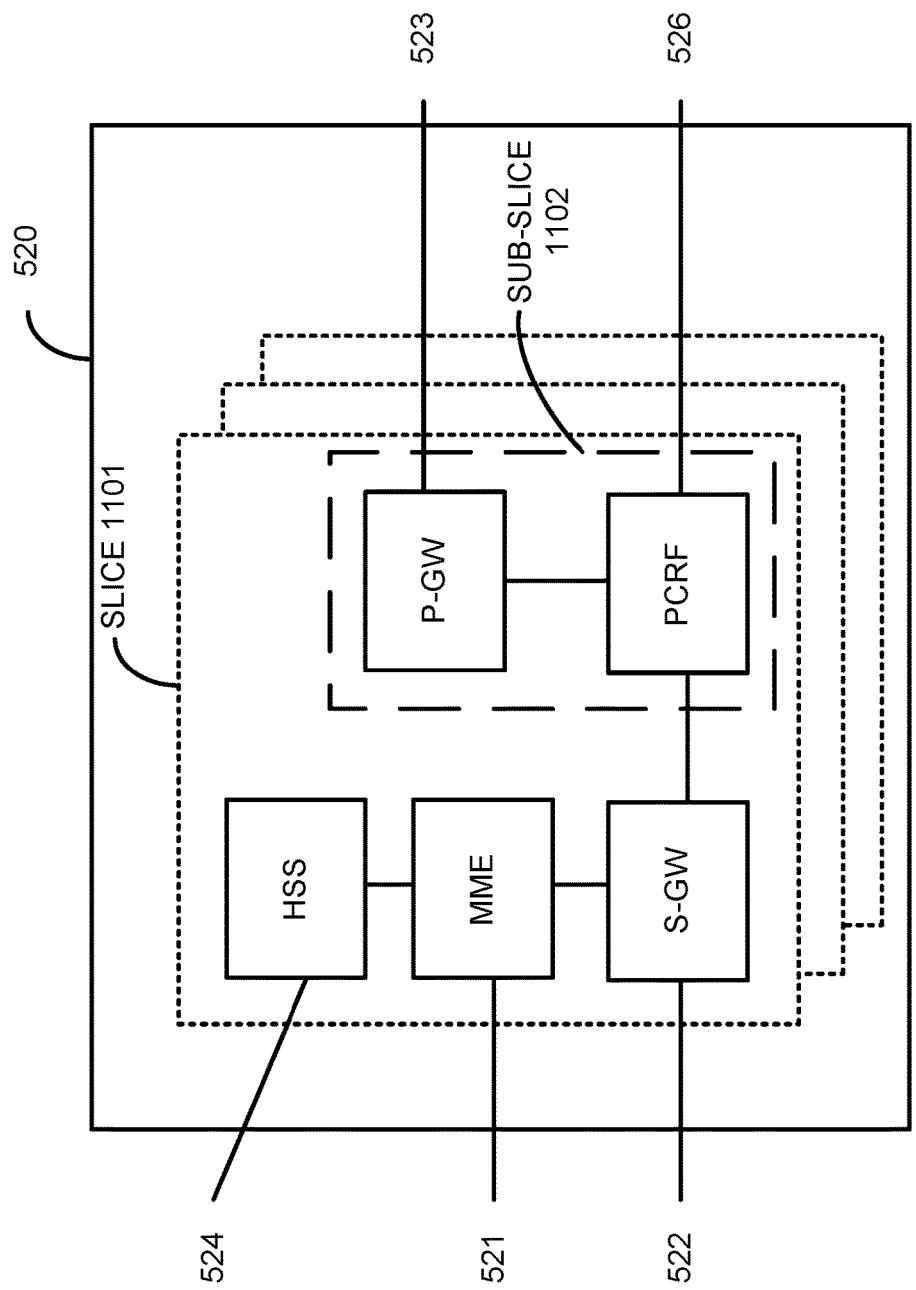
FIG. 11 illustrates components of a core network, in accordance with various embodiments.

FIG. 11 illustrates components of a core network in accordance with various embodiments. The components of the CN 520 may be implemented in one physical node or separate physical nodes including components to read and execute instructions from a machine-readable or computer-readable medium (e.g., a non-transitory machine-readable storage medium). In embodiments, the components of CN 620 may be implemented in a same or similar manner as discussed herein with regard to the components of CN 520. In some embodiments, NFV is utilized to virtualize any or all of the above-described network node functions via executable instructions stored in one or more computer-readable storage mediums (described in further detail below). A logical instantiation of the CN 520 may be referred to as a network slice 1101, and individual logical instantiations of the CN 520 may provide specific network capabilities and network characteristics. A logical instantiation of a portion of the CN 520 may be referred to as a network sub-slice 1102 (e.g., the network sub-slice 1102 is shown to include the P-GW 523 and the PCRF 526).

As used herein, the terms "instantiate," "instantiation," and the like may refer to the creation of an instance, and an "instance" may refer to a concrete occurrence of an object, which may occur, for example, during execution of program code. A network instance may refer to information identifying a domain, which may be used for traffic detection and routing in case of different IP domains or overlapping IP addresses. A network slice instance may refer to a set of network functions (NFs) instances and the resources (e.g., compute, storage, and networking resources) required to deploy the network slice.

With respect to 5G systems (see, e.g., FIG. 6), a network slice always comprises a RAN part and a CN part. The support of network slicing relies on the principle that traffic for different slices is handled by different PDU sessions. The network can realize the different network slices by scheduling and also by providing different L1/L2 configurations. The UE 601 provides assistance information for network slice selection in an appropriate RRC message, if it has been provided by NAS. While the network can support large number of slices, the UE need not support more than 8 slices simultaneously.

A network slice may include the CN 620 control plane and user plane NFs, NG-RANs 610 in a serving PLMN, and a N3IWF functions in the serving PLMN. Individual network slices may have different S-NSSAI and/or may have different SSTs. NSSAI includes one or more S-NSSAIs, and each network slice is uniquely identified by an S-NSSAI. Network slices may differ for supported features and network functions optimizations, and/or multiple network slice instances may deliver the same service/features but for different groups of UEs 601 (e.g., enterprise users). For example, individual network slices may deliver different committed service(s) and/or may be dedicated to a particular customer or enterprise. In this example, each network slice may have different S-NSSAIs with the same SST but with different slice differentiators. Additionally, a single UE may be served with one or more network slice instances simultaneously via a 5G AN and associated with eight different S-NSSAIs. Moreover, an AMF 621 instance serving an individual UE 601 may belong to each of the network slice instances serving that UE.

Network Slicing in the NG-RAN 610 involves RAN slice awareness. RAN slice awareness includes differentiated handling of traffic for different network slices, which have been pre-configured. Slice awareness in the NG-RAN 610 is introduced at the PDU session level by indicating the S-NSSAI corresponding to a PDU session in all signaling that includes PDU session resource information. How the NG-RAN 610 supports the slice enabling in terms of NG-RAN functions (e.g., the set of network functions that comprise each slice) is implementation dependent. The NG-RAN 610 selects the RAN part of the network slice using assistance information provided by the UE 601 or the 5GC 620, which unambiguously identifies one or more of the pre-configured network slices in the PLMN. The NG-RAN 610 also supports resource management and policy enforcement between slices as per SLAs. A single NG-RAN node may support multiple slices, and the NG-RAN 610 may also apply an appropriate RRM policy for the SLA in place to each supported slice. The NG-RAN 610 may also support QoS differentiation within a slice.

The NG-RAN 610 may also use the UE assistance information for the selection of an AMF 621 during an initial attach, if available. The NG-RAN 610 uses the assistance information for routing the initial NAS to an AMF 621. If the NG-RAN 610 is unable to select an AMF 621 using the assistance information, or the UE 601 does not provide any such information, the NG-RAN 610 sends the NAS signaling to a default AMF 621, which may be among a pool of AMFs 621. For subsequent accesses, the UE 601 provides a temp ID, which is assigned to the UE 601 by the 5GC 620, to enable the NG-RAN 610 to route the NAS message to the appropriate AMF 621 as long as the temp ID is valid. The NG-RAN 610 is aware of, and can reach, the AMF 621 that is associated with the temp ID. Otherwise, the method for initial attach applies.

The NG-RAN 610 supports resource isolation between slices. NG-RAN 610 resource isolation may be achieved by means of RRM policies and protection mechanisms that should avoid that shortage of shared resources if one slice breaks the service level agreement for another slice. In some implementations, it is possible to fully dedicate NG-RAN 610 resources to a certain slice. How NG-RAN 610 supports resource isolation is implementation dependent.

Some slices may be available only in part of the network. Awareness in the NG-RAN 610 of the slices supported in the cells of its neighbors may be beneficial for inter-frequency mobility in connected mode. The slice availability may not change within the UE's registration area. The NG-RAN 610 and the 5GC 620 are responsible to handle a service request for a slice that may or may not be available in a given area. Admission or rejection of access to a slice may depend on factors such as support for the slice, availability of resources, support of the requested service by NG-RAN 610.

The UE 601 may be associated with multiple network slices simultaneously. In case the UE 601 is associated with multiple slices simultaneously, only one signaling connection is maintained, and for intra-frequency cell reselection, the UE 601 tries to camp on the best cell. For inter-frequency cell reselection, dedicated priorities can be used to control the frequency on which the UE 601 camps. The 5GC 620 is to validate that the UE 601 has the rights to access a network slice. Prior to receiving an Initial Context Setup Request message, the NG-RAN 610 may be allowed to apply some provisional/local policies, based on awareness of a particular slice that the UE 601 is requesting to access. During the initial context setup, the NG-RAN 610 is informed of the slice for which resources are being requested.

NFV architectures and infrastructures may be used to virtualize one or more NFs, alternatively performed by proprietary hardware, onto physical resources comprising a combination of industry-standard server hardware, storage hardware, or switches. In other words, NFV systems can be used to execute virtual or reconfigurable implementations of one or more EPC components/functions.

Figure 12:
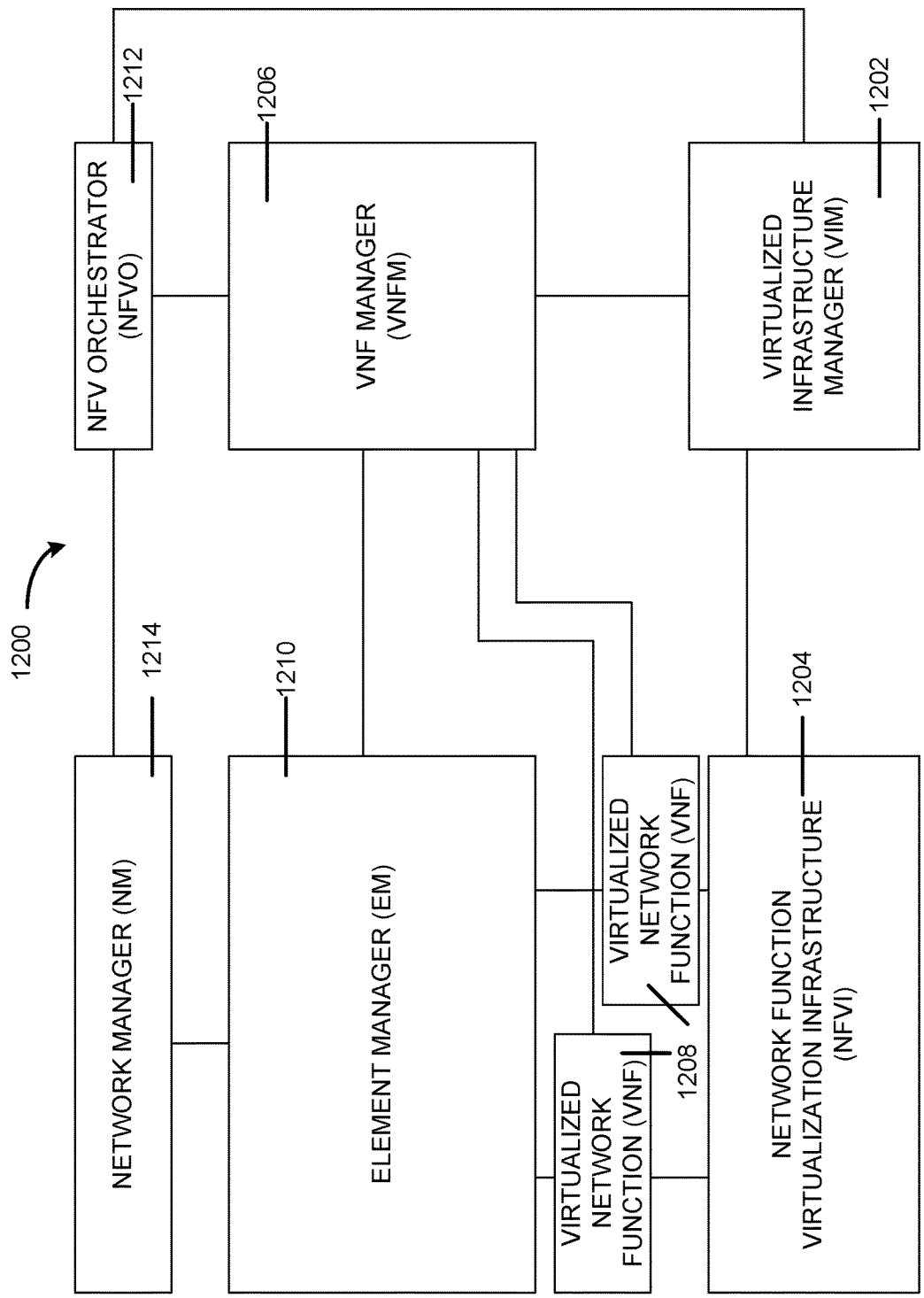
FIG. 12 is a block diagram illustrating components of a system to support NFV, in accordance with various embodiments.

FIG. 12 is a block diagram illustrating components, according to some example embodiments, of a system 1200 to support NFV. The system 1200 is illustrated as including a VIM 1202, an NFVI 1204, an VNFM 1206, VNFs 1208, an EM 1210, an NFVO 1212, and a NM 1214.

The VIM 1202 manages the resources of the NFVI 1204. The NFVI 1204 can include physical or virtual resources and applications (including hypervisors) used to execute the system 1200. The VIM 1202 may manage the life cycle of virtual resources with the NFVI 1204 (e.g., creation, maintenance, and tear down of VMs associated with one or more physical resources), track VM instances, track performance, fault and security of VM instances and associated physical resources, and expose VM instances and associated physical resources to other management systems.

The VNFM 1206 may manage the VNFs 1208. The VNFs 1208 may be used to execute EPC components/functions. The VNFM 1206 may manage the life cycle of the VNFs 1208 and track performance, fault and security of the virtual aspects of VNFs 1208. The EM 1210 may track the performance, fault and security of the functional aspects of VNFs 1208. The tracking data from the VNFM 1206 and the EM 1210 may comprise, for example, PM data used by the VIM 1202 or the NFVI 1204. Both the VNFM 1206 and the EM 1210 can scale up/down the quantity of VNFs of the system 1200.

The NFVO 1212 may coordinate, authorize, release and engage resources of the NFVI 1204 in order to provide the requested service (e.g., to execute an EPC function, component, or slice). The NM 1214 may provide a package of end-user functions with the responsibility for the management of a network, which may include network elements with VNFs, non-virtualized network functions, or both (management of the VNFs may occur via the EM 1210).

Figure 13:
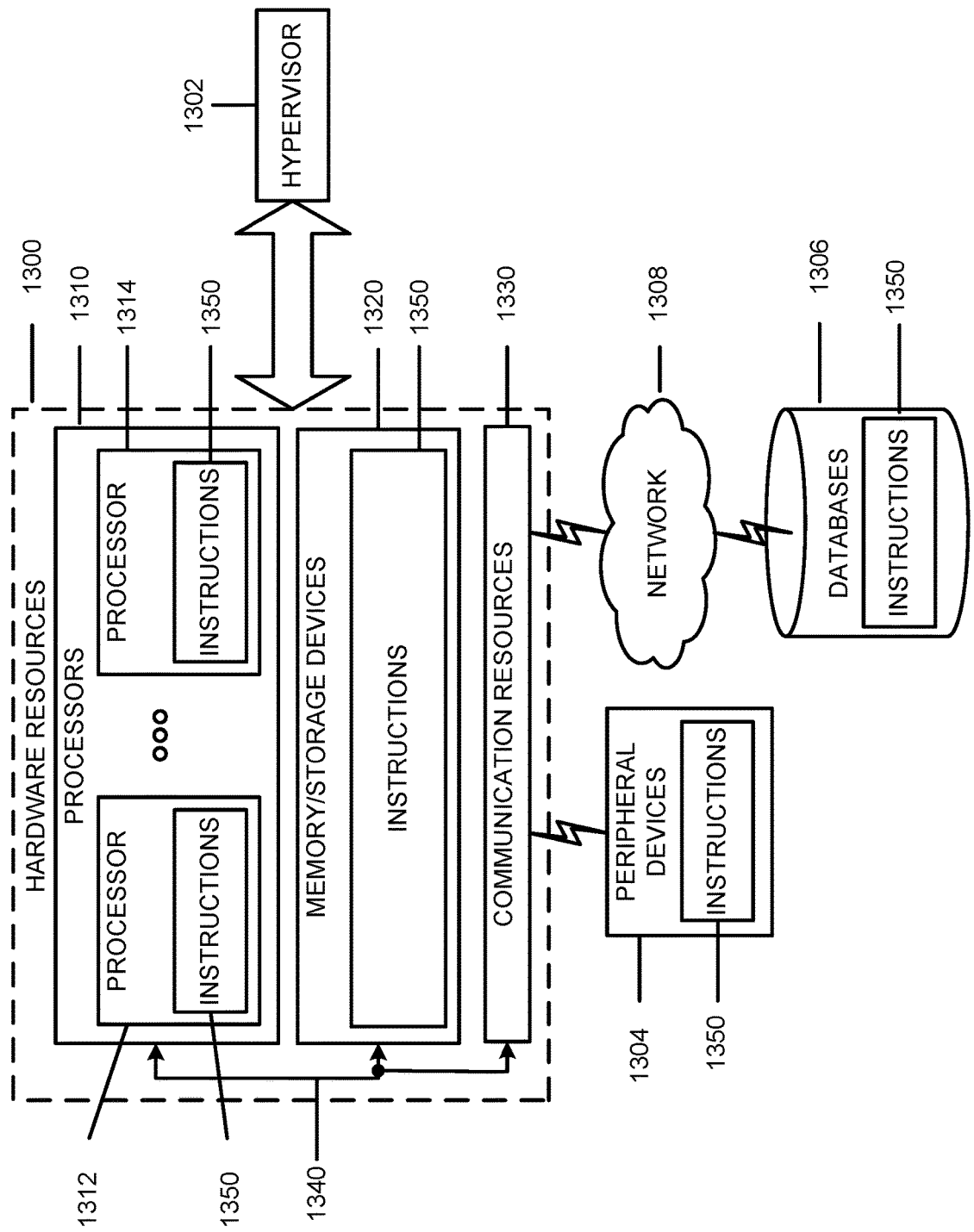
FIG. 13 depicts a block diagram illustrating components, according to some example embodiments, able to read instructions from a machine-readable or computer-readable medium (e.g., a non-transitory machine-readable storage medium) and perform any one or more of the methodologies discussed herein.
Figure 14:
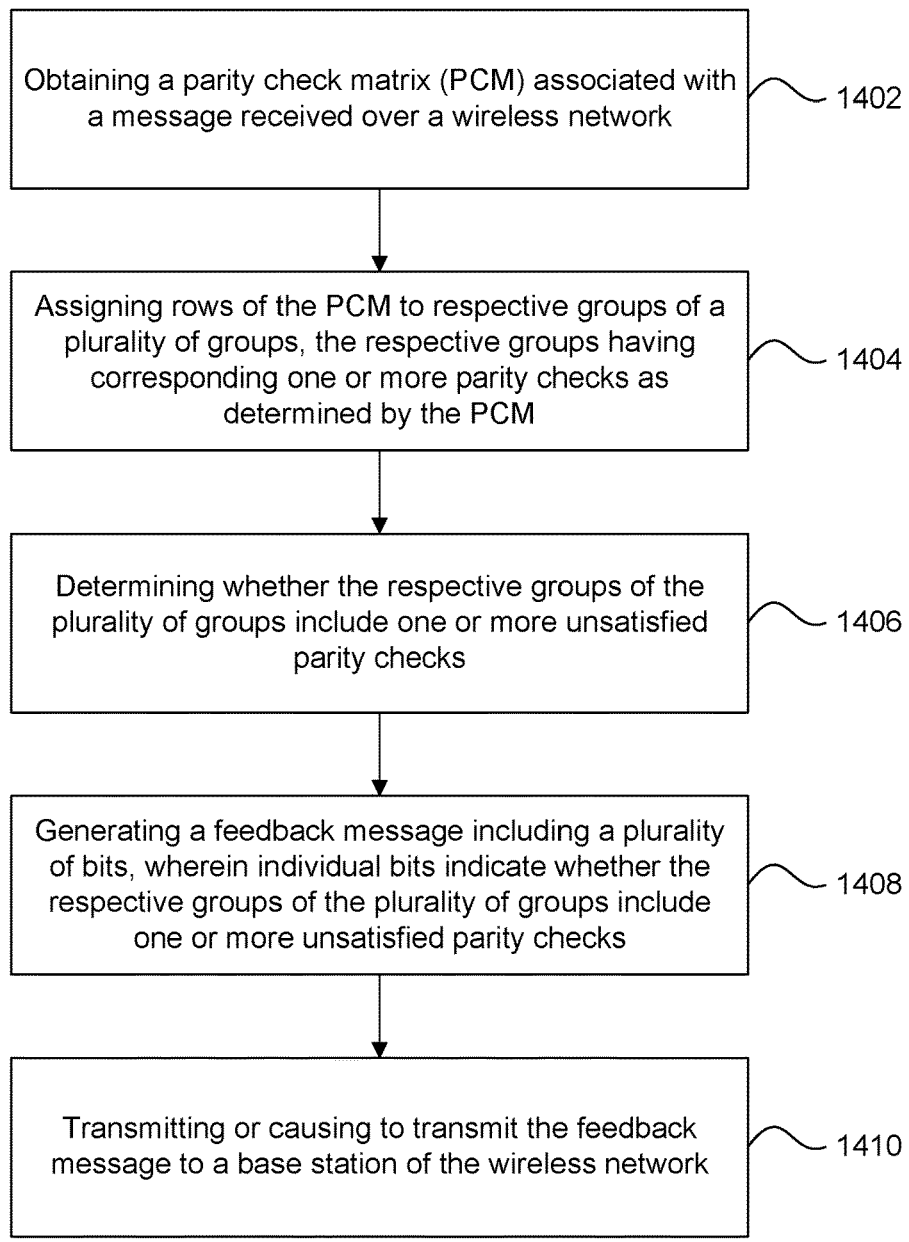
FIG. 14 depicts an example flowchart for a UE performing HARQ feedback, in accordance with various embodiments.

FIG. 13 is a block diagram illustrating components, according to some example embodiments, able to read instructions from a machine-readable or computer-readable medium (e.g., a non-transitory machine-readable storage medium) and perform any one or more of the methodologies discussed herein. Specifically, FIG. 13 shows a diagrammatic representation of hardware resources 1300 including one or more processors (or processor cores) 1310, one or more memory/storage devices 1320, and one or more communication resources 1330, each of which may be communicatively coupled via a bus 1340. For embodiments where node virtualization (e.g., NFV) is utilized, a hypervisor 1302 may be executed to provide an execution environment for one or more network slices/sub-slices to utilize the hardware resources 1300.

The processors 1310 may include, for example, a processor 1312 and a processor 1314. The processor(s) 1310 may be, for example, a central processing unit (CPU), a reduced instruction set computing (RISC) processor, a complex instruction set computing (CISC) processor, a graphics processing unit (GPU), a DSP such as a baseband processor, an ASIC, an FPGA, a radio-frequency integrated circuit (RFIC), another processor (including those discussed herein), or any suitable combination thereof.

The memory/storage devices 1320 may include main memory, disk storage, or any suitable combination thereof. The memory/storage devices 1320 may include, but are not limited to, any type of volatile or nonvolatile memory such as dynamic random access memory (DRAM), static random access memory (SRAM), erasable programmable read-only memory (EPROM), electrically erasable programmable read-only memory (EEPROM), Flash memory, solid-state storage, etc.

The communication resources 1330 may include interconnection or network interface components or other suitable devices to communicate with one or more peripheral devices 1304 or one or more databases 1306 via a network 1308. For example, the communication resources 1330 may include wired communication components (e.g., for coupling via USB), cellular communication components, NFC components, Bluetooth® (or Bluetooth® Low Energy) components, Wi-Fi® components, and other communication components.

Instructions 1350 may comprise software, a program, an application, an applet, an app, or other executable code for causing at least any of the processors 1310 to perform any one or more of the methodologies discussed herein. The instructions 1350 may reside, completely or partially, within at least one of the processors 1310 (e.g., within the processor's cache memory), the memory/storage devices 1320, or any suitable combination thereof. Furthermore, any portion of the instructions 1350 may be transferred to the hardware resources 1300 from any combination of the peripheral devices 1304 or the databases 1306. Accordingly, the memory of processors 1310, the memory/storage devices 1320, the peripheral devices 1304, and the databases 1306 are examples of computer-readable and machine-readable media.

For one or more embodiments, at least one of the components set forth in one or more of the preceding figures may be configured to perform one or more operations, techniques, processes, and/or methods as set forth in the example section below. For example, the baseband circuitry as described above in connection with one or more of the preceding figures may be configured to operate in accordance with one or more of the examples set forth below. For another example, circuitry associated with a UE, base station, network element, etc. as described above in connection with one or more of the preceding figures may be configured to operate in accordance with one or more of the examples set forth below in the example section.

EXAMPLES

Example 1 may include a method comprising:
obtaining a parity check matrix (PCM) associated with a received message;
assigning rows of the PCM to respective groups of a plurality of groups;
generating a feedback message with a plurality of bits, wherein individual bits indicate whether respective individual groups of the plurality of groups include one or more unsatisfied parity checks; and
transmitting or causing to transmit the feedback message.

Example 2 may include the method of example 1 or another example herein, further comprising receiving a retransmission of bits associated with the individual groups that were indicated to include one or more unsatisfied parity checks.

Example 3 may include the method of example 2 or another example herein, wherein the retransmission includes information sub-blocks (SBs) alternating with parity SBs.

Example 4 may include the method of example 1-3 or another example herein, further comprising determining whether respective individual groups of the plurality of groups include one or more unsatisfied parity checks.

Example 5 may include the method of example 4 or another example herein, wherein the determination is performed based on variable-node (VN) matching.

Example 6 may include the method of example 1-5 or another example herein, wherein the method is performed by a UE or a portion thereof.

Example 7 may include the method of example 1-5 or another example herein, wherein the method is performed by an eNB or gNB or a portion thereof.

Example 8 may include a method comprising:
transmitting or causing to transmit a message; and
receiving a feedback message with a plurality of bits, wherein individual bits indicate whether respective individual groups of rows from a parity check matrix (PCM) associated with the message include one or more unsatisfied parity checks.

Example 9 may include the method of example 8 or another example herein, further comprising transmitting or causing to transmit a retransmission of bits from the message that are associated with the individual groups that were indicated to include one or more unsatisfied parity checks.

Example 10 may include the method of example 9 or another example herein, wherein the retransmission includes information sub-blocks (SBs) alternating with parity SBs.

Example 11 may include the method of example 8-10 or another example herein, further comprising determining whether respective individual groups of the plurality of groups include one or more unsatisfied parity checks.

Example 12 may include the method of example 11 or another example herein, wherein the determination is performed based on variable-node (VN) matching.

Example 13 may include the method of example 8-12 or another example herein, wherein the method is performed by a eNB or gNB or a portion thereof.

Example 14 may include the method of example 8-12 or another example herein, wherein the method is performed by a UE or a portion thereof.

Example 15 may include an apparatus comprising means to perform one or more elements of a method described in or related to any of examples 1-14, or any other method or process described herein.

Example 16 may include one or more non-transitory computer-readable media comprising instructions to cause an electronic device, upon execution of the instructions by one or more processors of the electronic device, to perform one or more elements of a method described in or related to any of examples 1-14, or any other method or process described herein.

Example 17 may include an apparatus comprising logic, modules, or circuitry to perform one or more elements of a method described in or related to any of examples 1-14, or any other method or process described herein.

Example 18 may include a method, technique, or process as described in or related to any of examples 1-14, or portions or parts thereof.

Example 19 may include an apparatus comprising: one or more processors and one or more computer-readable media comprising instructions that, when executed by the one or more processors, cause the one or more processors to perform the method, techniques, or process as described in or related to any of examples 1-14, or portions thereof.

Example 20 may include a signal as described in or related to any of examples 1-14, or portions or parts thereof.

Example 21 may include a datagram, packet, frame, segment, protocol data unit (PDU), or message as described in or related to any of examples 1-14, or portions or parts thereof, or otherwise described in the present disclosure.

Example 22 may include a signal encoded with data as described in or related to any of examples 1-14, or portions or parts thereof, or otherwise described in the present disclosure.

Example 23 may include a signal encoded with a datagram, packet, frame, segment, protocol data unit (PDU), or message as described in or related to any of examples 1-14, or portions or parts thereof, or otherwise described in the present disclosure.

Example 24 may include an electromagnetic signal carrying computer-readable instructions, wherein execution of the computer-readable instructions by one or more processors is to cause the one or more processors to perform the method, techniques, or process as described in or related to any of examples 1-14, or portions thereof.

Example 25 may include a computer program comprising instructions, wherein execution of the program by a processing element is to cause the processing element to carry out the method, techniques, or process as described in or related to any of examples 1-14, or portions thereof.

Example 26 may include a signal in a wireless network as shown and described herein.

Example 27 may include a method of communicating in a wireless network as shown and described herein.

Example 28 may include a system for providing wireless communication as shown and described herein.

Example 29 may include a device for providing wireless communication as shown and described herein.

Any of the above-described examples may be combined with any other example (or combination of examples), unless explicitly stated otherwise. The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Abbreviations

For the purposes of the present document, the following abbreviations may apply to the examples and embodiments discussed herein, but are not meant to be limiting.

3GPP Third Generation Partnership Project
4G Fourth Generation
5G Fifth Generation
5GC 5G Core network
ACK Acknowledgement
AF Application Function
AM Acknowledged Mode
AMBR Aggregate Maximum Bit Rate
AMF Access and Mobility Management Function
AN Access Network
ANR Automatic Neighbour Relation
AP Application Protocol, Antenna Port, Access Point
API Application Programming Interface
APN Access Point Name
ARP Allocation and Retention Priority
ARQ Automatic Repeat Request
AS Access Stratum
ASN.1 Abstract Syntax Notation One
AUSF Authentication Server Function
AWGN Additive White Gaussian Noise
BCH Broadcast Channel
BER Bit Error Ratio
BFD Beam Failure Detection
BLER Block Error Rate
BPSK Binary Phase Shift Keying
BRAS Broadband Remote Access Server
BSS Business Support System
BS Base Station
BSR Buffer Status Report
BW Bandwidth
BWP Bandwidth Part
C-RNTI Cell Radio Network Temporary Identity
CA Carrier Aggregation, Certification Authority
CAPEX CAPital EXpenditure
CBRA Contention Based Random Access
CC Component Carrier, Country Code, Cryptographic Checksum
CCA Clear Channel Assessment
CCE Control Channel Element
CCCH Common Control Channel
CE Coverage Enhancement
CDM Content Delivery Network
CDMA Code-Division Multiple Access
CFRA Contention Free Random Access
CG Cell Group
CI Cell Identity
CID Cell-ID (e.g., positioning method)
CIM Common Information Model
CIR Carrier to Interference Ratio
CK Cipher Key CM Connection Management, Conditional Mandatory
CMAS Commercial Mobile Alert Service
CMD Command
CMS Cloud Management System
CO Conditional Optional
CoMP Coordinated Multi-Point
CORESET Control Resource Set
COTS Commercial Off-The-Shelf
CP Control Plane, Cyclic Prefix, Connection Point
CPD Connection Point Descriptor
CPE Customer Premise Equipment
CPICH Common Pilot Channel
CQI Channel Quality Indicator
CPU CSI processing unit, Central Processing Unit
C/R Command/Response field bit
CRAN Cloud Radio Access Network, Cloud RAN
CRB Common Resource Block
CRC Cyclic Redundancy Check
CRI Channel-State Information Resource Indicator, CSI-RS Resource Indicator
C-RNTI Cell RNTI
CS Circuit Switched
CSAR Cloud Service Archive
CSI Channel-State Information
CSI-IM CSI Interference Measurement
CSI-RS CSI Reference Signal
CSI-RSRP CSI reference signal received power
CSI-RSRQ CSI reference signal received quality
CSI-SINR CSI signal-to-noise and interference ratio
CSMA Carrier Sense Multiple Access
CSMA/CA CSMA with collision avoidance
CSS Common Search Space, Cell-specific Search Space
CTS Clear-to-Send
CW Codeword
CWS Contention Window Size
D2D Device-to-Device
DC Dual Connectivity, Direct Current
DCI Downlink Control Information
DF Deployment Flavour
DL Downlink
DMTF Distributed Management Task Force
DPDK Data Plane Development Kit
DM-RS, DMRS Demodulation Reference Signal
DN Data network
DRB Data Radio Bearer
DRS Discovery Reference Signal
DRX Discontinuous Reception
DSL Domain Specific Language. Digital Subscriber Line
DSLAM DSL Access Multiplexer
DwPTS Downlink Pilot Time Slot
E-LAN Ethernet Local Area Network
E2E End-to-End
ECCA extended clear channel assessment, extended CCA
ECCE Enhanced Control Channel Element, Enhanced CCE
ED Energy Detection
EDGE Enhanced Datarates for GSM Evolution (GSM Evolution)
EGMF Exposure Governance Management Function
EGPRS Enhanced GPRS
EIR Equipment Identity Register
eLAA enhanced Licensed Assisted Access, enhanced LAA
EM Element Manager
eMBB Enhanced Mobile Broadband
EMS Element Management System
eNB evolved NodeB, E-UTRAN Node B
EN-DC E-UTRA-NR Dual Connectivity
EPC Evolved Packet Core
EPDCCH enhanced PDCCH, enhanced Physical Downlink Control Cannel
EPRE Energy per resource element
EPS Evolved Packet System
EREG enhanced REG, enhanced resource element groups
ETSI European Telecommunications Standards Institute
ETWS Earthquake and Tsunami Warning System
eUICC embedded UICC, embedded Universal Integrated Circuit Card
E-UTRA Evolved UTRA
E-UTRAN Evolved UTRAN
EV2X Enhanced V2X
F1AP F1 Application Protocol
F1-C F1 Control plane interface
F1-U F1 User plane interface
FACCH Fast Associated Control CHannel
FACCH/F Fast Associated Control Channel/Full rate
FACCH/H Fast Associated Control Channel/Half rate
FACH Forward Access Channel
FAUSCH Fast Uplink Signalling Channel
FB Functional Block
FBI Feedback Information
FCC Federal Communications Commission
FCCH Frequency Correction CHannel
FDD Frequency Division Duplex
FDM Frequency Division Multiplex
FDMA Frequency Division Multiple Access
FE Front End
FEC Forward Error Correction
FFS For Further Study
FFT Fast Fourier Transformation
feLAA further enhanced Licensed Assisted Access, further enhanced LAA
FN Frame Number
FPGA Field-Programmable Gate Array
FR Frequency Range
G-RNTI GERAN Radio Network Temporary Identity
GERAN GSM EDGE RAN, GSM EDGE Radio Access Network
GGSN Gateway GPRS Support Node
GLONASS GLObal'naya NAvigatsionnaya Sputnikovaya Sistema (Engl.: Global Navigation Satellite System)
gNB Next Generation NodeB
gNB-CU gNB-centralized unit, Next Generation NodeB centralized unit
gNB-DU gNB-distributed unit, Next Generation NodeB distributed unit
GNSS Global Navigation Satellite System
GPRS General Packet Radio Service
GSM Global System for Mobile Communications, Groupe Special Mobile
GTP GPRS Tunneling Protocol
GTP-U GPRS Tunnelling Protocol for User Plane
GTS Go To Sleep Signal (related to WUS)
GUMMEI Globally Unique MME Identifier
GUTI Globally Unique Temporary UE Identity
HARQ Hybrid ARQ, Hybrid Automatic Repeat Request
HANDO, HO Handover
HFN HyperFrame Number
HHO Hard Handover
HLR Home Location Register
HN Home Network
HO Handover
HPLMN Home Public Land Mobile Network HSDPA High Speed Downlink Packet Access
HSN Hopping Sequence Number
HSPA High Speed Packet Access
HSS Home Subscriber Server
HSUPA High Speed Uplink Packet Access
HTTP Hyper Text Transfer Protocol
HTTPS Hyper Text Transfer Protocol Secure (https is http/1.1 over SSL, i.e. port 443)
I-Block Information Block
ICCID Integrated Circuit Card Identification
ICIC Inter-Cell Interference Coordination
ID Identity, identifier
IDFT Inverse Discrete Fourier Transform
IE Information element
IBE In-Band Emission
IEEE Institute of Electrical and Electronics Engineers
IEI Information Element Identifier
IEIDL Information Element Identifier Data Length
IETF Internet Engineering Task Force
IF Infrastructure
IM Interference Measurement, Intermodulation, IP Multimedia
IMC IMS Credentials
IMEI International Mobile Equipment Identity
IMGI International mobile group identity
IMPI IP Multimedia Private Identity
IMPU IP Multimedia PUblic identity
IMS IP Multimedia Subsystem
IMSI International Mobile Subscriber Identity
IoT Internet of Things
IP Internet Protocol
Ipsec IP Security, Internet Protocol Security
IP-CAN IP-Connectivity Access Network
IP-M IP Multicast
IPv4 Internet Protocol Version 4
IPv6 Internet Protocol Version 6
IR Infrared
IS In Sync
IRP Integration Reference Point
ISDN Integrated Services Digital Network
ISIM IM Services Identity Module
ISO International Organisation for Standardisation
ISP Internet Service Provider
IWF Interworking-Function
I-WLAN Interworking WLAN
K Constraint length of the convolutional code, USIM Individual key
kB Kilobyte (1000 bytes)
kbps kilo-bits per second
Kc Ciphering key
Ki Individual subscriber authentication key
KPI Key Performance Indicator
KQI Key Quality Indicator
KSI Key Set Identifier
ksps kilo-symbols per second
KVM Kernel Virtual Machine
L1 Layer 1 (physical layer)
L1-RSRP Layer 1 reference signal received power
L2 Layer 2 (data link layer)
L3 Layer 3 (network layer)
LAA Licensed Assisted Access
LAN Local Area Network
LBT Listen Before Talk
LCM LifeCycle Management
LCR Low Chip Rate
LCS Location Services
LCID Logical Channel ID
LI Layer Indicator
LLC Logical Link Control, Low Layer Compatibility
LPLMN Local PLMN
LPP LTE Positioning Protocol
LSB Least Significant Bit
LTE Long Term Evolution
LWA LTE-WLAN aggregation
LWIP LTE/WLAN Radio Level Integration with IPsec Tunnel
LTE Long Term Evolution
M2M Machine-to-Machine
MAC Medium Access Control (protocol layering context)
MAC Message authentication code (security/encryption context)
MAC-A MAC used for authentication and key agreement (TSG T WG3 context)
MAC-I MAC used for data integrity of signalling messages (TSG T WG3 context)
MANO Management and Orchestration
MBMS Multimedia Broadcast and Multicast Service
MB SFN Multimedia Broadcast multicast service Single Frequency Network
MCC Mobile Country Code
MCG Master Cell Group
MCOT Maximum Channel Occupancy Time
MCS Modulation and coding scheme
MDAF Management Data Analytics Function
MDAS Management Data Analytics Service
MDT Minimization of Drive Tests
ME Mobile Equipment
MeNB master eNB
MER Message Error Ratio
MGL Measurement Gap Length
MGRP Measurement Gap Repetition Period
MIB Master Information Block, Management Information Base
MIMO Multiple Input Multiple Output
MLC Mobile Location Centre
MM Mobility Management
MME Mobility Management Entity
MN Master Node
MO Measurement Object, Mobile Originated
MPBCH MTC Physical Broadcast CHannel
MPDCCH MTC Physical Downlink Control CHannel
MPDSCH MTC Physical Downlink Shared CHannel
MPRACH MTC Physical Random Access CHannel
MPUSCH MTC Physical Uplink Shared Channel
MPLS MultiProtocol Label Switching
MS Mobile Station
MSB Most Significant Bit
MSC Mobile Switching Centre
MSI Minimum System Information, MCH Scheduling Information
MSID Mobile Station Identifier
MSIN Mobile Station Identification Number
MSISDN Mobile Subscriber ISDN Number
MT Mobile Terminated, Mobile Termination
MTC Machine-Type Communications
mMTC massive MTC, massive Machine-Type Communications
MU-MIMO Multi User MIMO
MWUS MTC wake-up signal, MTC WUS
NACK Negative Acknowledgement
NAI Network Access Identifier
NAS Non-Access Stratum, Non-Access Stratum layer
NCT Network Connectivity Topology
NEC Network Capability Exposure NE-DC NR-E-UTRA Dual Connectivity
NEF Network Exposure Function
NF Network Function
NFP Network Forwarding Path
NFPD Network Forwarding Path Descriptor
NFV Network Functions Virtualization
NFVI NFV Infrastructure
NFVO NFV Orchestrator
NG Next Generation, Next Gen
NGEN-DC NG-RAN E-UTRA-NR Dual Connectivity
NM Network Manager
NMS Network Management System
N-PoP Network Point of Presence
NMIB, N-MIB Narrowband MIB
NPBCH Narrowband Physical Broadcast CHannel
NPDCCH Narrowband Physical Downlink Control CHannel
NPDSCH Narrowband Physical Downlink Shared CHannel
NPRACH Narrowband Physical Random Access CHannel
NPUSCH Narrowband Physical Uplink Shared CHannel
NPSS Narrowband Primary Synchronization Signal
NSSS Narrowband Secondary Synchronization Signal
NR New Radio, Neighbour Relation
NRF NF Repository Function
NRS Narrowband Reference Signal
NS Network Service
NSA Non-Standalone operation mode
NSD Network Service Descriptor
NSR Network Service Record
NSSAI Network Slice Selection Assistance Information
S-NNSAI Single-NSSAI
NSSF Network Slice Selection Function
NW Network
NWUS Narrowband wake-up signal, Narrowband WUS
NZP Non-Zero Power
O&M Operation and Maintenance
ODU2 Optical channel Data Unit-type 2
OFDM Orthogonal Frequency Division Multiplexing
OFDMA Orthogonal Frequency Division Multiple Access
OOB Out-of-band
OOS Out of Sync
OPEX OPerating EXpense
OSI Other System Information
OSS Operations Support System
OTA over-the-air
PAPR Peak-to-Average Power Ratio
PAR Peak to Average Ratio
PBCH Physical Broadcast Channel
PC Power Control, Personal Computer
PCC Primary Component Carrier, Primary CC
PCell Primary Cell
PCI Physical Cell ID, Physical Cell Identity
PCEF Policy and Charging Enforcement Function
PCF Policy Control Function
PCRF Policy Control and Charging Rules Function
PDCP Packet Data Convergence Protocol, Packet Data Convergence Protocol layer
PDCCH Physical Downlink Control Channel
PDCP Packet Data Convergence Protocol
PDN Packet Data Network, Public Data Network
PDSCH Physical Downlink Shared Channel
PDU Protocol Data Unit
PEI Permanent Equipment Identifiers
PFD Packet Flow Description
P-GW PDN Gateway
PHICH Physical hybrid-ARQ indicator channel
PHY Physical layer
PLMN Public Land Mobile Network
PIN Personal Identification Number
PM Performance Measurement
PMI Precoding Matrix Indicator
PNF Physical Network Function
PNFD Physical Network Function Descriptor
PNFR Physical Network Function Record
POC PTT over Cellular
PP, PTP Point-to-Point
PPP Point-to-Point Protocol
PRACH Physical RACH
PRB Physical resource block
PRG Physical resource block group
ProSe Proximity Services, Proximity-Based Service
PRS Positioning Reference Signal
PRR Packet Reception Radio
PS Packet Services
PSBCH Physical Sidelink Broadcast Channel
PSDCH Physical Sidelink Downlink Channel
PSCCH Physical Sidelink Control Channel
PSSCH Physical Sidelink Shared Channel
PSCell Primary SCell
PSS Primary Synchronization Signal
PSTN Public Switched Telephone Network
PT-RS Phase-tracking reference signal
PTT Push-to-Talk
PUCCH Physical Uplink Control Channel
PUSCH Physical Uplink Shared Channel
QAM Quadrature Amplitude Modulation
QCI QoS class of identifier
QCL Quasi co-location
QFI QoS Flow ID, QoS Flow Identifier
QoS Quality of Service
QPSK Quadrature (Quaternary) Phase Shift Keying
QZSS Quasi-Zenith Satellite System
RA-RNTI Random Access RNTI
RAB Radio Access Bearer, Random Access Burst
RACH Random Access Channel
RADIUS Remote Authentication Dial In User Service
RAN Radio Access Network
RAND RANDom number (used for authentication)
RAR Random Access Response
RAT Radio Access Technology
RAU Routing Area Update
RB Resource block, Radio Bearer
RBG Resource block group
REG Resource Element Group
Rel Release
REQ REQuest
RF Radio Frequency
RI Rank Indicator
MV Resource indicator value
RL Radio Link
RLC Radio Link Control, Radio Link Control layer
RLC AM RLC Acknowledged Mode
RLC UM RLC Unacknowledged Mode
RLF Radio Link Failure
RLM Radio Link Monitoring
RLM-RS Reference Signal for RLM
RM Registration Management
RMC Reference Measurement Channel
RMSI Remaining MSI, Remaining Minimum System Information
RN Relay Node
RNC Radio Network Controller RNL Radio Network Layer
RNTI Radio Network Temporary Identifier
ROHC RObust Header Compression
RRC Radio Resource Control, Radio Resource Control layer
RRM Radio Resource Management
RS Reference Signal
RSRP Reference Signal Received Power
RSRQ Reference Signal Received Quality
RSSI Received Signal Strength Indicator
RSU Road Side Unit
RSTD Reference Signal Time difference
RTP Real Time Protocol
RTS Ready-To-Send
RTT Round Trip Time
Rx Reception, Receiving, Receiver
S1AP S1Application Protocol
S1-MME S1 for the control plane
S1-US1 for the user plane
S-GW Serving Gateway
S-RNTI SRNC Radio Network Temporary Identity
S-TMSI SAE Temporary Mobile Station Identifier
SA Standalone operation mode
SAE System Architecture Evolution
SAP Service Access Point
SAPD Service Access Point Descriptor
SAPI Service Access Point Identifier
SCC Secondary Component Carrier, Secondary CC
SCell Secondary Cell
SC-FDMA Single Carrier Frequency Division Multiple Access
SCG Secondary Cell Group
SCM Security Context Management
SCS Subcarrier Spacing
SCTP Stream Control Transmission Protocol
SDAP Service Data Adaptation Protocol, Service Data Adaptation Protocol layer
SDL Supplementary Downlink
SDNF Structured Data Storage Network Function
SDP Session Description Protocol
SDSF Structured Data Storage Function
SDU Service Data Unit
SEAF Security Anchor Function
SeNB secondary eNB
SEPP Security Edge Protection Pro12
SFI Slot format indication
SFTD Space-Frequency Time Diversity, SFN and frame timing difference
SFN System Frame Number
SgNB Secondary gNB
SGSN Serving GPRS Support Node
S-GW Serving Gateway
SI System Information
SI-RNTI System Information RNTI
SIB System Information Block
SIM Subscriber Identity Module
SIP Session Initiated Protocol
SiP System in Package
SL Sidelink
SLA Service Level Agreement
SM Session Management
SMF Session Management Function
SMS Short Message Service
SMSF SMS Function
SMTC SSB-based Measurement Timing Configuration
SN Secondary Node, Sequence Number
SoC System on Chip
SON Self-Organizing Network
SpCell Special Cell
SP-CSI-RNTI Semi-Persistent CSI RNTI
SPS Semi-Persistent Scheduling
SQN Sequence number
SR Scheduling Request
SRB Signalling Radio Bearer
SRS Sounding Reference Signal
SS Synchronization Signal
SSB Synchronization Signal Block, SS/PBCH Block
SSBRI SS/PBCH Block Resource Indicator, Synchronization Signal Block Resource Indicator
SSC Session and Service Continuity
SS-RSRP Synchronization Signal based Reference Signal Received Power
SS-RSRQ Synchronization Signal based Reference Signal Received Quality
SS-SINR Synchronization Signal based Signal to Noise and Interference Ratio
SSS Secondary Synchronization Signal
SSSG Search Space Set Group
SSSIF Search Space Set Indicator
SST Slice/Service Types
SU-MIMO Single User MIMO
SUL Supplementary Uplink
TA Timing Advance, Tracking Area
TAC Tracking Area Code
TAG Timing Advance Group
TAU Tracking Area Update
TB Transport Block
TBS Transport Block Size
TBD To Be Defined
TCI Transmission Configuration Indicator
TCP Transmission Communication Protocol
TDD Time Division Duplex
TDM Time Division Multiplexing
TDMA Time Division Multiple Access
TE Terminal Equipment
TEID Tunnel End Point Identifier
TFT Traffic Flow Template
TMSI Temporary Mobile Subscriber Identity
TNL Transport Network Layer
TPC Transmit Power Control
TPMI Transmitted Precoding Matrix Indicator
TR Technical Report
TRP, TRxP Transmission Reception Point
TRS Tracking Reference Signal
TRx Transceiver
TS Technical Specifications, Technical Standard
TTI Transmission Time Interval
Tx Transmission, Transmitting, Transmitter
U-RNTI UTRAN Radio Network Temporary Identity
UART Universal Asynchronous Receiver and Transmitter
UCI Uplink Control Information
UE User Equipment
UDM Unified Data Management
UDP User Datagram Protocol
UDSF Unstructured Data Storage Network Function
UICC Universal Integrated Circuit Card
UL Uplink
UM Unacknowledged Mode
UML Unified Modelling Language
UMTS Universal Mobile Telecommunications System
UP User Plane
UPF User Plane Function
URI Uniform Resource Identifier
URL Uniform Resource Locator URLLC Ultra-Reliable and Low Latency
USB Universal Serial Bus
USIM Universal Subscriber Identity Module
USS UE-specific search space
UTRA UMTS Terrestrial Radio Access
UTRAN Universal Terrestrial Radio Access Network
UwPTS Uplink Pilot Time Slot
V2I Vehicle-to-Infrastruction
V2P Vehicle-to-Pedestrian
V2V Vehicle-to-Vehicle
V2X Vehicle-to-everything
VIM Virtualized Infrastructure Manager
VL Virtual Link,
VLAN Virtual LAN, Virtual Local Area Network
VM Virtual Machine
VNF Virtualized Network Function
VNFFG VNF Forwarding Graph
VNFFGD VNF Forwarding Graph Descriptor
VNFM VNF Manager
VoIP Voice-over-IP, Voice-over-Internet Protocol
VPLMN Visited Public Land Mobile Network
VPN Virtual Private Network
VRB Virtual Resource Block
WiMAX Worldwide Interoperability for Microwave Access
WLAN Wireless Local Area Network
WMAN Wireless Metropolitan Area Network
WPAN Wireless Personal Area Network
X2-C X2-Control plane
X2-U X2-User plane
XML eXtensible Markup Language
XRES EXpected user RESponse
XOR eXclusive OR
ZC Zadoff-Chu
ZP Zero Power Terminology For the purposes of the present document, the following terms and definitions are applicable to the examples and embodiments discussed herein, but are not meant to be limiting.

The term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" as used herein refers to, is part of, or includes circuitry capable of sequentially and automatically carrying out a sequence of arithmetic or logical operations, or recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes. The terms "application circuitry" and/or "baseband circuitry" may be considered synonymous to, and may be referred to as, "processor circuitry."

The term "interface circuitry" as used herein refers to, is part of, or includes circuitry that enables the exchange of information between two or more components or devices. The term "interface circuitry" may refer to one or more hardware interfaces, for example, buses, I/O interfaces, peripheral component interfaces, network interface cards, and/or the like.

The term "user equipment" or "UE" as used herein refers to a device with radio communication capabilities and may describe a remote user of network resources in a communications network. The term "user equipment" or "UE" may be considered synonymous to, and may be referred to as, client, mobile, mobile device, mobile terminal, user terminal, mobile unit, mobile station, mobile user, subscriber, user, remote station, access agent, user agent, receiver, radio equipment, reconfigurable radio equipment, reconfigurable mobile device, etc. Furthermore, the term "user equipment" or "UE" may include any type of wireless/wired device or any computing device including a wireless communications interface.

The term "network element" as used herein refers to physical or virtualized equipment and/or infrastructure used to provide wired or wireless communication network services. The term "network element" may be considered synonymous to and/or referred to as a networked computer, networking hardware, network equipment, network node, router, switch, hub, bridge, radio network controller, RAN device, RAN node, gateway, server, virtualized VNF, NFVI, and/or the like.

The term "computer system" as used herein refers to any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources.

The term "appliance," "computer appliance," or the like, as used herein refers to a computer device or computer system with program code (e.g., software or firmware) that is specifically designed to provide a specific computing resource. A "virtual appliance" is a virtual machine image to be implemented by a hypervisor-equipped device that virtualizes or emulates a computer appliance or otherwise is dedicated to provide a specific computing resource.

The term "resource" as used herein refers to a physical or virtual device, a physical or virtual component within a computing environment, and/or a physical or virtual component within a particular device, such as computer devices, mechanical devices, memory space, processor/CPU time, processor/CPU usage, processor and accelerator loads, hardware time or usage, electrical power, input/output operations, ports or network sockets, channel/link allocation, throughput, memory usage, storage, network, database and applications, workload units, and/or the like. A "hardware resource" may refer to compute, storage, and/or network resources provided by physical hardware element(s). A "virtualized resource" may refer to compute, storage, and/or network resources provided by virtualization infrastructure to an application, device, system, etc. The term "network resource" or "communication resource" may refer to resources that are accessible by computer devices/systems via a communications network. The term "system resources" may refer to any kind of shared entities to provide services, and may include computing and/or network resources. System resources may be considered as a set of coherent functions, network data objects or services, accessible through a server where such system resources reside on a single host or multiple hosts and are clearly identifiable.

The term "channel" as used herein refers to any transmission medium, either tangible or intangible, which is used to communicate data or a data stream. The term "channel" may be synonymous with and/or equivalent to "communications channel," "data communications channel," "transmission channel," "data transmission channel," "access channel," "data access channel," "link," "data link," "carrier," "radiofrequency carrier," and/or any other like term denoting a pathway or medium through which data is communicated. Additionally, the term "link" as used herein refers to a connection between two devices through a RAT for the purpose of transmitting and receiving information.

The terms "instantiate," "instantiation," and the like as used herein refers to the creation of an instance. An "instance" also refers to a concrete occurrence of an object, which may occur, for example, during execution of program code.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or ink, and/or the like.

The term "information element" refers to a structural element containing one or more fields. The term "field" refers to individual contents of an information element, or a data element that contains content.

The term "SMTC" refers to an SSB-based measurement timing configuration configured by SSB-MeasurementTimingConfiguration.

The term "SSB" refers to an SS/PBCH block.

The term "a "Primary Cell" refers to the MCG cell, operating on the primary frequency, in which the UE either performs the initial connection establishment procedure or initiates the connection re-establishment procedure.

The term "Primary SCG Cell" refers to the SCG cell in which the UE performs random access when performing the Reconfiguration with Sync procedure for DC operation.

The term "Secondary Cell" refers to a cell providing additional radio resources on top of a Special Cell for a UE configured with CA.

The term "Secondary Cell Group" refers to the subset of serving cells comprising the PSCell and zero or more secondary cells for a UE configured with DC.

The term "Serving Cell" refers to the primary cell for a UE in RRC_CONNECTED not configured with CA/DC there is only one serving cell comprising of the primary cell.

The term "serving cell" or "serving cells" refers to the set of cells comprising the Special Cell(s) and all secondary cells for a UE in RRC_CONNECTED configured with CA/.

The term "Special Cell" refers to the PCell of the MCG or the PSCell of the SCG for DC operation; otherwise, the term "Special Cell" refers to the Pcell.

What is claimed is:

1. A method of operating a user equipment (UE) in a wireless network, comprising:
    obtaining a parity check matrix (PCM) associated with a received message;
    assigning rows of the PCM to respective groups of a plurality of groups, the respective groups having corresponding one or more parity checks as determined by the PCM, wherein the assigning comprises assigning two or more rows of the PCM to a respective group of the plurality of groups, the respective group having corresponding one or more parity checks as determined by the two or more rows of the PCM;
    generating a feedback message including a plurality of bits corresponding to the plurality of groups, wherein an individual bit of the plurality of bits indicates whether a corresponding respective group of the plurality of groups includes one or more unsatisfied parity checks; and
    transmitting or causing to transmit the feedback message to a base station of the wireless network.

2. The method of claim 1, wherein the generating the feedback message includes setting the individual bit to a logic "1" or a logic "0" to indicate the corresponding respective group includes the one or more unsatisfied parity checks.

3. The method of claim 1, wherein the assigning includes determining a number of the plurality of groups based on a predetermined number of bits allowed for the feedback message.

4. The method of claim 1, further comprising receiving a retransmission of bits associated with respective groups of the plurality of groups that include the one or more unsatisfied parity checks.

5. The method of claim 4, wherein the retransmission includes information sub-blocks intermixed with parity sub-blocks that are responsive to the one or more unsatisfied parity checks.

6. The method of claim 1, further comprising determining whether the corresponding respective group of the plurality of groups includes the one or more unsatisfied parity checks based on variable node matching within the PCM.

7. A non-transitory computer readable medium having instructions stored thereon that, when executed by one or more processors of a user equipment (UE), cause the UE to perform operations, the operations comprising:
    obtaining a parity check matrix (PCM) associated with a received message;
    assigning rows of the PCM to respective groups of a plurality of groups, the respective groups having corresponding one or more parity checks as determined by the PCM, wherein the assigning comprises assigning two or more rows of the PCM to a respective group of the plurality of groups, the respective group having corresponding one or more parity checks as determined by the two or more rows of the PCM;

determining whether the respective groups of the plurality of groups include one or more unsatisfied parity checks based on variable node matching within the PCM;

generating a feedback message including a plurality of bits corresponding to the plurality of groups, wherein individual bits of the plurality of bits indicate whether the respective groups of the plurality of groups include one or more unsatisfied parity checks; and transmitting or causing to transmit the feedback message to a base station of a wireless network.

8. The non-transitory computer readable medium of claim 7, wherein the generating the feedback message includes setting an individual bit to a logic "1" or a logic "0" to indicate a corresponding respective group includes the one or more unsatisfied parity checks.

9. The non-transitory computer readable medium of claim 7, wherein the assigning includes determining a number of the plurality of groups based on a predetermined number of bits allowed for the feedback message.

10. The non-transitory computer readable medium of claim 7, wherein the operations further comprise receiving a retransmission of bits associated with respective groups of the plurality of groups that include the one or more unsatisfied parity checks.

11. The non-transitory computer readable medium of claim 10, wherein the retransmission includes information sub-blocks intermixed with parity sub-blocks that are responsive to the one or more unsatisfied parity checks.

12. A user equipment (UE), comprising:
radio front end circuitry configured to receive a message over a wireless network; and
processor circuitry, coupled to the radio front end circuitry, configured to:
obtain a parity check matrix (PCM) associated with the received message;
assign rows of the PCM to respective groups of a plurality of groups, the respective groups having corresponding one or more parity checks as determined by the PCM, wherein to assign, the processor circuitry is configured to assign two or more rows of the PCM to a respective group of the plurality of groups, the respective group having corresponding one or more parity checks as determined by the two or more rows of the PCM;
generate a feedback message including a plurality of bits corresponding to the plurality of groups, wherein an individual bit of the plurality of bits indicates whether a corresponding respective group of the plurality of groups includes one or more unsatisfied parity checks; and
transmit, using the radio front end circuitry, the feedback message to a base station of the wireless network.

13. The UE of claim 12, wherein the processor circuitry is further configured to generate the feedback message by setting the individual bit to a logic "1" or a logic "0" to indicate the corresponding respective group includes the one or more unsatisfied parity checks.

14. The UE of claim 12, wherein the processor circuitry is further configured to determine a number of the plurality of groups based on a predetermined number of bits allowed for the feedback message.

15. The UE of claim 12, wherein the processor circuitry is further configured to receive, using the radio front end circuitry, a retransmission of bits associated with respective groups of the plurality of groups that include the one or more unsatisfied parity checks.

16. The UE of claim 15, wherein the retransmission includes information sub-blocks intermixed with parity sub-blocks that are responsive to the one or more unsatisfied parity checks.

17. The UE of claim 12, wherein the processor circuitry is further configured to determine whether the corresponding respective group of the plurality of groups include the one or more unsatisfied parity checks based on variable node (VM) matching within the PCM.

18. A method of operating a base station, comprising:
transmitting or causing to transmit a message to a user equipment (UE) served by the base station;
receiving a feedback message with a plurality of bits from the UE, wherein individual bits of the feedback message indicate whether respective individual groups of rows from a parity check matrix (PCM) associated with the transmitted message include one or more unsatisfied parity checks, wherein the individual groups of rows form a plurality of groups corresponding to the plurality of bits, wherein two or more rows of the PCM are assigned to a respective group, the respective group having corresponding one or more parity checks as determined by the two or more rows of the PCM; and
transmitting or causing to transmit to the UE, a retransmission of bits from the message that are associated with the individual groups of rows that were indicated to include the one or more unsatisfied parity checks.

19. The method of claim 18, wherein the feedback message includes an individual bit set to a logic "1" or a logic "0" to indicate a corresponding respective individual group includes the one or more unsatisfied parity checks.

20. The method of claim 18, wherein the retransmission includes information sub-blocks intermixed with parity sub-blocks that are responsive to the one or more unsatisfied parity checks.

* * * * *